United States Patent
Hirayama et al.

(10) Patent No.: US 12,219,872 B2
(45) Date of Patent: Feb. 4, 2025

(54) ORGANIC ELECTROLUMINESCENT ELEMENT

(71) Applicants: Hodogaya Chemical Co., Ltd., Tokyo (JP); SFC CO., LTD., Cheongju-si (KR)

(72) Inventors: Yuta Hirayama, Tokyo (JP); Takeshi Yamamoto, Tokyo (JP); Shunji Mochizuki, Tokyo (JP); Shuichi Hayashi, Tokyo (JP); Se-Jin Lee, Cheongju-si (KR); Oun-Gyu Lee, Cheongju-si (KR); Bong-Ki Shin, Cheongju-si (KR)

(73) Assignees: Hodogaya Chemical Co., Ltd., Tokyo (JP); SFC CO., LTD., Cheongju-si (KR)

( * ) Notice: Subject to any disclaimer, the term of this patent is extended or adjusted under 35 U.S.C. 154(b) by 833 days.

(21) Appl. No.: 17/417,267

(22) PCT Filed: Dec. 18, 2019

(86) PCT No.: PCT/JP2019/049533
§ 371 (c)(1),
(2) Date: Jun. 22, 2021

(87) PCT Pub. No.: WO2020/137724
PCT Pub. Date: Jul. 2, 2020

(65) Prior Publication Data
US 2022/0077403 A1    Mar. 10, 2022

(30) Foreign Application Priority Data

Dec. 25, 2018 (JP) .................. 2018-241387

(51) Int. Cl.
*H10K 50/11* (2023.01)
*H01L 51/00* (2006.01)
(Continued)

(52) U.S. Cl.
CPC ....... *H10K 85/6572* (2023.02); *H10K 85/626* (2023.02); *H10K 85/633* (2023.02);
(Continued)

(58) Field of Classification Search
None
See application file for complete search history.

(56) References Cited

U.S. PATENT DOCUMENTS

| | | | |
|---|---|---|---|
| 2012/0330025 | A1 | 12/2012 | Osaka et al. |
| 2014/0225100 | A1 | 8/2014 | Yokoyama et al. |
| 2016/0133844 | A1 | 5/2016 | Kim et al. |

FOREIGN PATENT DOCUMENTS

| | | | |
|---|---|---|---|
| EP | 3 185 324 A1 | 6/2017 |
| EP | 3 432 688 A1 | 1/2019 |

(Continued)

OTHER PUBLICATIONS

Extended European Search Report for European Application No. 19904212.8, dated Jul. 25, 2022.
(Continued)

*Primary Examiner* — Tae H Yoon
(74) *Attorney, Agent, or Firm* — Birch, Stewart, Kolasch & Birch, LLP

(57) ABSTRACT

The present invention provides various organic electroluminescent elements using a material for a capping layer and a material for a luminous layer, in which the material for a capping layer uses an arylamine material that exhibit excellent stability and durability in the form of a thin film, especially a specific amine compound having a high refractive index and having a high absorbance within a wavelength range from 400 nm to 410 nm in the absorption spectrum at a concentration of $10^{-5}$ mol/L; and in which the
(Continued)

material for a luminous layer uses a compound containing a heterocyclic compound that has a specific fused ring structure.

19 Claims, 1 Drawing Sheet

(51) Int. Cl.
    *H10K 59/00* (2023.01)
    *H10K 85/60* (2023.01)
    *H10K 101/10* (2023.01)
(52) U.S. Cl.
    CPC ....... *H10K 85/636* (2023.02); *H10K 85/6574* (2023.02); *H10K 85/6576* (2023.02); *H10K 50/11* (2023.02); *H10K 2101/10* (2023.02)

(56) References Cited

FOREIGN PATENT DOCUMENTS

| | | |
|---|---|---|
| JP | 8-48656 A | 2/1996 |
| JP | 3194657 B2 | 7/2001 |
| JP | 2004-529937 A | 9/2004 |
| JP | 2008-531469 A | 8/2008 |
| JP | 2013-28597 A | 2/2013 |
| WO | WO02/088274 A1 | 11/2002 |
| WO | WO2007/011170 A1 | 1/2007 |
| WO | WO2013/038627 A1 | 3/2013 |
| WO | WO2014/009310 A1 | 1/2014 |
| WO | WO2017/183625 A1 | 10/2017 |

OTHER PUBLICATIONS

Endo et al., "Efficient up-conversion of triplet excitons into a singlet state and its application for organic light emitting diodes", Applied Physics Letters, 98, 083302 (2011), pp. 1-3.
Hosokawa et al., "Development of Styryl-Based Light Emitting Material", 2001, JSAP 9th Workshop Proceedings, 2001, pp. 55-61.
Hung et al., "Application of an ultrathin LiF/Al bilayer in organic surface-emitting diodes", Applied Physics Letters, vol. 78, No. 4, Jan. 22, 2001, pp. 544-546.
International Search Report for PCT/JP2019/049533 (PCT/ISA/210) mailed on Mar. 17, 2020.
Riel et al., "Phosphorescent top-emitting organic light-emitting devices with improved light outcoupling", Applied Physics Letters, vol. 82, No. 3, Jan. 20, 2003, pp. 466-468.
Takeo Wakimoto, "Optimization of driving lifetime durability in organic LED devices using phosphorescent guest emitter", JSAP 9th Workshop Proceedings, 2001, pp. 23-31.

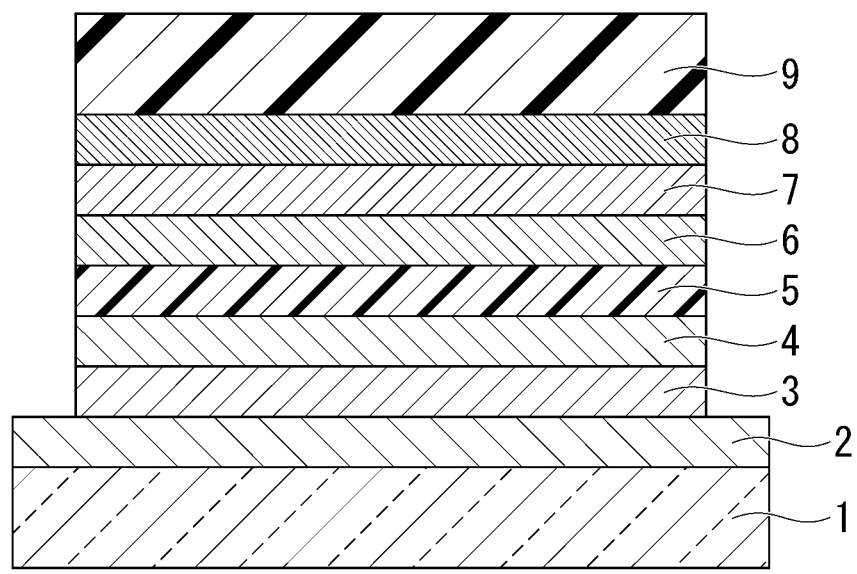

ORGANIC ELECTROLUMINESCENT ELEMENT

TECHNICAL FIELD

To provide an organic electroluminescent element (hereinafter, the organic electroluminescent element may be abbreviated as an organic EL element).

This application is the National Phase of PCT International Application No. PCT/JP2019/049533, filed on Dec. 18, 2019, which claims priority under 35 U.S.C. 119 (a) to Patent Application No. 2018-241387, filed in Japan on Dec. 25, 2018, the contents of which are incorporated herein.

BACKGROUND TECHNOLOGY

An organic EL element is a self-luminous element. In addition, the organic EL element has brighter, superior visibility and ability to display clearer images in comparison with a liquid crystal element. For this reason, the organic EL element has been actively studied.

In 1987, C. W. Tang and colleagues at Eastman Kodak developed a laminated structure element using materials assigned different roles. This realized practical applications of an organic EL element with organic materials. These researchers laminated an electron-transporting phosphor and a hole-transporting organic material, and injected both charges into a phosphor layer to cause emission. As a result, a high luminance of 1,000 $cd/m^2$ or more at a voltage of 10 V or less (refer to Patent Documents 1 and 2, for example) was obtained.

Recently, various improvements have been made for practical applications of the organic EL element. Various roles of the laminated structure are further subdivided to provide an electroluminescent element that includes an anode, a hole injection layer, a hole transport layer, a luminous layer, an electron transport layer, an electron injection layer, and a cathode successively formed on a substrate, wherein high efficiency and durability are achieved by a light emitting element of bottom emission structure that emits light from the bottom (refer to Non-Patent Document 1, for example).

In recent years, a light emitting element of top emission structure that emits light from the top using metal with a high work function as an anode has been used. The light emitting element of bottom emission structure is restricted in terms of light emitting area by a pixel circuit. On the other hand, the light emitting element of top emission structure has an advantage of having a wide light emitting area. In the light emitting element of top emission structure, a semitransparent electrode of LiF/Al/Ag (refer to Non-Patent Document 2, for example), Ca/Mg (refer to Non-Patent Document 3, for example), LiF/MgAg, or the like is used as a cathode.

In such a light emitting element, when light emitted in a luminous layer enters another film at a given angle or greater, the light is totally reflected at an interface between the luminous layer and the other film. Consequently, only a part of the emitted light was utilized. In recent years, a light emitting element provided with a "capping layer" with a high refractive index, on the outside of a semitransparent electrode with a low refractive index has been proposed to improve light extraction efficiency (refer to Non-Patent Documents 2 and 3, for example).

Regarding effect of the capping layer in the light emitting element of the top emission structure, an efficiency improvement of about 1.7 times is recognized in the light emitting element using $(Ir(ppy)_3)$ as a luminous material. In the case where there was no capping layer, the current efficiency was 38 cd/A, whereas in the case of the light emitting element using ZnSe having a film thickness of 60 nm as the capping layer, the current efficiency was 64 cd/A. It is also indicated that the highest point of transmittance of the semitransparent electrode and the capping layer does not necessarily coincide with the highest point of efficiency. It is indicated that the maximum point of light extraction efficiency is determined by an interference effect (refer to Non-Patent Document 3, for example).

Conventionally, it has been proposed to use a metal mask having high definition for forming a capping layer. However, when the metal mask is used under a high temperature condition, there is a problem in that alignment accuracy decreases because the metal mask is distorted by heat. Therefore, ZnSe cannot be deposited at an accurate position by using a metal mask with high definition, which may affect the light emitting element itself, because ZnSe has a high melting point of 1100° C. or higher (for example, see Non-Patent Document 3). Furthermore, deposition by sputtering also affects the light emitting element. For this reason, a capping layer made of an inorganic material is not suitable for use.

In addition, tris(8-hydroxyquinoline)aluminum (hereinafter referred to as "$Alq_3$") may be used as a capping layer for adjusting the refractive index (for example, see Non-Patent Document 2). $Alq_3$ is known as an organic EL material commonly used as a green luminous material or an electron transport material. However, $Alq_3$ has a weak absorption near 450 nm, which is used in blue luminous materials. For this reason, there has been a problem of causing a decrease in color purity and a decrease in light extraction efficiency in the case of the blue light emitting element.

Further, in a conventional element provided with a capping layer, there is a problem in that light having a wavelength of 400 nm to 410 nm of sunlight passes through the element, thereby affecting the material inside the element, and thus decreasing the color purity and the light extraction efficiency.

For the purpose of further improving the emission efficiency, the use of triplet excitons has been attempted, and the use of phosphorescent compounds has been studied (see, for example, Non-Patent Document 4).

An element utilizing light emission by thermally activated delayed fluorescence (TADF) has also been developed. In 2011, Adachi et al. of Kyushu University achieved an external quantum efficiency of 5.3% with an element using a thermally activated delayed fluorescent material (see, for example, Non-Patent Document 5).

The luminous layer can be made by doping a charge transporting compound, commonly referred to as a host material, with a fluorescent compound, a phosphorescent compound, or a material that emits delayed fluorescence. The selection of an organic material in an organic EL element has a large influence on various characteristics such as efficiency and durability of the element (see, for example, Non-Patent Document 4).

The heat resistance and the amorphous nature of the material are also important for the lifetime of the element. In the case of a material having low heat resistance, thermal decomposition occurs even at a low temperature due to heat generated when the element is driven, and as a result, the material deteriorates. In the case of a material having a low amorphous property, crystallization of a thin film occurs even for a short time, and as a result, the element is deteriorated. Therefore, the material used for the organic EL element is required to have high heat resistance and good amorphous properties.

In order to improve the element characteristics of organic EL elements and the yield of element fabrication, it is necessary to combine materials having excellent hole and electron injection and transport performance, thin film stability, and durability. In addition, there is a need for an organic EL element that can recombine holes and electrons with high efficiency, has high emission efficiency, has a low driving voltage, and has a long lifetime.

In order to improve the element characteristics of an organic EL element, it is particularly required to absorb light having a wavelength of 400 nm to 410 nm of sunlight so as not to affect the material inside the element. Further, in order to significantly improve the light extraction efficiency, a material having a high absorption coefficient, a high refractive index, and excellent stability and durability of a thin film is required as a material for the capping layer.

Patent Document

[Patent Document 1] Publication of Unexamined Patent Application No. H08-048656
[Patent Document 2] Japanese Patent No. 3194657
[Patent Document 3] WO 2014/009310
[Patent Document 4] WO 2013/038627

Non-Patent Documents

[Non-Patent Document 1] Proceedings of the 9th Session of the Japan Society of Applied Physics, pages 55 to 61 (2001)
[Non-Patent Document 2] Appl. Phys. Lett., 78, 544 (2001)
[Non-Patent Document 3] Appl. Phys. Lett., 82, 466 (2003)
[Non-Patent Document 4] Proceedings of the 9th Session of the Japan Society of Applied Physics, pages 23 to 31 (2001)
[Non-Patent Document 5] Appl. Phys. Lett., 98, 083302 (2011)

SUMMARY OF THE INVENTION

Problems to be Solved by the Invention

It is an object of the present disclosure to provide a long-life organic EL element having high luminance, excellent light emission efficiency and power efficiency, and a method producing the same.

Means for Solving Problems

In order to achieve the above object, the present inventors have conducted intensive research as follows.

That is, it is noted that a thin film containing an arylamine-based material has excellent stability and durability. A specific arylamine compound capable of forming a thin film having a high refractive index and a high absorbance at a wavelength of 400 nm to 410 nm in an absorption spectrum having a concentration of $10^{-5}$ mol/l was selected as a material of the capping layer. Further, the present inventors have paid attention to the excellent emission efficiency of an organic EL element having a luminous layer containing a heterocyclic compound having a fused ring structure. A specific heterocyclic compound having a fused ring structure is selected as a material of the luminous layer. Further, various organic EL elements were fabricated by combining the materials of the capping layer and the materials of the luminous layer, and the characteristics of the elements were intensively evaluated. As a result, a capping layer containing an arylamine represented by a general formula (1), as shown below, and a luminous layer containing a heterocyclic compound represented by general formulae (2) and/or (3), as shown below, are combined to remarkably improve the characteristics, and the present invention is completed.

That is, according to the present disclosure, the following organic EL elements are provided.

[1] An organic electroluminescent element comprising at least an anode, a hole transport layer, a luminous layer, an electron transport layer, a cathode, and a capping layer in this order,
wherein the capping layer comprises an arylamine compound represented by a following general formula (1); and
the luminous layer comprises either or both of a heterocyclic compound having a fused ring structure represented by a following general formula (2) and a heterocyclic compound having a fused ring structure represented by a following general formula (3),

[Chemical Formula 1]

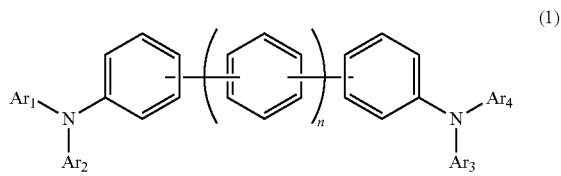

wherein, in the formula (1),
$Ar_1$, $Ar_2$, $Ar_3$, and $Ar_4$ may be the same or different from each other and represent any one selected from a substituted or unsubstituted aromatic hydrocarbon group, a substituted or unsubstituted aromatic heterocyclic group, or a substituted or unsubstituted fused polycyclic aromatic group; and
n represents an integer of 0 to 4,
wherein at least one of $Ar_1$, $Ar_2$, $Ar_3$, and $Ar_4$ are a monovalent group represented by a structural formula (B) or a structural formula (B'), or has the monovalent group as a substituent,

[Chemical Formula 2]

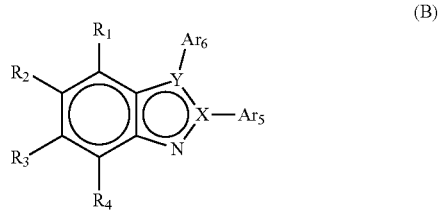

wherein, in the formula (B),
$R_1$ to $R_4$ may be the same or different from each other and represent a linking group as a binding site, a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkoxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group;

$Ar_5$ and $Ar_6$ may be the same or different from each other and represent a linking group as a binding site, a substituted or unsubstituted aromatic hydrocarbon group, a substituted or unsubstituted aromatic heterocyclic group, or a substituted or unsubstituted fused polycyclic aromatic group;

X represents a carbon atom or a nitrogen atom; and Y represents any one selected from a carbon atom, a nitrogen atom, an oxygen atom, and a sulfur atom, however, when Y is an oxygen atom or a sulfur atom, Y has no $Ar_6$; when X and Y are nitrogen atoms, X or Y has no $Ar_5$ or $Ar_6$; the case when X and Y are both carbon atoms; and the case when X is a nitrogen atom and Y is an oxygen atom, and the case when X is a nitrogen atom and Y is a sulfur atom are excluded; and with the same substituted benzene ring, $R_1$ to $R_4$ may be bonded to each other, via a single bond, a substituted or unsubstituted methylene group, a substituted or unsubstituted amino group, an oxygen atom, or a sulfur atom to form a ring,

[Chemical Formula 3]

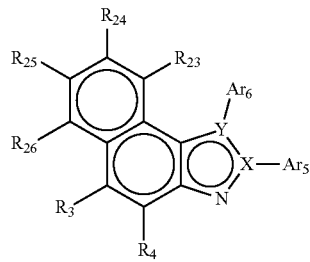

(B')

wherein, in the formula (B'), $R_3$, $R_4$, and $R_{23}$ to $R_{26}$ may be the same or different from each other and represent a linking group, a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group;

$Ar_5$ and $Ar_6$ may be the same or different from each other and represent a linking group as a binding site, a substituted or unsubstituted aromatic hydrocarbon group, a substituted or unsubstituted aromatic heterocyclic group, or a substituted or unsubstituted fused polycyclic aromatic group;

X represents a carbon atom or a nitrogen atom; and Y represents any one selected from a carbon atom, a nitrogen atom, an oxygen atom, and a sulfur atom, and however, when Y is an oxygen atom or a sulfur atom, Y has no $Ar_6$; and when X and Y are nitrogen atoms, X or Y has no $Ar_5$ or $Ar_6$; the case when X and Y are carbon atoms; and the case when X is a nitrogen atom and Y is an oxygen atom, and the case when X is a nitrogen atom and Y is a sulfur atom are excluded; and with the same substituted benzene ring, $R_3$, $R_4$ and $R_{23}$ to $R_{26}$ may be bonded to each other, via a single bond, a substituted or unsubstituted methylene group, a substituted or unsubstituted amino group, an oxygen atom, or a sulfur atom to form a ring,

[Chemical Formula 4]

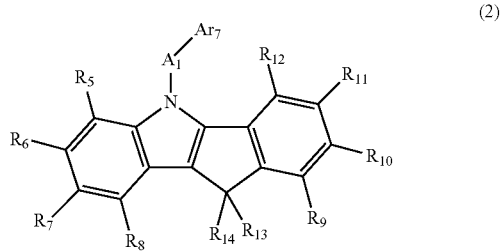

(2)

wherein, in the formula (2), $A_1$ represents a divalent group of a substituted or unsubstituted aromatic hydrocarbon, a divalent group of a substituted or unsubstituted aromatic heterocyclic ring, a divalent group of a substituted or unsubstituted fused polycyclic aromatic ring, or a single bond;

$Ar_7$ represents a substituted or unsubstituted aromatic hydrocarbon group, a substituted or unsubstituted aromatic heterocyclic group, or a substituted or unsubstituted fused polycyclic aromatic group;

$R_5$ to $R_8$ may be the same or different from each other and represent a hydrogen atom, a deuterium atom, a fluorine atom, a chlorine atom, a cyano group, a nitro group, a linear or branched alkyl group having 1 to 6 carbon atoms which may have a substituent, or a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted by a group selected from an aromatic hydrocarbon group, an aromatic heterocyclic group, and a fused polycyclic aromatic group, wherein $R_5$ to $R_8$ may be bonded to each other via a single bond, a substituted or unsubstituted methylene group, an oxygen atom, or a sulfur atom to form a ring; and $R_5$ to $R_8$ may be bonded to the substituted benzene ring to form a ring, via a substituted or unsubstituted methylene group, an oxygen atom, a sulfur atom, or a linking group;

$R_9$ to $R_{12}$ may be the same or different from each other and represent a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent, a linear or branched alkenyl group having 2 to 6 carbon atoms which may have a substituent group, a linear or branched alkoxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted by a group selected from an aromatic hydrocarbon group, an aromatic heterocyclic group, or a fused polycyclic aromatic group, wherein $R_9$ to $R_{12}$ may be bonded to each other via a single bond, a substituted or unsubstituted methylene group, an oxygen atom, or a sulfur atom to form a ring; and $R_9$ to $R_{12}$ may be bonded to the substituted benzene ring to form a ring, via a substituted or unsubstituted methylene group, an oxygen atom, a sulfur atom, or a linking group; and $R_{13}$ and $R_{14}$ may be the same or different from each other, and are a linear or branched alkyl group having 1 to 6 carbon atoms which may have a substituent, a substituted or unsubstituted aromatic hydrocarbon group, a substituted or unsubstituted aromatic heterocyclic group, or a substituted or unsubstituted fused polycyclic aromatic group, wherein $R_{13}$ and $R_{14}$ may be bonded to each other via a single bond, a substituted or unsubstituted methylene group, an oxygen atom, or a sulfur atom to form a ring,

[Chemical Formula 5]

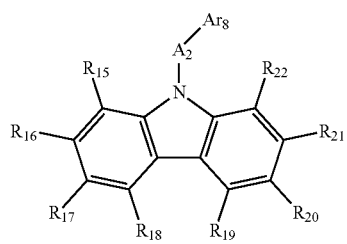

(3)

wherein, in the formula (3), $A_2$ represents a bivalent group of a substituted or unsubstituted aromatic hydrocarbon, a bivalent group of a substituted or unsubstituted aromatic heterocyclic ring, a bivalent group of a substituted or unsubstituted fused polycyclic aromatic ring, or a single bond;

$Ar_8$ represents a substituted or unsubstituted aromatic hydrocarbon group, a substituted or unsubstituted aromatic heterocyclic group, or a substituted or unsubstituted fused polycyclic aromatic group;

$R_{15}$ to $R_{18}$ may be the same or different from each other and represent a hydrogen atom, a deuterium atom, a fluorine atom, a chlorine atom, a cyano group, a nitro group, a linear or branched alkyl group having 1 to 6 carbon atoms, or a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted by a group selected from an aromatic hydrocarbon group, an aromatic heterocyclic group, and a fused polycyclic aromatic group, wherein $R_{15}$ to $R_{18}$ may be bonded to each other via a single bond, a substituted or unsubstituted methylene group, an oxygen atom, or a sulfur atom to form a ring; and $R_{15}$ to $R_{18}$ may be bonded to the substituted benzene ring to form a ring, via a substituted or unsubstituted methylene group, an oxygen atom, a sulfur atom, or a linking group; and $R_{19}$ to $R_{22}$ may be the same or different from each other and represent a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent, a linear or branched alkenyl group having 2 to 6 carbon atoms which may have a substituent group, a linear or branched alkoxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted by a group selected from an aromatic hydrocarbon group, an aromatic heterocyclic group, or a fused polycyclic aromatic group, wherein $R_{19}$ to $R_{22}$ may be bonded to each other via a single bond, a substituted or unsubstituted methylene group, an oxygen atom, or a sulfur atom to form a ring; and $R_{19}$ to $R_{22}$ may be bonded to the substituted benzene ring to form a ring, via a substituted or unsubstituted methylene group, an oxygen atom, a sulfur atom, or a linking group.

[2] The organic electroluminescent element according to [1], wherein the structural formula (B) is a monovalent group represented by the structural formula (B-1) as following,

[Chemical Formula 6]

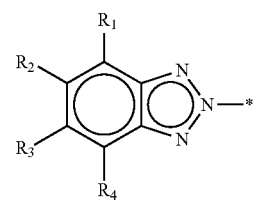

(B-1)

wherein, in the formula (B-1),
* represents a nitrogen atom or a binding site with any one selected from $Ar_1$, $Ar_2$, $Ar_3$ and $Ar_4$ in the formula (1);
$R_1$, $R_2$, $R_3$, and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted heterocyclic aromatic group, a substituted or unsubstituted fused polycyclic aromatic group, or a substituted or unsubstituted aryloxy group,
wherein, with the same substituted benzene ring, $R_1$, $R_2$, $R_3$, and $R_4$ may be bonded to each other, via a single bond, a substituted or unsubstituted methylene group, a substituted or unsubstituted amino group, an oxygen atom, or a sulfur atom to form a ring.

[3] The organic electroluminescent element according to [1], wherein the structural formula (B) is a monovalent group represented by the structural formula (B-2) as following,

[Chemical Formula 7]

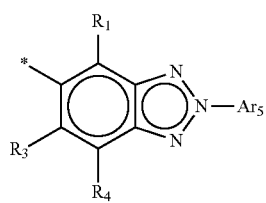

(B-2)

wherein, in the formula (B-2),
* represents a nitrogen atom or a binding site with any one selected from $Ar_1$, $Ar_2$, $Ar_3$ and $Ar_4$ in the formula (1);
$R_1$, $R_3$ and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group;
$Ar_5$ represents a substituted or unsubstituted aromatic hydrocarbon group, a substituted or unsubstituted aromatic heterocyclic group, or a substituted or unsubstituted fused polycyclic aromatic group; and
with the same substituted benzene ring, $R_3$ and $R_4$ may be bonded to each other, via a single bond, a substituted or unsubstituted methylene group, a substituted or unsubstituted amino group, an oxygen atom, or a sulfur atom to form a ring.

[4] The organic electroluminescent element according to [1], wherein the structural formula (B) is a monovalent group represented by the structural formula (B-3) as following,

[Chemical Formula 8]

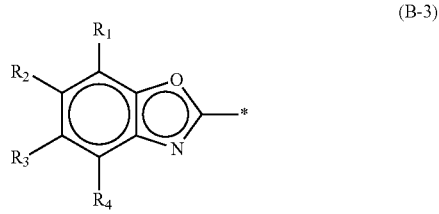

(B-3)

wherein, in the formula (B-3),
* represents a nitrogen atom or a binding site with any one selected from $Ar_1$, $Ar_2$, $Ar_3$ and $Ar_4$ in the formula (1);
$R_1$, $R_2$, $R_3$, and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted heterocyclic aromatic group, a substituted or unsubstituted fused polycyclic aromatic group, or a substituted or unsubstituted aryloxy group,
wherein, with the same substituted benzene ring, $R_1$, $R_2$, $R_3$, and $R_4$ may be bonded to each other, via a single bond, a substituted or unsubstituted methylene group, a substituted or unsubstituted amino group, an oxygen atom, or a sulfur atom to form a ring.

[5] The organic electroluminescent element according to [1], wherein the structural formula (B) is a monovalent group represented by the structural formula (B-4) as following,

[Chemical Formula 9]

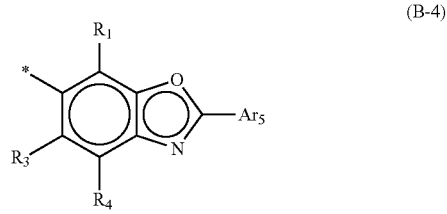

(B-4)

wherein, in the formula (B-4),
* represents a nitrogen atom or a binding site with any one selected from $Ar_1$, $Ar_2$, $Ar_3$ and $Ar_4$ in the formula (1);
$R_1$, $R_3$, and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted aromatic heterocyclic group, or a substituted or unsubstituted aryloxy group;
$Ar_5$ represents a substituted or unsubstituted aromatic hydrocarbon group, a substituted or unsubstituted aromatic heterocyclic group, or a substituted or unsubstituted fused polycyclic aromatic group,
wherein, with the same substituted benzene ring, $R_3$ and $R_4$ may be bonded to each other, via a single bond, a substituted or unsubstituted methylene group, a substituted or unsubstituted amino group, an oxygen atom, or a sulfur atom to form a ring.

[6] The organic electroluminescent element according to [1], wherein the structural formula (B) is a monovalent group represented by a structural formula (B-5) as following,

[Chemical Formula 10]

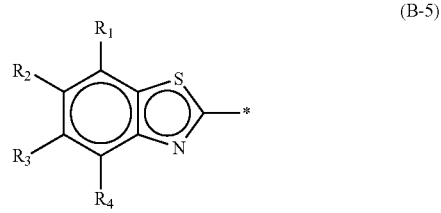

(B-5)

wherein, in the formula (B-5),
* represents a nitrogen atom or a binding site with any one selected from $Ar_1$, $Ar_2$, $Ar_3$ and $Ar_4$ in the formula (1);
$R_1$, $R_2$, $R_3$, and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted heterocyclic aromatic group, a substituted or unsubstituted fused polycyclic aromatic group, or a substituted or unsubstituted aryloxy group,
wherein, with the same substituted benzene ring, $R_1$, $R_2$, $R_3$, and $R_4$ may be bonded to each other, via a single bond, a substituted or unsubstituted methylene group, a substituted or unsubstituted amino group, an oxygen atom, or a sulfur atom to form a ring.

[7] The organic electroluminescent element according to [1], wherein in the general formula (1), at least one of $Ar_1$, $Ar_2$, $Ar_3$, and $Ar_4$ are a monovalent group represented by the structural formula (B) or have the monovalent group represented by the structural formula (B) as a substituent.

[8] The organic electroluminescent element according to [7], wherein n is 0 in the general formula (1).

[9] The organic electroluminescent element according to [7], wherein n is 1 in the general formula (1).

[10] The organic electroluminescent element according to [7], wherein n is 2 in the general formula (1).

[11] The organic electroluminescent element according to any one of [1] to [10], wherein in the general formula (1), any two of $Ar_1$, $Ar_2$, $Ar_3$ and $Ar_4$ are a monovalent group represented by the structural formula (B) or have the monovalent group as a substituent.

[12] An organic electroluminescent element according to any one of [1] to [10] wherein in the general formula (1), $Ar_1$ and $Ar_4$ are a monovalent group represented by the structural formula (B) or have the monovalent group as a substituent.

[13] The organic electroluminescent element according to any one of [1] to [12], wherein the capping layer has a thickness in a range of 30 nm to 120 nm.

[14] The organic electroluminescent element according to any one of [1] to [13], wherein a refractive index of the capping layer is 1.85 or greater within a wavelength range of 450 nm to 750 nm of light transmitted through the capping layer.

[15] The organic electroluminescent element according to any one of [1] to [14], wherein the luminous layer comprises a red luminescent material.

[16] The organic electroluminescent element according to any one of [1] to [14], wherein the luminous layer comprises a phosphorescent luminescent material.

[17] The organic electroluminescent element according to [16], wherein the phosphorescent luminescent material is a metal complex comprising iridium or platinum.

Effect of the Invention

The organic EL element of the present disclosure has high luminance, excellent light emission efficiency, high power efficiency, and a long lifetime.

BRIEF DESCRIPTION OF DRAWINGS

FIG. 1 is a schematic sectional view showing an example of an organic EL element according to the present embodiment.

EMBODIMENT OF THE INVENTION

An object of the present embodiment is to provide an organic EL element having high luminance, high emission efficiency, high power efficiency, and a long lifetime. Another object of the present embodiment is to provide an organic EL element having a low light emission start voltage and a low practical driving voltage.

In the organic EL element of the present embodiment, various materials for the organic EL element which are excellent in injection and transport performance of holes and electrons, stability in a thin film state, durability, etc., are used in order to achieve the above objects. In particular, a material having the following characteristics is used as a capping layer in order to absorb light having a wavelength of 400 nm to 410 nm of sunlight, not to affect the material inside the element, and to greatly improve the light extraction efficiency. That is, a material having a high absorption coefficient and having no absorption in each wavelength region of blue, green, and red, and having a high refractive index and excellent stability, durability and light resistance is used. Further, a capping layer composed of a material having such characteristics, is combined with other layers including the luminous layer of the organic EL element, so that the characteristic of each material of each layer including the luminous layer of the organic EL element can be effectively achieved.

Physical characteristics of the material of the capping layer suitable for the present disclosure include (1) a high absorption coefficient, (2) a high refractive index, (3) vapor deposition capability, (4) stable thin film state, and (5) a high glass transition temperature.

Physical characteristics of the element suitable for the present disclosure include (1) absorption of light of 400 nm to 410 nm, (2) high light extraction efficiency, (3) no degradation in color purity, (4) transmission of light without change with time, (5) high light emission efficiency and power efficiency, (6) low light emission start voltage, (7) low practical drive voltage, and in particular, and (8) long lifetime.

Organic EL Elements

As a structure of the organic EL element of the present disclosure, for example, in the case of a light-emitting element having a top emission structure, a multilayer structure in which an anode, a hole transport layer, a luminous layer, an electron transport layer, a cathode, and a capping layer are sequentially provided on a glass substrate can be used. In addition, a multilayer structure further having a hole injection layer between the anode and the hole transport layer, and a multilayer structure further having an electron blocking layer between the hole transport layer and the luminous layer, a multilayer structure further having a hole blocking layer between the luminous layer and the electron transport layer, and a multilayer structure further having an electron injection layer between the electron transport layer and the cathode can be used.

FIG. 1 is a schematic cross-sectional view showing an example of the organic EL element of the present embodiment. The organic EL element shown in FIG. 1 has a top emission structure in which an anode 2, a hole injection layer 3, a hole transport layer 4, a luminous layer 5, an electron transport layer 6, an electron injection layer 7, a cathode 8, and a capping layer 9 are laminated in this order on a glass substrate 1. In the organic EL element shown in FIG. 1, the organic layer includes a hole transport layer 4, a luminous layer 5, and an electron transport layer 6.

In these multilayer structures, it is possible to omit or combine several organic layers. For example, the hole injection layer and the hole transport layer may be combined, the hole transport layer and the electron blocking layer may be combined, the hole blocking layer and the electron transport layer may be combined, or the electron transport layer and the electron injection layer may be combined. It is also possible to have a structure in which two or more organic layers having the same function are laminated. For example, a configuration in which two hole transport layers are stacked, a configuration in which two luminous layers are stacked, a configuration in which two electron transport layers are stacked, a configuration in which two capping layers are stacked, and the like can be used.

Total film thickness of all layers of the organic EL element is preferably about 200 nm to 750 nm, and more preferably about 350 nm to 600 nm.

The capping layer 9 in the organic EL element shown in FIG. 1 contains an arylamine compound represented by the general formula (1), and the luminous layer 5 contains either or both of a heterocyclic compound having a fused ring structure represented by the general formula (2) and a heterocyclic compound having a fused ring structure represented by the general formula (3).

In the organic EL element shown in FIG. 1, the materials used for the other layers of the capping layer 9 and the luminous layer 5 are not particularly limited. Hereinafter, the materials of the layers of the organic EL element according to the present embodiment will be specifically described by way of example, but the materials of the layers are not limited thereto.

"Capping Layer"

In the organic EL element of the present disclosure, a thickness of the capping layer is preferably in a range of 30 nm to 120 nm, and more preferably in the range of 40 nm to 80 nm. When the thickness of the capping layer is 30 nm or more, an effect of having the capping layer becomes significant and is therefore preferable. When the thickness of the capping layer is 120 nm or less, it is preferable because the thickness of the capping layer can be prevented from hindering the thinning of the organic EL element. When the film thickness of the capping layer is 30 nm to 120 nm, good light extraction efficiency is obtained.

The film thickness of the capping layer can be appropriately changed according to the type of the luminous material used for the luminous layer, the thickness of each layer of the organic EL element other than the capping layer, and the like.

In the organic EL element of the present disclosure, a refractive index of the capping layer is preferably 1.85 or higher and more preferably 1.90 or higher, when the wavelength of light transmitted through the capping layer is within the range of 450 nm to 750 nm.

The refractive index of the capping layer serves as an index for improving the light extraction efficiency of the organic EL element.

The refractive index of the capping layer is preferably larger than that of the adjacent electrodes. That is, although the light extraction efficiency in the organic EL element is improved by the capping layer, the effect is greater when the reflectance at the interface between the capping layer and the material in contact with the capping layer is large because the effect of light interference is large. Therefore, the refractive index of the capping layer is preferably larger than that of the adjacent electrodes, and the refractive index when light having wavelengths of 400 nm and 410 nm is transmitted is preferably 1.70 or more, more preferably 1.80 or more, and even more preferably 1.85 or more.

The capping layer provided in the organic EL element of the present disclosure may be formed of only one thin film or may be formed by laminating two or more thin films of different materials.

The capping layer may be formed of only one kind of material or may contain two or more kinds of materials mixed together.

The capping layer of the organic EL element of this embodiment contains an arylamine compound represented by the general formula (1).

The arylamine compound can be formed into a film by a vapor deposition method, and the thin film can be formed by a known method such as a spin coating method or an ink jet method in addition to a vapor deposition method.

As the capping layer, a single layer formed by depositing these arylamine compounds alone may be used, or a single layer formed by mixing these arylamine compounds with other materials may be used. The capping layer may be formed by laminating layers formed of the arylamine compound alone, by laminating layers formed by mixing the arylamine compound with other materials, or by laminating the layers formed of the arylamine compound alone with the layer formed by mixing the compound with other materials.
Compound Represented by General Formula (1)

The capping layer provided in the organic EL element of this embodiment contains an arylamine compound represented by the general formula (1).

An arylamine compound represented by the general formula (1) is a compound having two arylamine skeletons including an arylamine skeleton in which —$NAr_1Ar_2$ is bonded to an aromatic ring and an arylamine skeleton in which —$NAr_3Ar_4$ is bonded to an aromatic ring. In addition, in the arylamine compound represented by the general formula (1), at least one of $Ar_1$, $Ar_2$, $Ar_3$, and $Ar_4$ are a monovalent group represented by the structural formula (B) or the structural formula (B'), or has the monovalent group as a substituent. Therefore, the arylamine compound represented by the general formula (1) has a high absorbance of light having a wavelength of 400 nm to 410 nm, and can form a thin film having a high refractive index and extinction coefficient when light having wavelengths of 400 nm and 410 nm is transmitted. Therefore, the organic EL element of the present embodiment having the capping layer containing the arylamine compound represented by the general formula (1) has high luminance, good emission efficiency and power efficiency, and a long lifetime.

In the general formula (1), n represents an integer of 0 to 4; n is preferably 0, 1, or 2, more preferably 0 or 1, and most preferably 1 because a thin film having a higher absorbance of light from 400 nm to 410 nm wavelength and a higher refractive index and extinction coefficient when light is transmitted at 400 nm and 410 nm wavelength can be formed.

In the general formula (1), at least one of $Ar_1$, $Ar_2$, $Ar_3$, and $Ar_4$ is represented by the structural formula (B) or the structural formula (B'). Alternatively, at least one of $Ar_1$, $Ar_2$, $Ar_3$, and $Ar_4$ is represented by the structural formula (B) or has the structural formula (B') as its substituent.

In the general formula (1), at least one of $Ar_1$, $Ar_2$, $Ar_3$, and $Ar_4$ may be represented by the structural formula (B) or the structural formula (B'), and at least one of $Ar_1$, $Ar_2$, $Ar_3$, and $Ar_4$ may be represented by the structural formula (B) or has the structural formula (B') as a substituent.

In this case, it is preferable that any one of $Ar_1$, $Ar_2$, $Ar_3$, and $Ar_4$ is represented by the structural formula (B) or the structural formula (B'), and any one of other $Ar_1$, $Ar_2$, $Ar_3$, and $Ar_4$, which are not represented by the structural formula (B) or the structural formula (B'), has the structural formula (B) or the structural formula (B') as a substituent.

Alternatively, any two of $Ar_1$, $Ar_2$, $Ar_3$, and $Ar_4$ may be represented by the structural formula (B) or the structural formula (B'), or any two of $Ar_1$, $Ar_2$, $Ar_3$, and $Ar_4$ may have the structural formula (B) or the structural formula (B') as a substituent.

Alternatively, at least $Ar_1$ and $Ar_4$ may be represented by the structural formula (B), or at least $Ar_1$ and $Ar_4$ may have the structural formula (B) as a substituent. In this case, among $Ar_1$, $Ar_2$, $Ar_3$, and $Ar_4$, only $Ar_1$ and $Ar_4$ are preferably a monovalent group represented by structural formula (B) or structural formula (B') or have the monovalent group as a substituent, and it is more preferable that only $Ar_1$ and $Ar_4$ have the structural formula (B) as a substituent, because these compounds have good stability.

As the general formula (1), it is more preferable that $Ar_1$ and $Ar_4$ have the structural formulae (B-1), (B-3) or (B-5) as substituents or that $Ar_1$ and $Ar_4$ are represented by the structural formulae (B-2) or (B-4); and it is even more preferable that only $Ar_1$ and $Ar_4$ among $Ar_1$, $Ar_2$, $Ar_3$ and $Ar_4$ have the structural formulae (B-1), (B-3) or (B-5) as substituents.

Alternatively, $Ar_1$ may be represented by the structural formula (B), and $Ar_4$ may have the structural formula (B) as a substituent.

Specifically, examples of "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_1$ to $Ar_4$ in the formula (1), include phenyl group, biphenylyl group, terphenylyl group, naphthyl group, anthryl group, phenanthryl group, fluorenyl group, indenyl group, pyrenyl group, perylenyl group, fluoranthenyl group, triphenylenyl group, pyridyl group, furyl group, pyrrolyl group, pyrrolyl group, thienyl group, quinolyl group, isoquinolyl group, benzofuranyl group, benzothienyl group, indolyl group, carbazolyl group, triazolyl group, benzoxazolyl, benzothiazolyl, quinoxalyl, benzimidazolyl, pyrazolyl, dibenzofuranyl, dibenzothienyl, spirofluorenyl, and carbolinyl. $Ar_1$ and $Ar_2$, or $Ar_3$ and $Ar_4$ may be bonded to each other, with the same substituted benzene ring, via a single bond, a substituted or unsubstituted methylene group, a substituted or unsubstituted amino group, an oxygen atom, or a sulfur atom to form a ring.

Examples of the "substituent" in "substituted aromatic hydrocarbon group", "substituted aromatic heterocyclic group", or "substituted fused polycyclic aromatic group" represented by $Ar_1$ to $Ar_4$ in the general formula (1) include a deuterium atom; a trifluoromethyl group; a cyano group; a nitro group;

a halogen atom such as a fluorine, chlorine, bromine, and iodine atom;

a silyl group such as a trimethylsilyl group and triphenylsilyl group;

a linear or branched alkyl group having 1 to 6 carbon atoms, such as a methyl, ethyl, n-propyl, isopropyl, n-butyl, isobutyl, tert-butyl, n-pentyl, isopentyl, neopentyl, and n-hexyl;

a linear or branched alkyloxy group having 1 to 6 carbon atoms, such as a methyloxy, ethyloxy, and propyloxy group;

an alkenyl group such as a vinyl and an allyl group;

an aralkyl group such as a benzyl group, a naphthylmethyl group, or a phenethyl group;

an aryloxy group such as a phenyloxy, and a tolyloxy group;

an arylalkyloxy group such as a benzyloxy group, and a phenethyloxy group;

an aromatic hydrocarbon group or fused polycyclic aromatic group such as a phenyl, biphenylyl, terphenylyl, naphthyl, anthracenyl, phenanthryl, fluorenyl, indenyl, pyrenyl, perylenyl, fluoranthenyl, triphenylenyl, and spirofluorenyl;

an aromatic heterocyclic group such as a pyridyl, furyl, thienyl, pyrrolyl, quinolyl, isoquinolyl, benzofuranyl, benzothienyl, indolyl, carbazolyl, benzotriazolyl, benzoxazolyl, benzothiazolyl, quinoxalyl, benzimidazolyl, pyrazolyl, dibenzofuranyl, dibenzothienyl, and carbolinyl;

an arylvinyl group such as a styryl group and naphthylvinyl group;

an acyl group such as an acetyl and benzoyl group;

a dialkylamino group such as a dimethylamino and diethylamino group;

a disubstituted amino group substituted with an aromatic hydrocarbon group or a fused polycyclic aromatic group such as a diphenylamino group and dinaphthylamino group;

a diaralkylamino group such as a dibenzylamino and diphenethylamino group;

a disubstituted amino group substituted with an aromatic heterocyclic group such as a dipyridylamino group or a dithienylamino group;

a dialkenylamino group such as a diallylamino group; and a disubstituted amino group substituted with a substituent selected from an alkyl group, an aromatic hydrocarbon group, a fused polycyclic aromatic group, an aralkyl group, an aromatic heterocyclic group, or an alkenyl group.

These substituents may be further substituted by the exemplified substituents. Further, these substituents may be bonded to each other, with the same substituted benzene ring, via a single bond, a substituted or unsubstituted methylene group, a substituted or unsubstituted amino group, an oxygen atom, or a sulfur atom to form a ring.

As $Ar_1$, $Ar_2$, $Ar_3$, and $Ar_4$ in the general formula (1), an aromatic hydrocarbon group, a fused polycyclic aromatic group, the structural formula (B), the structural formula (B), thienyl group, benzothienyl group, dibenzofuranyl group, dibenzothienyl group or the like are preferable; and phenyl group, biphenylyl group, terphenylyl group, naphthyl group, phenanthryl group, fluorenyl group, the structural formula (B), the structural formula (B), thienyl group, benzothienyl group, dibenzofuranyl group, and dibenzothienyl group are more preferable; and phenyl group, biphenylyl group, fluorenyl group, structural formula (B), structural formula (B), dibenzofuranyl group, dibenzothienyl group or the like are even more preferable.

Examples of the "linear or branched alkyl group having 1 to 6 carbon atoms", "cycloalkyl group having 5 to 10 carbon atoms" or "linear or branched alkenyl group having 2 to 6 carbon atoms" in "linear or branched alkyl group having 1 to 6 carbon atoms which may have a substituent", "cycloalkyl group having 5 to 10 carbon atoms which may have a substituent", or "linear or branched alkyl group having 1 to 6 carbon atoms which may have a substituent," represented by $R_1$ to $R_4$ and $R_{23}$ to $R_{26}$ in structural formulae (B), (B-1), (B-2), (B-3), (B-4), (B-5) and (B') include a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, and a 2-butenyl group. These groups may be bonded to each other, with the same substituted benzene ring, via a single bond, a substituted or unsubstituted methylene group, a substituted or unsubstituted amino group, an oxygen atom, or a sulfur atom to form a ring.

The "substituent" in "linear or branched alkyl group having 1 to 6 carbon atoms with a substituent", "cycloalkyl group having 5 to 10 carbon atoms with a substituent", or "linear or branched alkenyl group having 2 to 6 carbon atoms with a substituent" represented by $R_1$ to $R_4$ and $R_{23}$ to $R_{26}$ in structural formulae (B), (B-1), (B-2), (B-3), (B-4), (B-5) and (B'), may have the same means as the substituent in "substituted aromatic hydrocarbon group", "substituted aromatic heterocyclic group", or "substituted fused polycyclic aromatic group" represented by $Ar_1$ to $Ar_4$ in the formula (1), and the possible embodiments thereof may be used.

Examples of "linear or branched alkyloxy group having 1 to 6 carbon atoms", or "cycloalkyloxy group having 5 to 10 carbon atoms" in the "linear or branched alkyloxy group having 1 to 6 carbon atoms which may have a substituent" or the "cycloalkyloxy group having 5 to 10 carbon atoms which may have a substituent" represented by $R_1$ to $R_4$ and $R_{23}$ to $R_{26}$, in the formulae (B), (B-1), (B-2), (B-3), (B-4), (B-5) and (B') include a methyloxy group, ethyloxy group, n-propyloxy group, isopropyloxy group, n-butyloxy group, tert-butyloxy group, n-pentyloxy group, n-hexyloxy group, cyclopentyloxy group, cyclohexyloxy group, cycloheptyloxy group, cyclooctyloxy group, a 1-adamantyloxy group, and a 2-adamantyloxy group. These groups may be bonded to each other, with the same substituted benzene ring, via a single bond, a substituted or unsubstituted methylene group, a substituted or unsubstituted amino group, an oxygen atom, or a sulfur atom to form a ring.

The "substituent" in the "linear or branched alkyloxy group having 1 to 6 carbon atoms having a substituent" or the "cycloalkyloxy group having 5 to 10 carbon atoms having a substituent" represented by $R_1$ to $R_4$ and $R_{23}$ to $R_{26}$ in structural formulae (B), (B-1), (B-2), (B-3), (B-4), (B-5) and (B') may have the same means as the "substituent" in "substituted aromatic hydrocarbon group", "substituted aromatic heterocyclic group" or "substituted fused polycyclic aromatic group" represented by $Ar_1$ to $Ar_4$ in the above general formula (1).

The "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $R_1$ to $R_4$ and $R_{23}$ to $R_{26}$ in structural formulae (B), (B-1), (B-2), (B-3), (B-4), (B-5), and (B') have the same means as the "substituted or unsubstituted "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_1$ to $Ar_4$ in the general formula (1), and the possible embodiments thereof may be used.

The "substituent" in "substituted aromatic hydrocarbon group", "substituted aromatic heterocyclic group", or "substituted fused polycyclic aromatic group" represented by $R_1$ to $R_4$ and $R_{23}$ to $R_{26}$ in structural formulae (B), (B-1), (B-2), (B-3), (B-4), (B-5), and (B') has the same means as the "substituent" in "substituted aromatic hydrocarbon group", "substituted aromatic heterocyclic group", or "substituted fused polycyclic aromatic group" represented by $Ar_1$ to $Ar_4$, in the general formula (1), and the possible embodiments thereof may be used.

Examples of the "aryloxy group" in the "substituted or unsubstituted aryloxy group" represented by $R_1$ to $R_4$ and $R_{23}$ to $R_{26}$ in structural formulae (B), (B-1), (B-2), (B-3), (B-4), (B-5) and (B') include a phenyloxy group, a tolyloxy group, a biphenylyloxy group, a terphenylyloxy group, a naphthyloxy group, an anthryloxy group, a phenanthryloxy group, a fluorenyloxy group, an indenyloxy group, a pyrenyloxy group, and a perylenyloxy group. These groups may be bonded to each other, with the same substituted benzene ring, via a single bond, a substituted or unsubstituted methylene group, a substituted or unsubstituted amino group, an oxygen atom, or a sulfur atom to form a ring.

The "substituent" in the "substituted aryloxy group" represented by $R_1$ to $R_4$ and $R_{23}$ to $R_{26}$ in structural formulae (B), (B-1), (B-2), (B-3), (B-4), (B-5) and (B') may have the same means as the "substituent" in the "substituted aromatic hydrocarbon group", "substituted aromatic heterocyclic group" or "substituted fused polycyclic aromatic group" represented by $Ar_1$ to $Ar_4$ in the above general formula (1).

The "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_5$ or $Ar_6$ in structural formulae (B), (B-2), (B-4), and (B') may have the same means as the "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_1$ to $Ar_4$ in the above general formula (1), and the possible embodiments thereof may be used.

The "substituent" in "substituted aromatic hydrocarbon group", "substituted aromatic heterocyclic group", or "substituted fused polycyclic aromatic group" represented by $Ar_5$ or $Ar_6$ in the structural formulae (B), (B-2), (B-4), and (B') may have the same means as the "substituent" in "substituted aromatic hydrocarbon group", "substituted aromatic heterocyclic group", or "substituted fused polycyclic aromatic group" represented by $Ar_1$ to $Ar_4$ in the above general formula (1).

As $Ar_5$ and $Ar_6$ in structural formulae (B), (B-2), (B-4), and (B'), aromatic hydrocarbon group, fused polycyclic aromatic group, thienyl group, benzothienyl group, dibenzofuranyl group, dibenzothienyl group, or the like are preferable; and phenyl group, biphenylyl group, terphenylyl group, naphthyl group, phenanthryl group, fluorenyl group, thienyl group, benzothienyl group, dibenzofuranyl group, dibenzothienyl group, or the like are more preferable.

In the structural formula (B), it is preferable that only one of $R_1$, $R_2$, $R_3$, $R_4$, $Ar_5$, and $Ar_6$ is a linking group; and in particular, it is preferable that $Ar_5$ is a linking group.

In the structural formula (B'), it is preferable that only one of $R_3$, $R_4$, $R_{23}$ to $R_{26}$, $Ar_5$, and $Ar_6$ is a linking group; and in particular, it is preferable that $Ar_8$ is a linking group.

In the structural formulae (B) and (B'), X represents a carbon atom or a nitrogen atom; and Y represents a carbon atom, an oxygen atom, a sulfur atom or a nitrogen atom.

Here, when Y is an oxygen atom or a sulfur atom, Y does not have a linking group or a substituent of $Ar_6$ ($Ar_6$ does not exist). When X and Y are nitrogen atoms, one of $Ar_5$ and $Ar_6$ is a linking group or a substituent (one of $Ar_5$ and $Ar_6$ is not present.). When X is a nitrogen atom and Y is a carbon atom, either of $Ar_5$ and $Ar_6$ is a linking group or a substituent (one of $Ar_5$ and $Ar_6$ is not present.).

In the structural formulae (B) and (B'), when X is a nitrogen atom, Y is preferably a nitrogen atom. In this case, the linking group of $Ar_5$ or $Ar_6$ is preferably bonded to the carbon atoms of $Ar_1$, $Ar_2$, $Ar_3$, or $Ar_4$ (the structural formula (B) or (B') is a substituent of $Ar_1$, $Ar_2$, $Ar_3$, or $Ar_4$.) from the viewpoint of the stability of the compound.

In the structural formulae (B) and (B'), when X is a carbon atom, Y is preferably a carbon atom, an oxygen atom or a sulfur atom; and is more preferably an oxygen atom or a sulfur atom. When X is a carbon atom, it is preferable from the viewpoint of the stability of the compound that the linking group of $Ar_5$ or $Ar_6$ is bonded to the carbon atom of $Ar_1$, $Ar_2$, $Ar_3$ or $Ar_4$ (the structural formula (B) or (B') is a substituent of $Ar_1$, $Ar_2$, $Ar_3$ or $Ar_4$.).

In the structural formulae (B) and (B'), the case when X and Y are carbon atoms, and the case when X is a nitrogen atom and Y is an oxygen atoms or a sulfur atom are excluded from the present disclosure.

In the arylamine compound represented by the general formula (1), the arylamine skeleton in which —$NAr_1Ar_2$ is bonded to the aromatic ring and the arylamine skeleton in which —$NAr_3Ar_4$ is bonded to the aromatic ring may be different or the same. In the arylamine compound represented by the general formula (1), when the arylamine skeleton in which —$NAr_1Ar_2$ is bonded to the aromatic ring and the arylamine skeleton in which —$NAr_3Ar_4$ is bonded to the aromatic ring is the same, it is preferable because the compound can be easily synthesized and has good stability.

As the arylamine compound represented by the general formula (1), one of $Ar_1$ and $Ar_2$, and one of $Ar_3$ and $Ar_4$ is preferably an unsubstituted phenyl group.

Further, as the arylamine compound represented by the general formula (1), one of $Ar_1$ and $Ar_2$, and one of $Ar_3$ and $Ar_4$ is preferably a phenyl group having structural formula (B) as a substituent. In this case, $R_1$, $R_2$, $R_3$, $R_4$ and $Ar_6$ in the structural formula (B) are preferably hydrogen atoms. In particular, it is preferable that the structural formula (B) is bonded to the para position of the benzene ring. Such arylamine compounds are preferred because they have a high absorbance at wavelengths from 400 nm to 410 nm and can form thin films with higher refractive indices and extinction coefficients when transmitting light at wavelengths of 400 nm and 410 nm.

Among the arylamine compounds represented by the formula (1) which are suitably used for the organic EL element of the present embodiment, compounds represented by the formulae (1-1) to (1-56) are shown below as specific examples of preferable compounds. The compound represented by the general formula (1) is not limited to the compounds represented by the formulae (1-1) to (1-56).

[Chemical Formula 11]

(1-1)

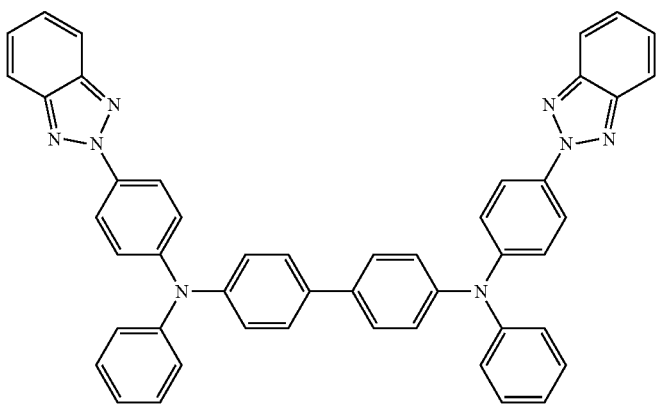

(1-2)
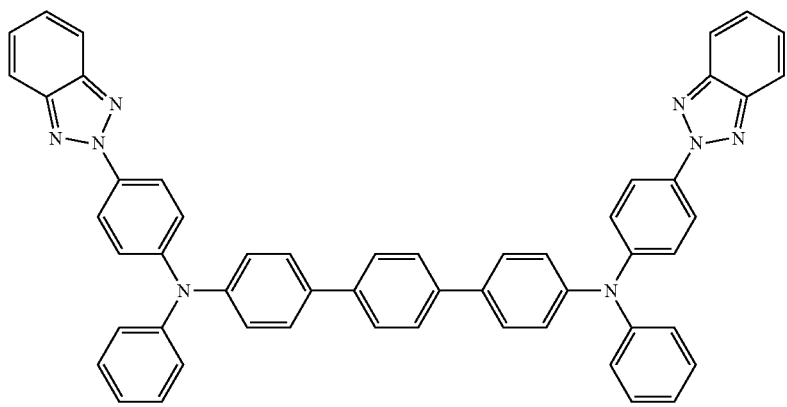
(1-3)
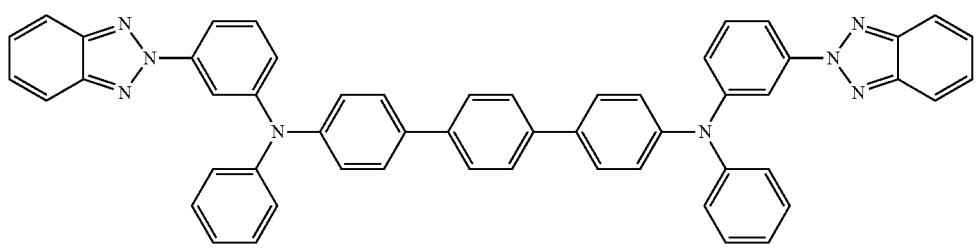
(1-4)
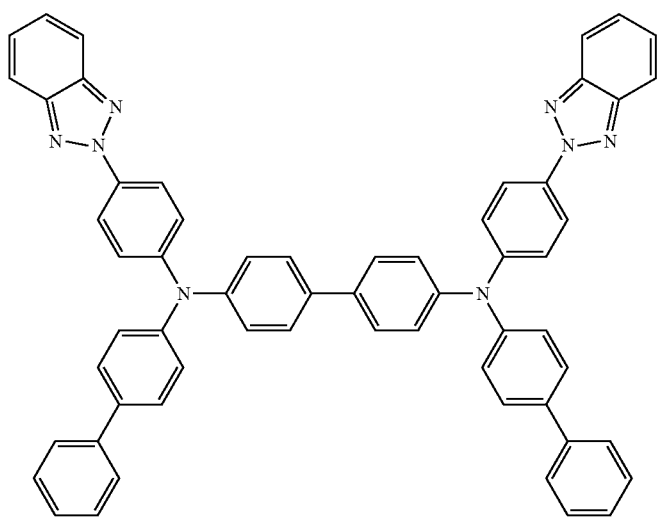

(1-5)
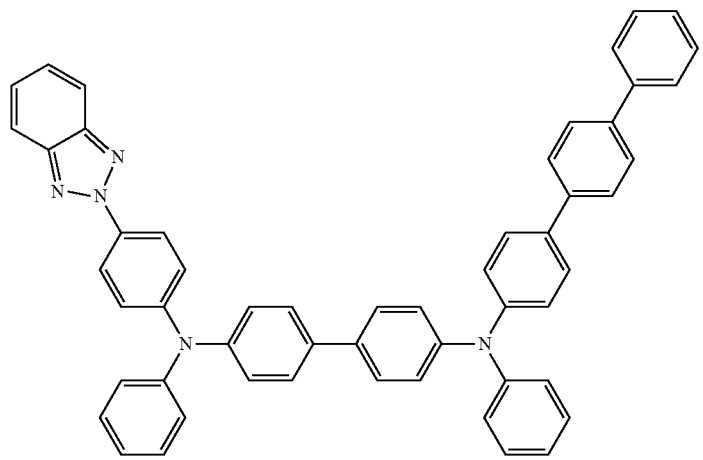
(1-6)
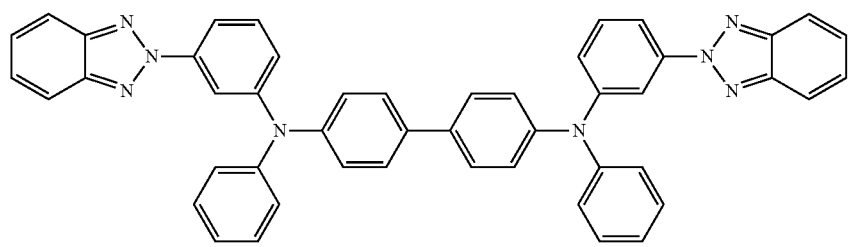
(1-7)
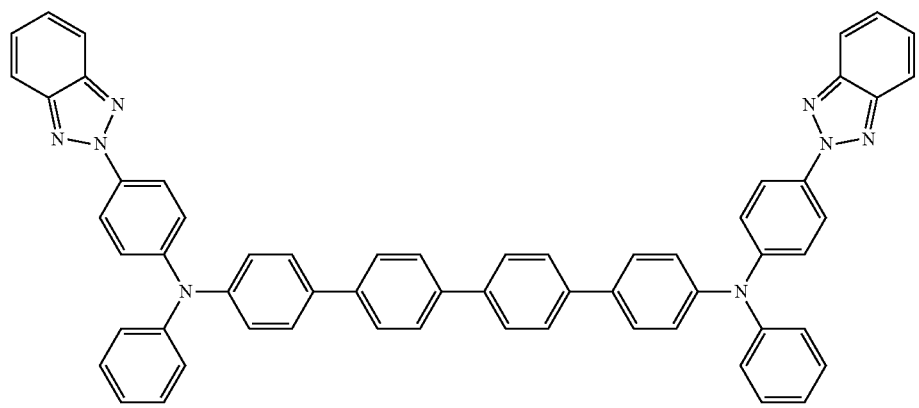

(1-8)
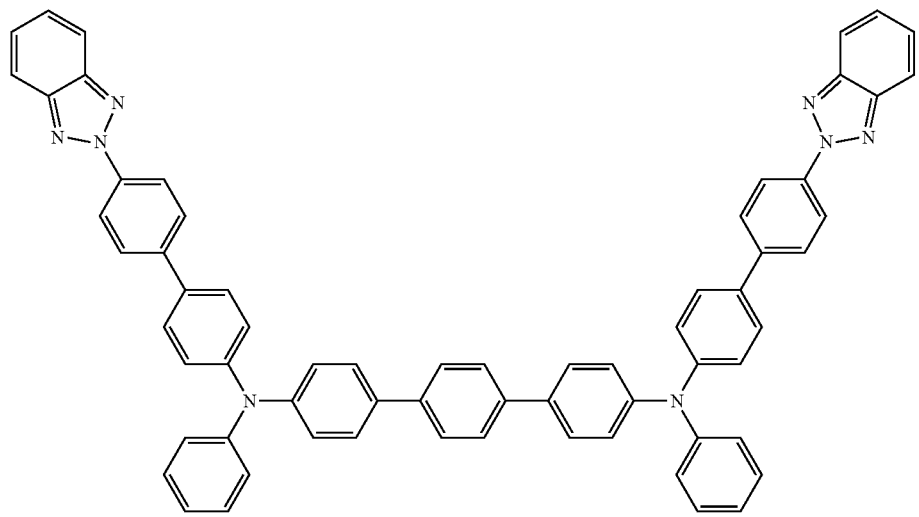
(1-9)
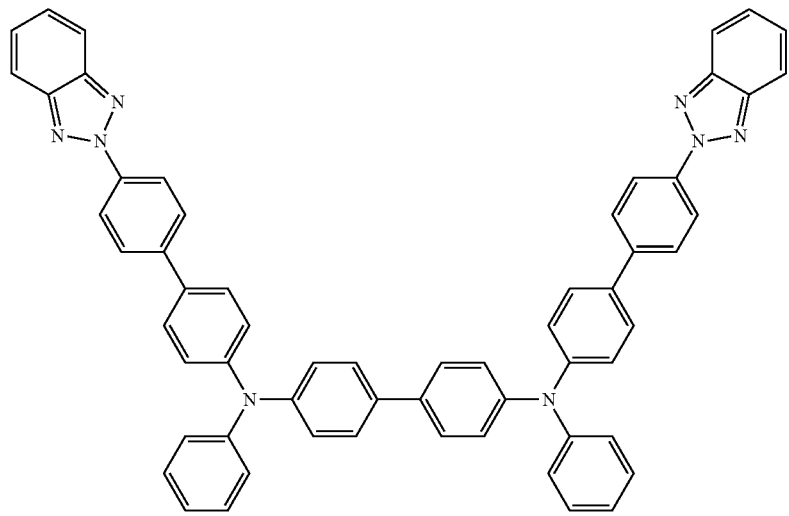
(1-10)
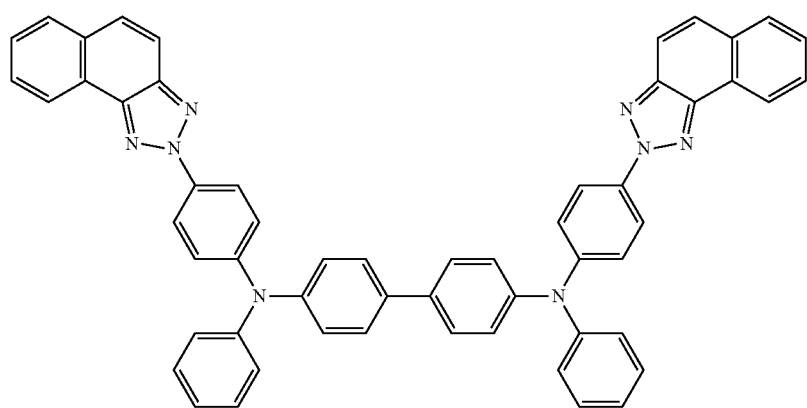

[Chemical Formula 12]
(1-11)
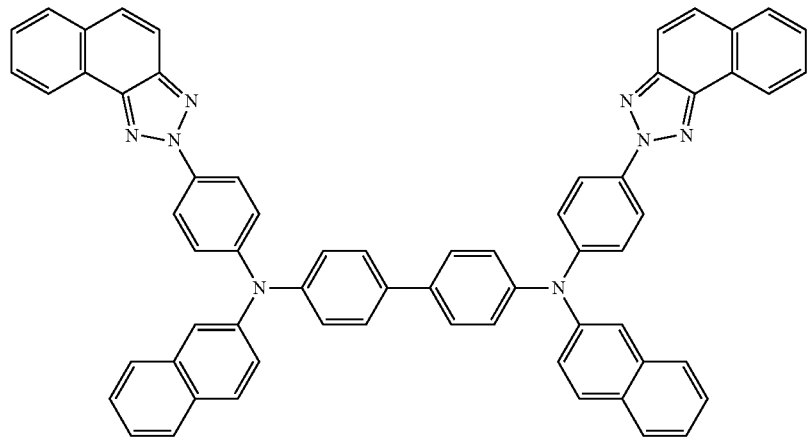
(1-12)
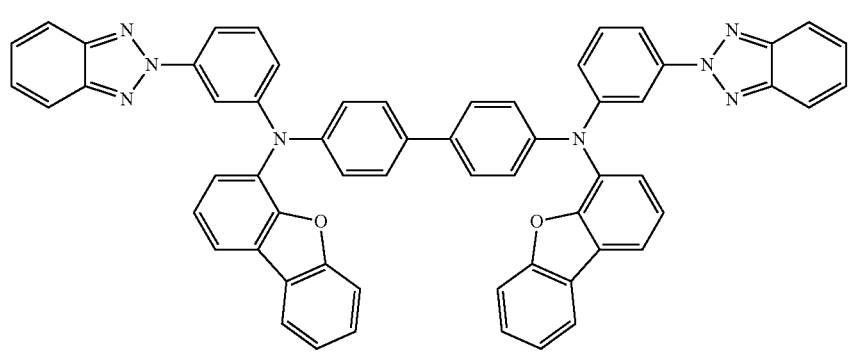
(1-13)
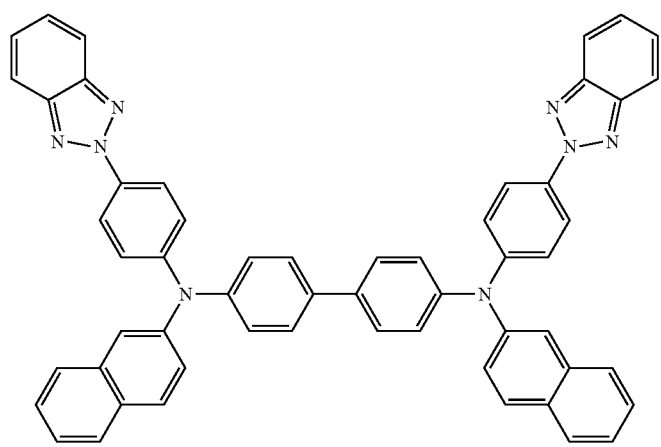

(1-14)
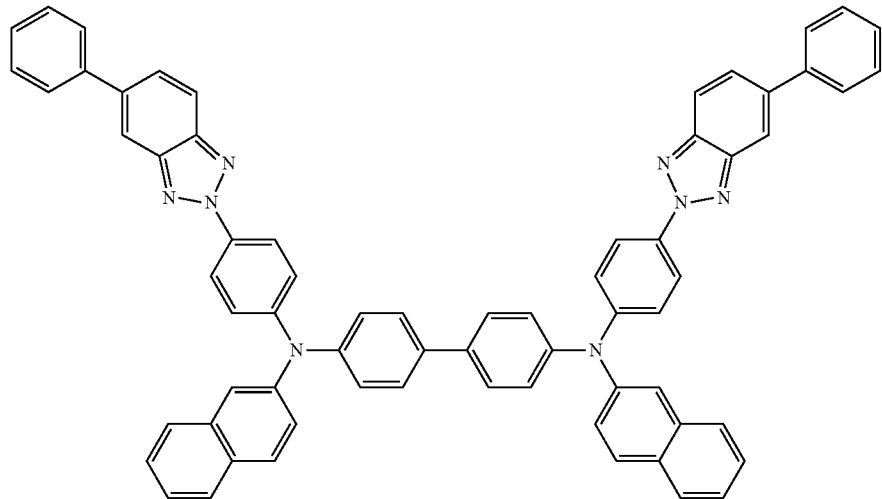
(1-15)
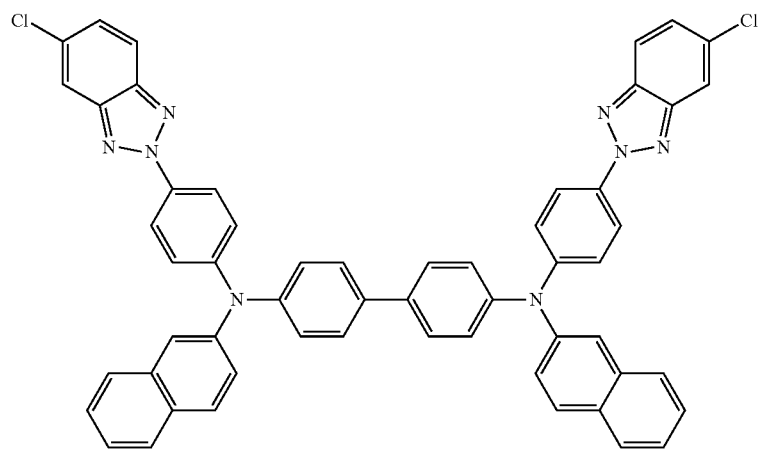
(1-16)
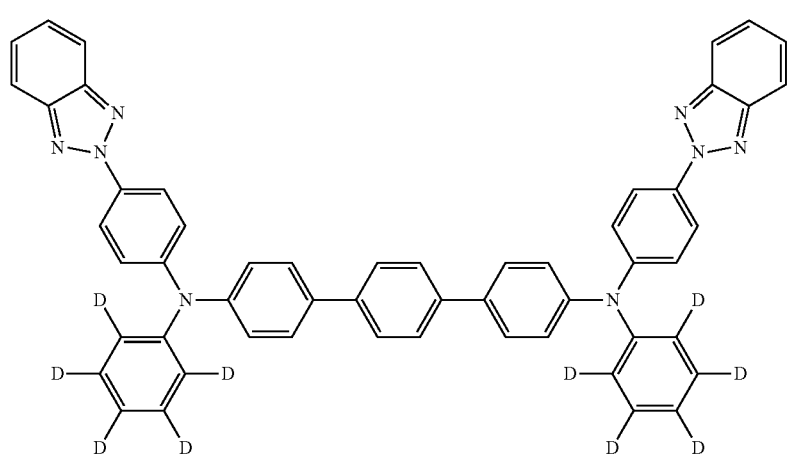

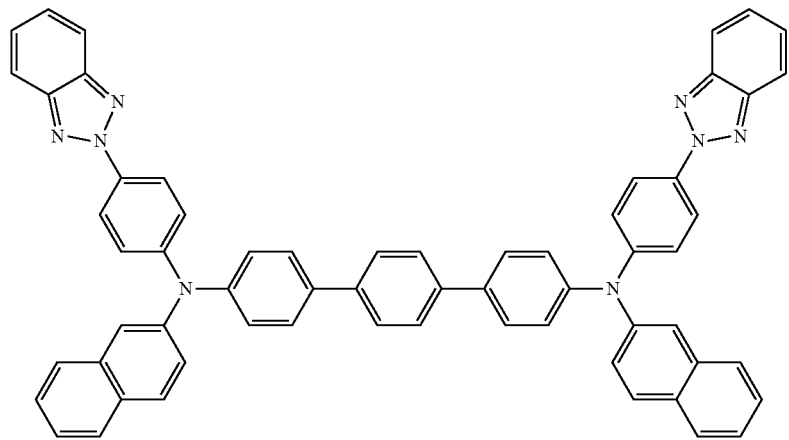
(1-17)
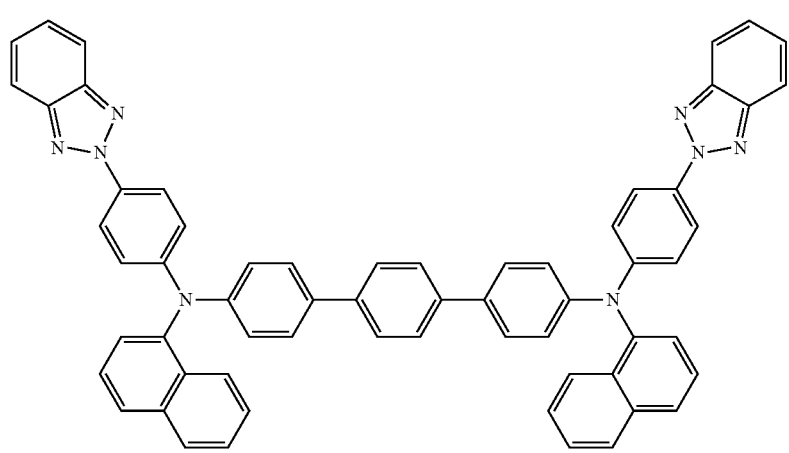
(1-18)
(In formula (1-16), D is deuterium.)
[Chemical Formula 13]
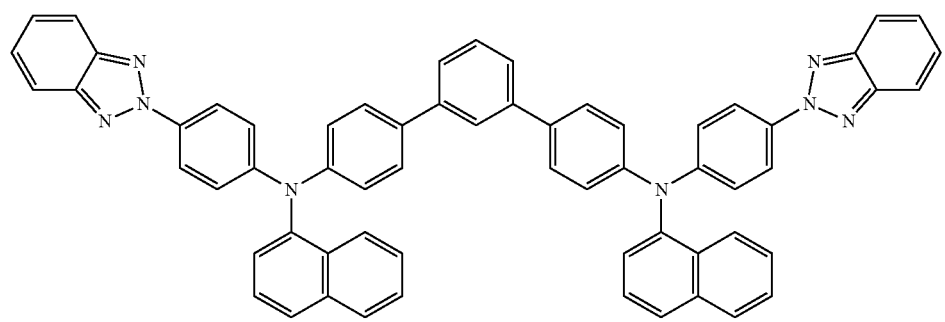
(1-19)

(1-20)
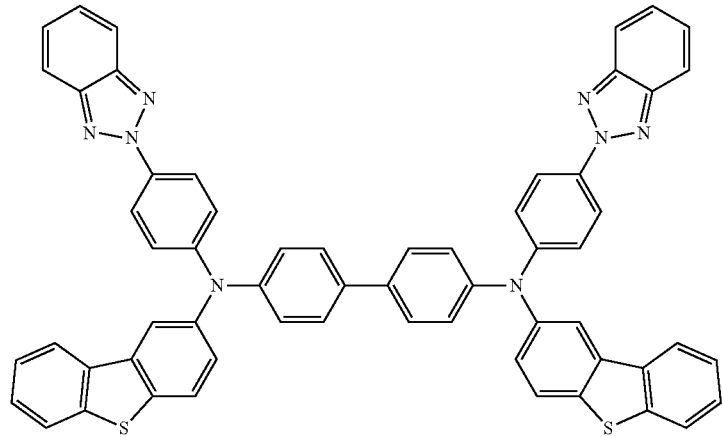
(1-21)
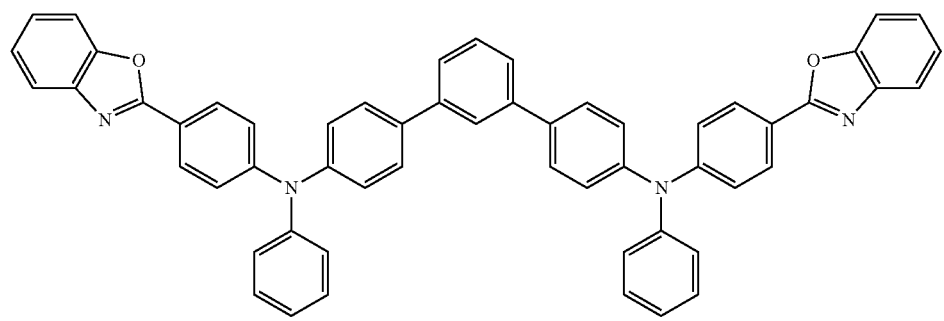
(1-22)
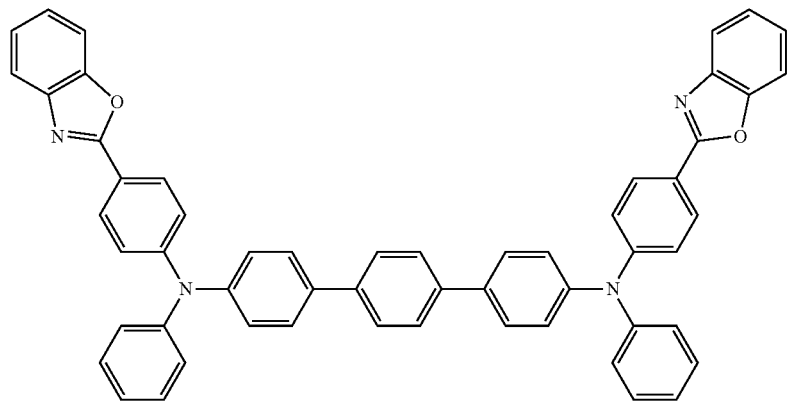
(1-23)
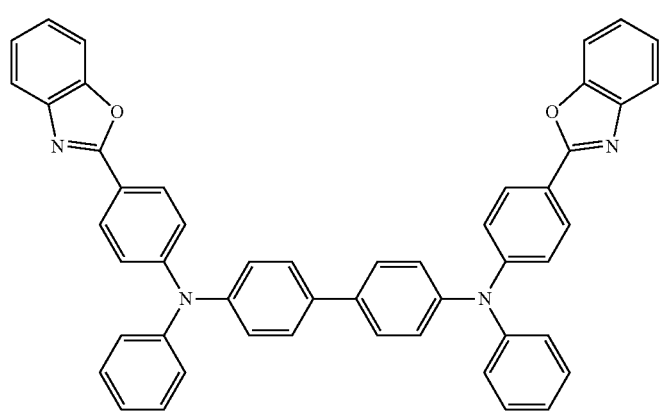

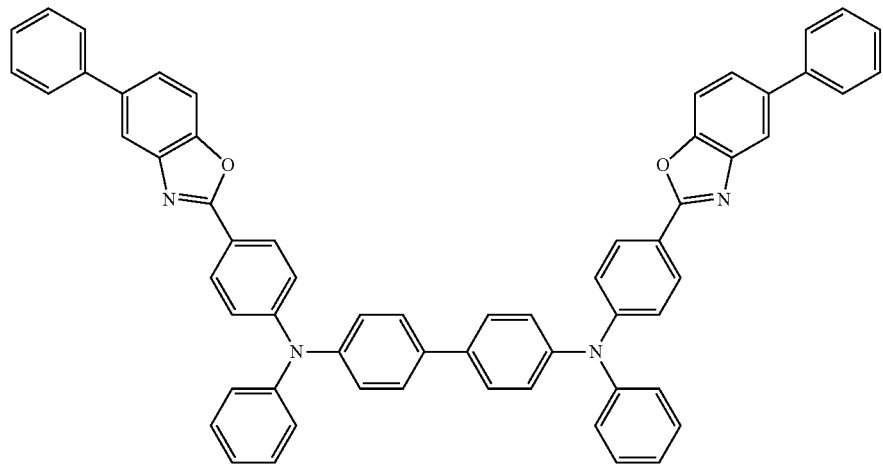
(1-24)
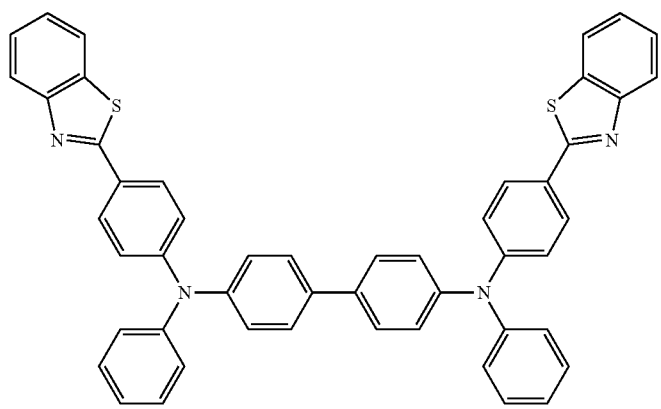
(1-25)
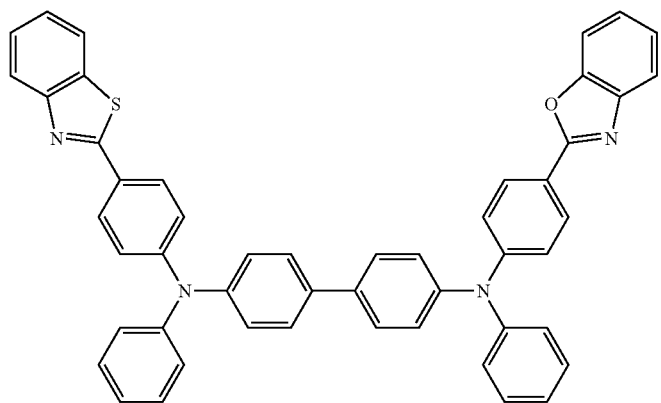
(1-26)

[Chemical Formula 14]
(1-27)
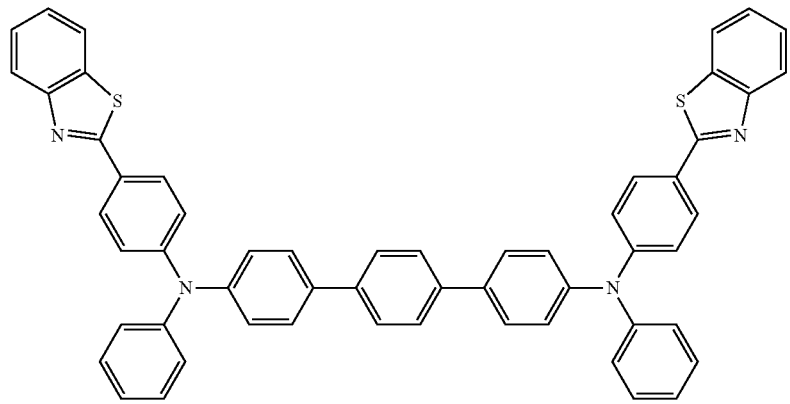
(1-28)
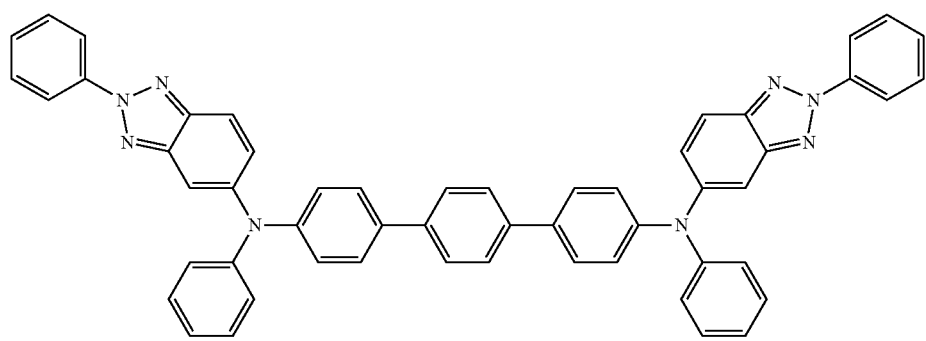
(1-29)
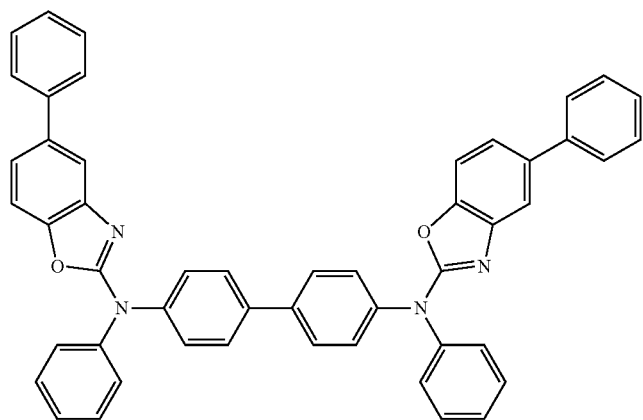

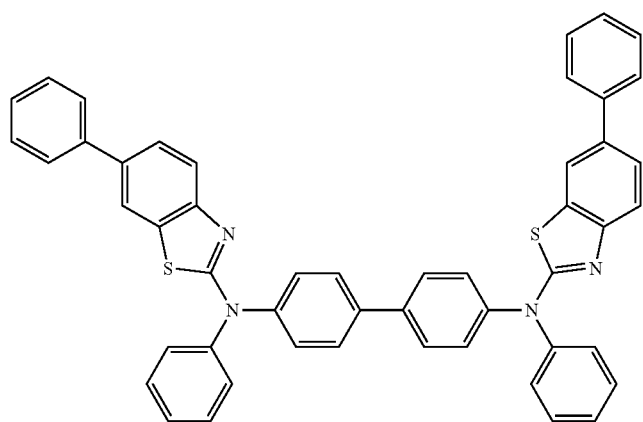
(1-30)
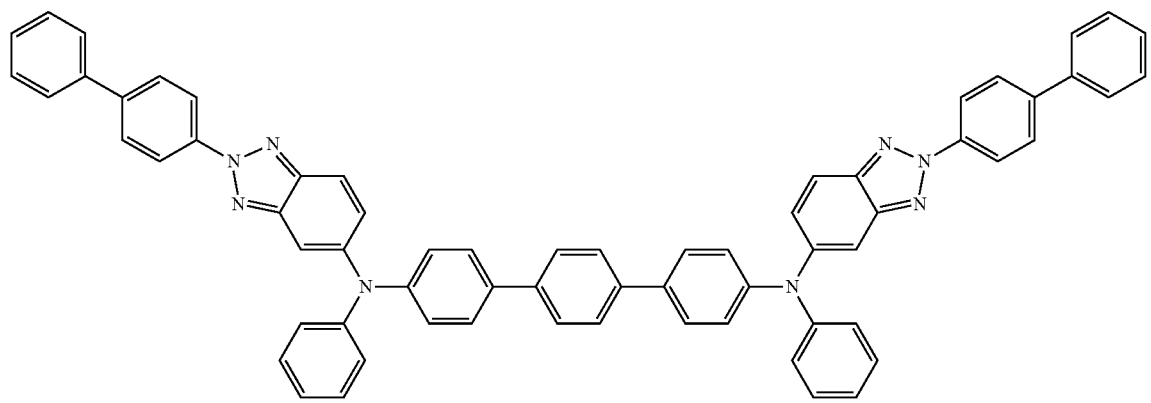
(1-31)
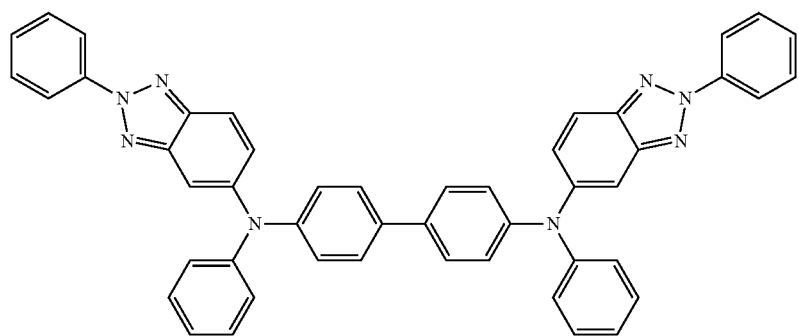
(1-32)

[Chemical Formula 15]
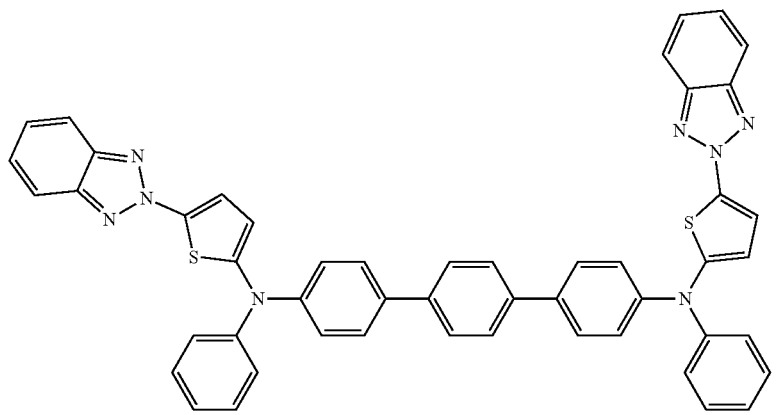
(1-33)
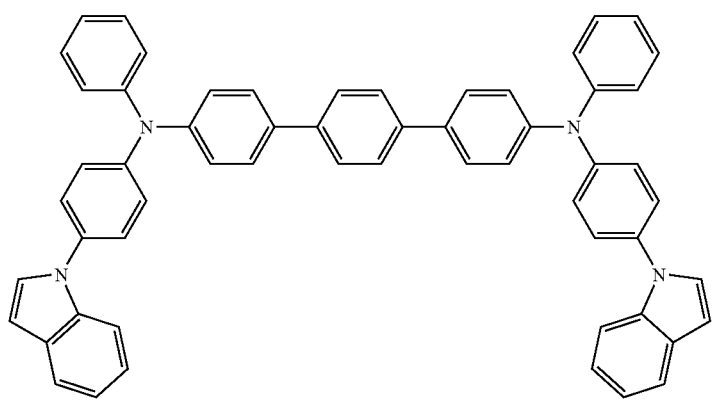
(1-34)
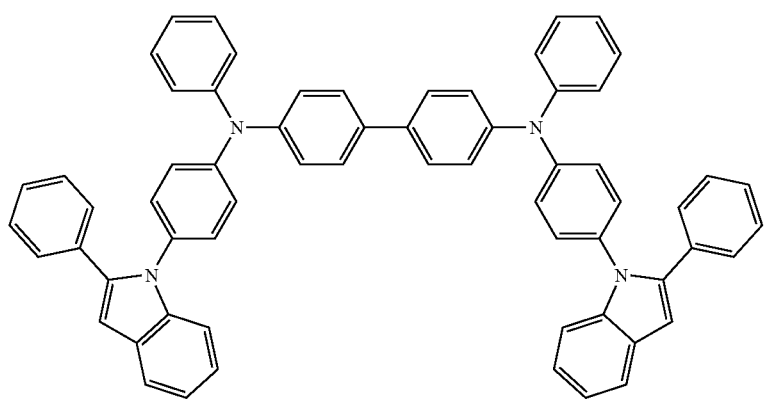
(1-35)

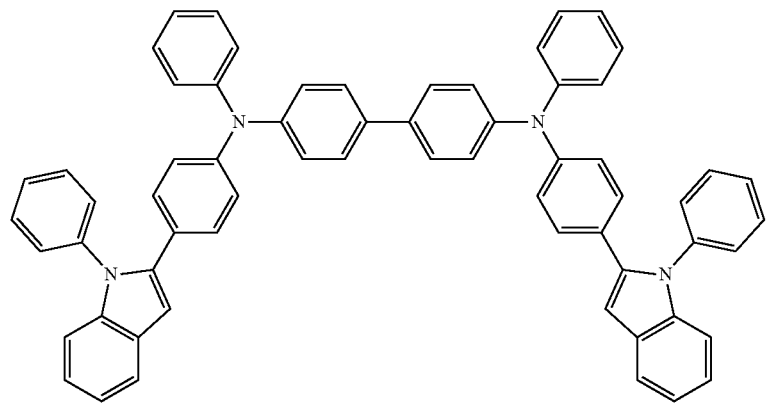
(1-36)
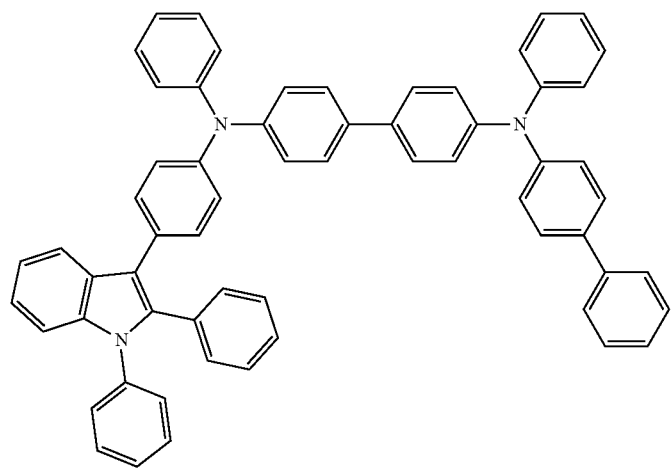
(1-37)
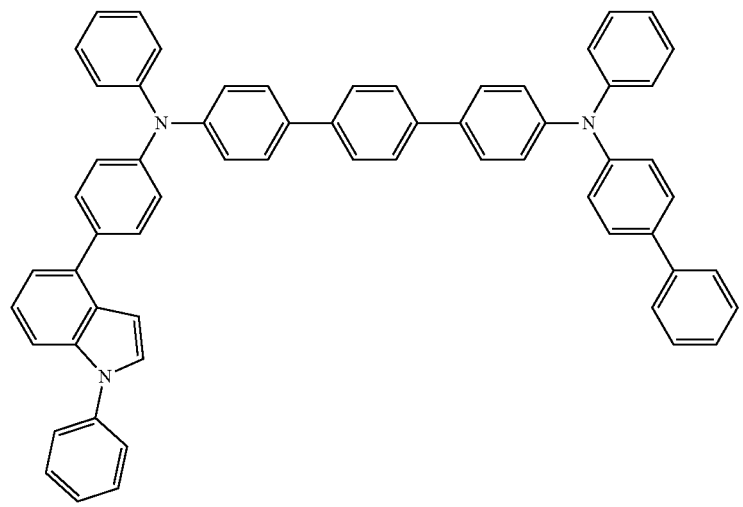
(1-38)

(1-39)
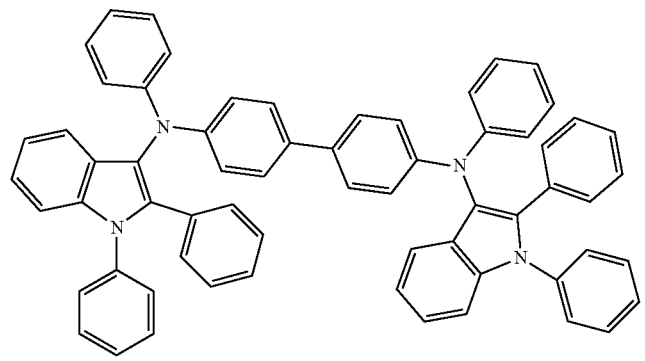
(1-40)
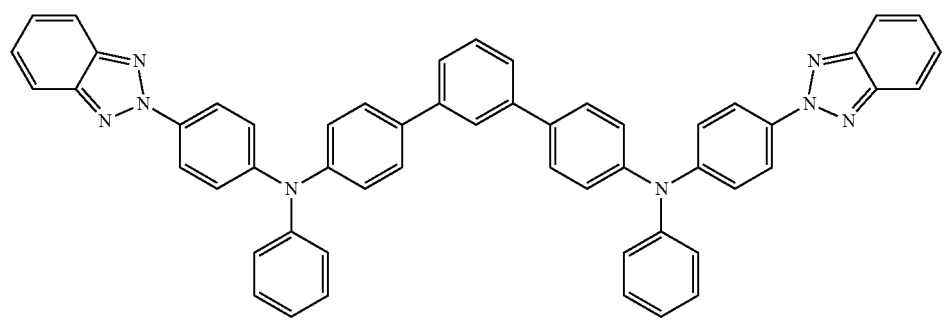
[Chemical Formula 16]
(1-41)
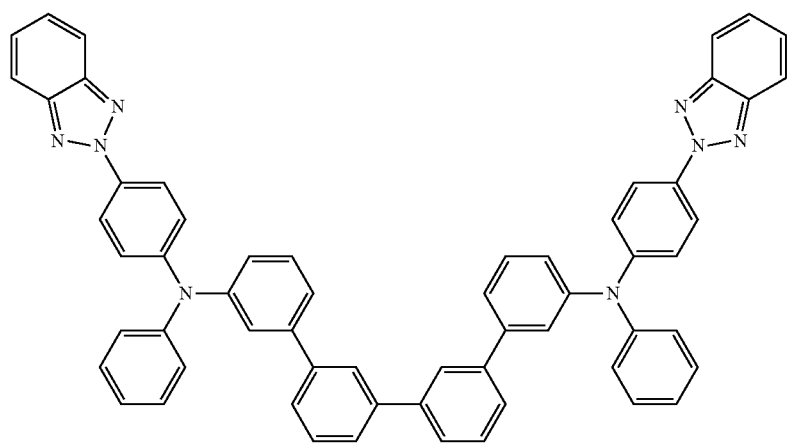

(1-42)
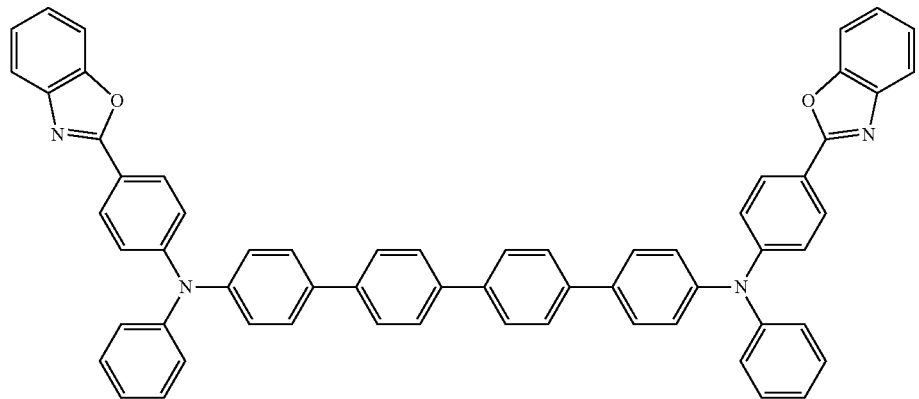
(1-43)
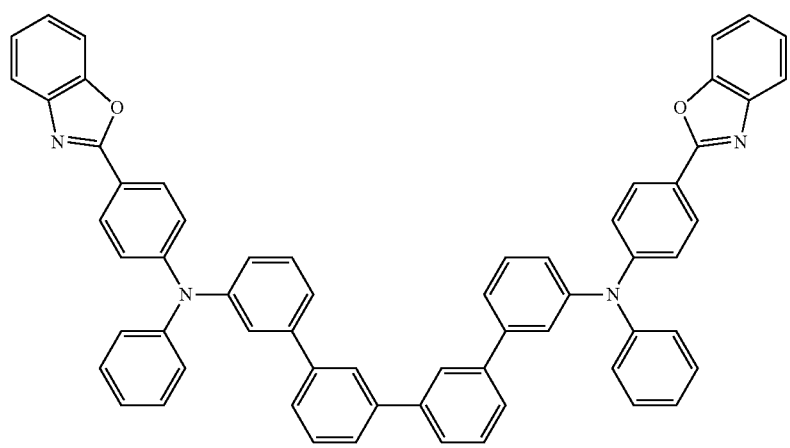
(1-44)
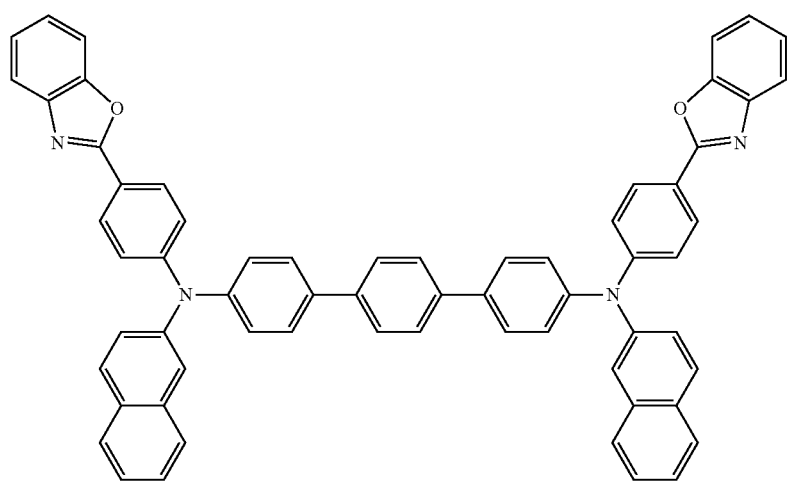

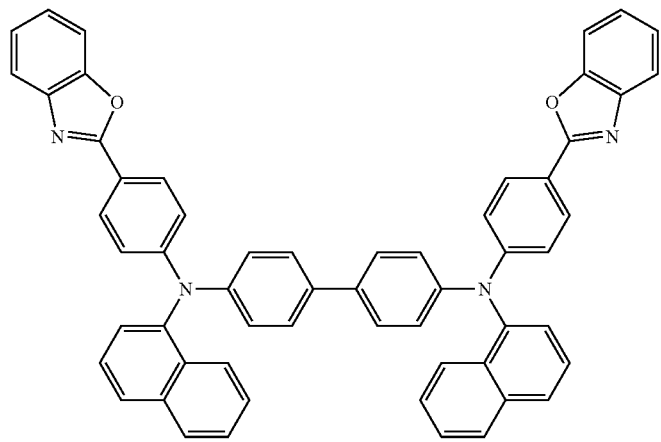
(1-45)
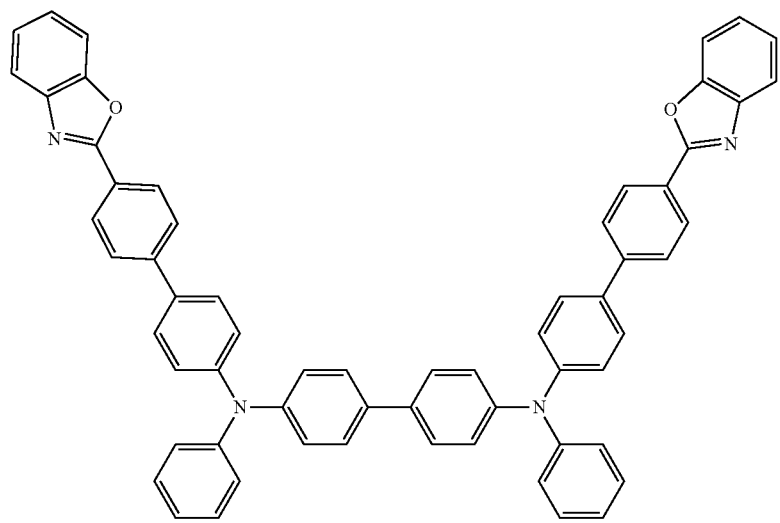
(1-46)
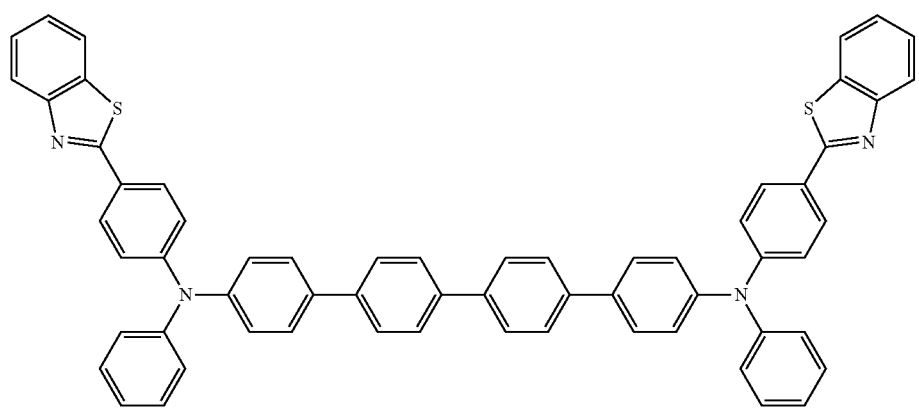
(1-47)

(1-48)
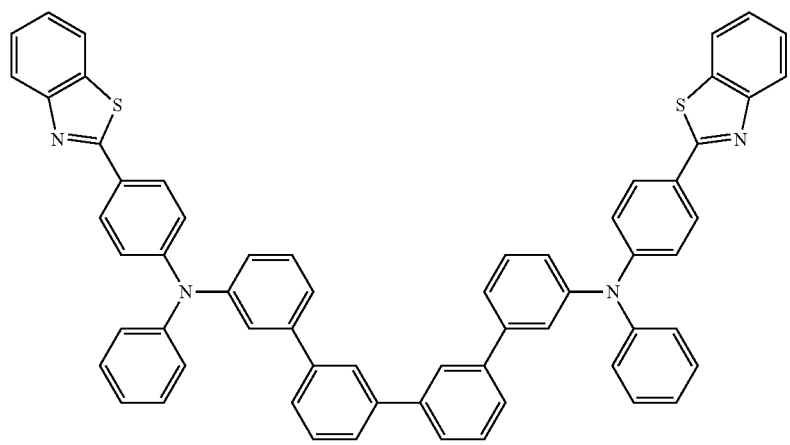
[Chemical Formula 17]
(1-49)
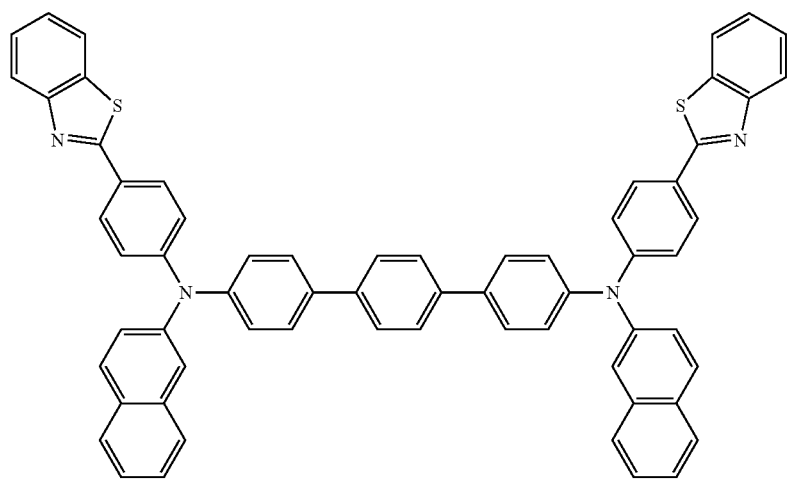
(1-50)
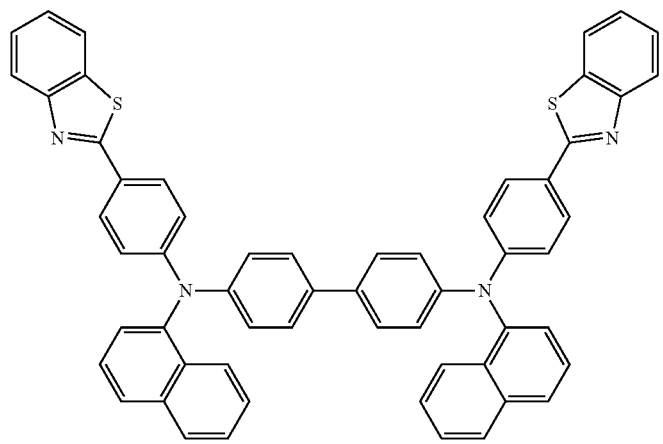

(1-51)
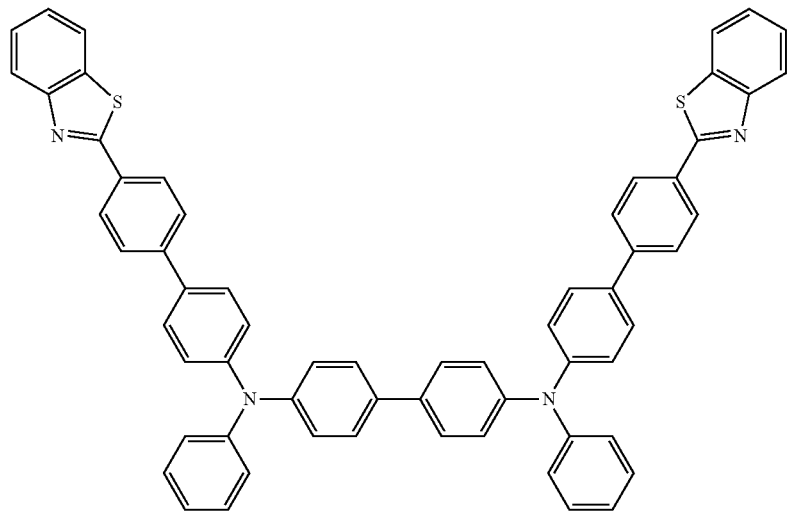
(1-52)
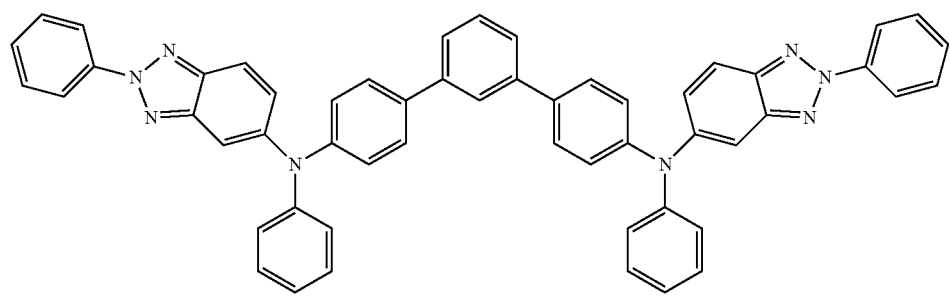
(1-53)
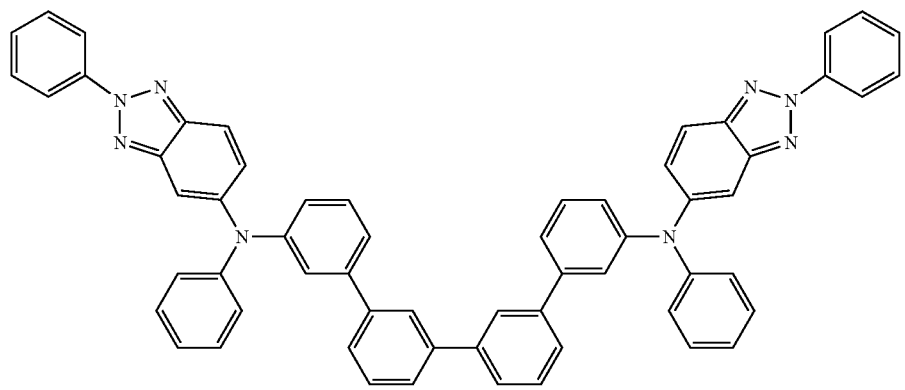

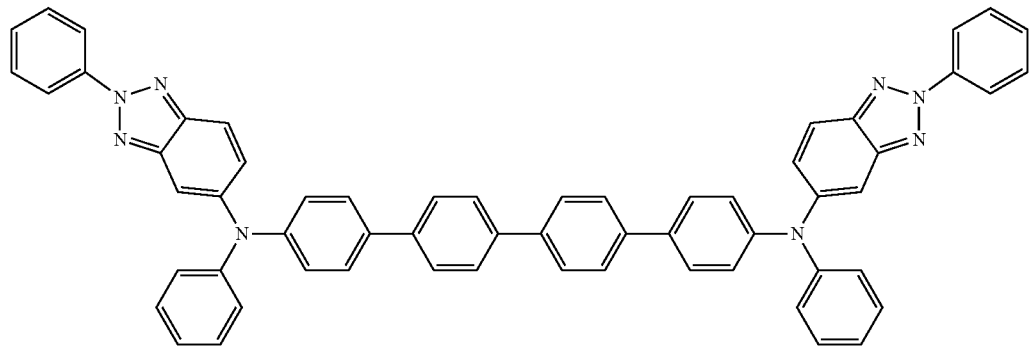

(1-54)

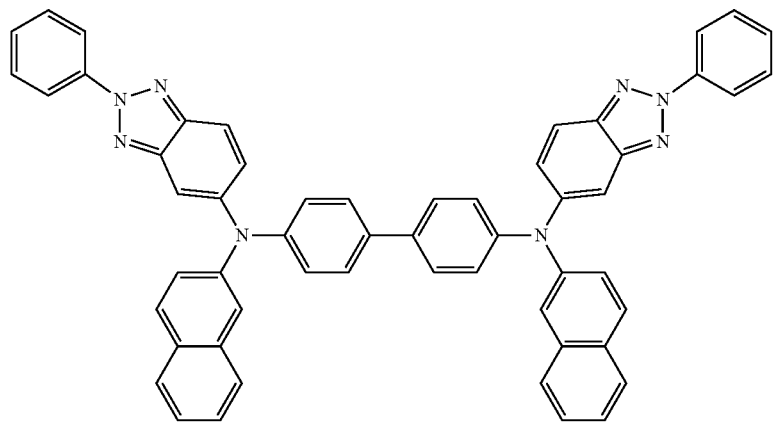

(1-55)

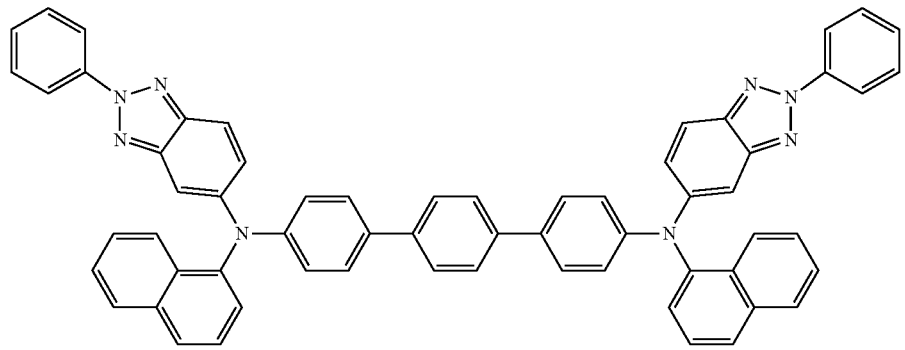

(1-56)

As the material of the capping layer, it is preferable to use any one or more compounds represented by the formulae (1-1), (1-2), (1-22), (1-23), (1-25), and (1-27) selected from compounds represented by the formulae (1-1) to (1-56).

These compounds can form thin films with high absorbance at wavelengths from 400 nm to 410 nm and high refractive index and extinction coefficient when transmitting light at wavelengths of 400 nm and 410 nm. Moreover, these compounds can be preferably used as a material for a capping layer of an organic EL element having a luminous layer containing a specific heterocyclic compound having a fused ring structure. Specifically, the resulting organic EL element has a high luminance, a good light emission efficiency and power efficiency, and a long lifetime.

The compound represented by the general formula (1) preferably has a glass transition temperature (Tg) of 100° C. or higher, and more preferably 120° C. or higher. The glass transition temperature (Tg) of the compound is an indicator of the stability of the thin film state. When the glass transition temperature (Tg) of the compound is 100° C. or more, a thin film having good stability can be formed, and therefore it is preferable as a material of the capping layer. An organic EL element having a capping layer having good stability has a long lifetime and it is preferable.

The glass transition temperature (Tg) of the compound represented by the general formula (1) in this embodiment is obtained by measuring the glass transition temperature (Tg) of the compound powder with a high-sensitivity differential scanning calorimeter (DSC 3100 SA, manufactured by Bulker AXS).

The compound represented by the general formula (1) preferably has an absorbance of 0.2 to 1.0 at a concentration of $10^{-5}$ mol/L at a wavelength of 400 nm to 410 nm, and more preferably has an absorbance of 0.5 to 0.9 at a wavelength of 400 nm. A capping layer comprising a compound having an absorbance of 0.2 or more at 400 nm to 410 nm has a good ability to absorb light at 400 nm and 410 nm wavelengths. Therefore, the organic EL element having the capping layer containing the compound having the absorbance of 0.2 or more has good light resistance and a long lifetime.

The absorbance of the compound represented by the general formula (1) is measured using an ultraviolet-visible near-infrared spectrophotometer (V-650 manufactured by JASCO Co., Ltd.) after adjusting the concentration to $10^{-5}$ mol/L with a toluene solvent.

The compound represented by the general formula (1) preferably has an absorption coefficient in the range of 60,000 to 100,000. When the absorption coefficient of the compound is in the above range, a thin film having a good function of absorbing light can be formed, and therefore it is preferable as a material of the capping layer.

The absorption coefficient of the compound represented by the general formula (1) is determined by the following method. First, samples of compounds are prepared and adjusted to four concentrations of $5.0\times10^{-6}$ mol/L, $1.0\times10^{-5}$ mol/L, $1.5\times10^{-5}$ mol/L, and $2.0\times10^{-5}$ mol/L in a toluene solution. The absorbance of each sample at its peak wavelength is then measured using an ultraviolet visible near-infrared spectrophotometer (V-650 manufactured by JASCO Co., Ltd.). A calibration curve is prepared using the results, and the absorption coefficient of the compound is calculated.

The arylamine compound represented by the general formula (1) can be synthesized, for example, by a known method (see, for example, Non-Patent Document 5.).

The synthesized compound represented by the general formula (1) can be identified by a nuclear magnetic resonance (NMR) analysis.

The compound represented by the general formula (1) is preferably used after purification by purification using a column chromatography; adsorption purification by silica gel, activated carbon, activated clay, or the like; recrystallization or crystallization with a solvent; or sublimation purification.

"Anode"

In the organic EL element of the present embodiment, an anode is provided on a glass substrate. As the material of the anode, an electrode material having a large work function, such as ITO (indium tin oxide) or gold, is used.

As a method of producing the anode, a known method such as a vapor deposition method can be used.

"Organic Layer"

In the present embodiment, an example will be described in which the organic layer includes a hole injection layer, a hole transport layer, an electron blocking layer, a luminous layer, a hole blocking layer, an electron transport layer, and an electron injection layer, all of which are stacked in this order from the anode side.

(Hole Injection Layer)

As the material of the hole injection layer of the organic EL element of the present disclosure, an arylamine compound having three or more triphenylamine structures in a molecule and having a structure in which the three or more triphenylamine structures are linked by a single bond or a divalent group not containing a heteroatom, for example, a material such as a starburst type triphenylamine derivative and various triphenylamine tetramers; a porphyrin compound represented by copper phthalocyanine; an acceptor type heterocyclic compound such as hexacyanoazatriphenylene; or a coating type polymer material can be used.

As the hole injection layer, a single layer formed of these materials alone may be used, or a single layer formed by mixing two or more materials may be used. The hole injection layer may be formed by laminating layers formed of the above materials alone, by laminating layers formed by mixing the materials, or by laminating the layers formed by mixing the materials with the layers formed of the above materials alone. These materials may be formed into a thin film by a vapor deposition method, or may be formed into a thin film by a known method such as a spin coating method or an ink jet method in addition to a vapor deposition method.

(Hole Transport Layer)

As the material of the hole transport layer of the organic EL element of the present disclosure, it is preferable to use a benzidine derivative such as N, N'-diphenyl-N, N'-di(m-tolyl)benzidine (hereinafter referred to as TPD), N, N'-diphenyl-N, N'-di (α-naphthyl)benzidine (hereinafter referred to as NPD), N, N, N', N'-tetrabiphenylylbenzidine; 1,1-bis [4-(di-4-tolylamino)phenyl]cyclohexane (hereinafter referred to as TAPC); or the like. As the material of the hole transport layer, an arylamine compound having two triphenylamine structures in a molecule and having a structure in which the two triphenylamine structures are linked by a single bond or a divalent group not containing a hetero atom, for example, N, N, N', N'-tetrabiphenylylbenzidine is preferably used. Further, as the material of the hole transport layer, an arylamine compound having three or more triphenylamine structures in a molecule and having a structure in which the three or more triphenylamine structures are linked by a single bond or a divalent group not containing a hetero atom, for example, various triphenylamine trimers and tetramers are preferably used.

As the hole transport layer, a single layer formed of these materials alone or a single layer formed by mixing two or more materials may be used. The hole transport layer may be formed by laminating layers formed of the above materials alone, by laminating layers formed by mixing the materials, or by laminating the layers formed by mixing the materials with the layers formed of the above materials alone.

These materials may be formed into a thin film by a vapor deposition method, or may be formed into a thin film by a known method such as a spin coating method or an ink jet method in addition to a vapor deposition method.

As the material of the hole injection layer and the hole transport layer, a coating type polymer material such as poly(3,4-ethylenedioxythiophene) (hereinafter referred to as PEDOT)/poly (styrene sulfonate) (hereinafter referred to as PSS) may be used.

In the hole injection layer or the hole transport layer, a material which is obtained by further P-doping tris bromophenylamine hexachloroantimony or a radialene derivative in a generally used material of this layer (for example, see Patent Document 3.) or a polymer compound having a structure of a benzidine derivative such as TPD in its partial structure, may be used.

(Electron Blocking Layer)

As the material of the electron blocking layer of the organic EL element of the present disclosure, a compound having an electron blocking function such as a carbazole derivative such as 4, 4', 4"-tri(N-carbazolyl)triphenylamine (hereinafter referred to as TCTA), 9,9-bis[4-(carbazole-9-yl)phenyl]fluorene, 1,3-bis(carbazole-9-yl)benzene (hereinafter referred to as mCP), 2, 2-bis(4-carbazole-9-ylphenyl) adamantane (hereinafter referred to as Ad-Cz); and a compound having a triarylamine structure and a triphenylsilyl group represented by 9-[4-(carbazole-9-yl)phenyl]-9-[4-(triphenylsilyl)phenyl]-9H-fluorene can be used.

As the electron blocking layer, a single layer formed of these materials alone or a single layer formed by mixing two or more materials may be used. The electron blocking layer may be formed by laminating layers formed of the materials alone, by laminating layers formed by mixing the materials, or by laminating layers formed by mixing the materials with the layers formed of these materials alone.

These materials may be formed into a thin film by a vapor deposition method, or may be formed into a thin film by a known method such as a spin coating method or an ink jet method in addition to a vapor deposition method.

(Luminous Layer)

In the organic EL element of the present embodiment, the luminous layer contains either or both of a heterocyclic compound having a fused ring structure represented by the general formula (2) and a heterocyclic compound having a fused ring structure represented by the general formula (3).

The heterocyclic compound having the fused ring structure represented by the general formula (2) and the heterocyclic compound having the fused ring structure represented by the general formula (3) in this embodiment can be used as a constituent material of a luminous layer of an organic EL element. The compounds represented by the formulae (2) and (3) are preferred compounds as a host material of a luminous layer, particularly as a host material of a luminous layer containing a phosphorescent light-emitting material. Specifically, an organic EL element using a compound represented by the formulae (2) and (3) as a constituent material of the luminous layer is superior in light emitting efficiency as compared with a case where a conventional material is used.

In the compounds represented by the formulae (2) and (3), it is preferable that $A_1$ in formula (2) ($A_2$ in formula (3)) is a single bond, and $Ar_7$ in formula (2) ($Ar_8$ in formula (3)) has a pyridine ring or a pyrimidine ring so as to obtain high emission efficiency. It is more preferable that $A_1$ in formula (2) ($A_2$ in formula (3)) is a single bond, and that $Ar_7$ in formula (2) ($Ar_8$ in formula (3)) has a pyrimidine ring.

The luminous layer of the organic EL element of the present embodiment may contain one or both of a heterocyclic compound having a fused ring structure represented by the general formula (2) and a heterocyclic compound having a fused ring structure represented by the general formula (3); and may further contain various metal complexes such as metal complexes of quinolinol derivatives such as $Alp_3$, an anthracene derivative, a bisstyrylbenzene derivative, a pyrene derivative, an oxazole derivative, a polyparaphenylenevinylene derivative, etc.

The luminous layer may be composed of a host material and a dopant material.

As the luminous layer of the organic EL element of the present embodiment, either or both of the heterocyclic compound having a fused ring structure represented by the general formula (2) and the heterocyclic compound having a fused ring structure represented by the general formula (3) are preferably used as the host material. As the host material, a thiazole derivative, a benzimidazole derivative, a polydialkylfluorene derivative, or the like can be used together with either or both of the heterocyclic compound having a fused ring structure represented by the general formula (2) and the heterocyclic compound having a fused ring structure represented by the general formula (3).

As the dopant material, quinacridone, coumarin, rubrene, perylene, pyrene, or their derivatives; benzopyran derivatives, indenophenanthrene derivatives, rhodamine derivatives, aminostyryl derivatives and or like can be used.

It is preferable that a phosphorescent light-emitting material is contained as the light-emitting material. As the phosphorescent material, a metal complex containing iridium or platinum can be used. For example, green phosphorescent emitters such as $Ir(ppy)_3$, blue phosphorescent emitters such as bis (3,5-difluoro-2-(2-carboxypyridyl) iridium (III) (Fkrpic), bis(2,4-difluorophenylpyridinate)-tetrakis(1-pyrazolyl) borate iridium (III) (FTr6); red phosphorescent emitters such as bis (2-benzo[b]thiophene-2-yl-pyridine) (acetylacetonate) iridium (III) ($Btp_2Ir(acac)$), a compound represented by the formula (EMD-1), and the like can be used.

The content of the phosphorescent luminescent material is preferably in the range of 1 to 30 weight percent with respect to the entire luminous layer to avoid concentration quenching.

As the host material in this case, a carbazole derivative such as 4, 4'-di(N-carbazolyl) biphenyl (hereinafter referred to as CBP), TCTA, mCP or the like can be used as the host material for hole injection/transportation together with either or both of the heterocyclic compound having a fused ring structure represented by the general formula (2) and the heterocyclic compound having a fused ring structure represented by the general formula (3). As an electron-transporting host material, p-bis(triphenylsilyl) benzene (hereinafter referred to as UGH2), 2, 2', 2"-(1, 3, 5-phenylene)-tris(1-phenyl-1H-benzimidazole) (hereinafter referred to as TPBI), or the like can be used, and as a result, a high-performance organic EL element can be manufactured.

As the luminous material, it is also possible to use a material that emits delayed fluorescence, such as 2-biphenyl-4, 6-bis(12-phenylindolo[2, 3-a]carbazole-11-yl)-1, 3, 5-triazine (PIC-TRZ); 2, 4-bis(f3-(9H-carbazole-9-yl)-6phenyl-1, 3, 5-triazine (CC2TA); 2, 4, 6-tri(4-(10H-phenoxazine-10H-yl)phenyl)-1, 3, 5-triazine (PXZ-TRZ); 2, 4, 5, 6-tetra(9H-carbazole-9-yl) isophthalonitrile (4CyIPN), and carbazolyldicyanobenzene (CDCB) derivatives (for example, see Non-Patent Document 5).

As the luminous layer, a single layer formed of these materials alone or a single layer formed by mixing two or more materials may be used. The luminous layer may be formed by laminating layers formed of the materials alone, by laminating layers formed by mixing the materials, or by laminating the layers formed by mixing the materials with the layers formed of these materials alone.

These luminous materials may be formed into a thin film by a vapor deposition method, or may be formed into a thin film by a known method such as a spin coating method or an ink jet method in addition to the vapor deposition method. The doping of the phosphorescent material into the host material is preferably performed by co-deposition.

Compound Represented by General Formula (2)

The heterocyclic compound having a fused ring structure represented by the general formula (2) is a compound in which an indane skeleton is bonded to a five-membered ring of an indole skeleton. $A_1$ bonded to the nitrogen atom of the indole skeleton represents a bivalent group of a substituted or unsubstituted aromatic hydrocarbon, a bivalent group of a substituted or unsubstituted aromatic heterocyclic ring, a bivalent group of a substituted or unsubstituted fused polycyclic aromatic ring, or a single bond; and $Ar_7$ represents a substituted or unsubstituted aromatic hydrocarbon group, a substituted or unsubstituted aromatic heterocyclic group, or a substituted or unsubstituted fused polycyclic aromatic group. Therefore, the organic EL element of the present embodiment having a luminous layer containing a heterocyclic compound having a fused ring structure represented by the general formula (2) has excellent light-emitting efficiency.

Examples of "substituted or unsubstituted aromatic hydrocarbons", "substituted or unsubstituted aromatic heterocycles", or "substituted or unsubstituted fused polycyclic aromatic" in the "bivalent group of a substituted or unsubstituted aromatic hydrocarbon", the "bivalent group of a substituted or unsubstituted aromatic heterocyclic ring", or the "bivalent group of a substituted or unsubstituted fused polycyclic aromatic ring" represented by $A_1$ in the general formula (2) include benzene, biphenyl, terphenyl, tetrakisphenyl, styrene, naphthalene, anthracene, acenaphthalene, fluorene, phenanthrene, indan, pyrene, pyrene, triphenylene, pyridine, pyrimidine, triazine, pyrrole, furan, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, and acridine.

The "bivalent group of a substituted or unsubstituted aromatic hydrocarbon", the "bivalent group of a substituted or unsubstituted aromatic heterocyclic ring", or the "bivalent group of a substituted or unsubstituted fused polycyclic aromatic ring" represented by $A_1$ in the general formula (2) represents a bivalent group obtained by removing two hydrogen atoms from the aforementioned "aromatic hydrocarbon", "aromatic heterocyclic ring", or "fused polycyclic aromatic ring".

The divalent group may have a substituent, and examples of the substituent include

- a deuterium atom, a cyano group, and a nitro group;
- a halogen atom such as a fluorine, chlorine, bromine, and iodine atom;
- a linear or branched alkyl group having 1 to 6 carbon atoms, such as a methyl, ethyl, n-propyl, isopropyl, n-butyl, isobutyl, tert-butyl, n-pentyl, isopentyl, neopentyl, n-hexyl, and the like;
- a linear or branched alkyloxy group having 1 to 6 carbon atoms, such as a methyloxy, ethyloxy, and propyloxy group;
- an alkenyl group such as a vinyl and an allyl group;
- an aryloxy group, such as a phenyloxy and a tolyloxy group;
- an arylalkyloxy group such as a benzyloxy group and a phenethyloxy group;
- an aromatic hydrocarbon group or fused polycyclic aromatic group such as a phenyl, biphenylyl, terphenylyl, naphthyl, anthracenyl, phenanthryl, fluorenyl, indenyl, pyrenyl, perylenyl, fluoranthenyl, triphenylenyl;
- an aromatic heterocyclic group such as a pyridyl, pyrimidinyl, triazinyl, thienyl, furyl, pyrrolyl, quinolyl, isoquinolyl, benzofuranyl, benzothienyl, indolyl, carbazolyl, benzotriazolyl, benzoxazolyl, benzothiazolyl, quinoxalyl, benzimidazolyl, pyrazolyl, dibenzofuranyl, dibenzothienyl, and carbolinyl;
- an arylvinyl group such as a styryl group and naphthylvinyl group; and
- an acyl group such as an acetyl and benzoyl group.

These substituents may be further substituted by the exemplified substituents. Further, these substituents may be bonded to each other via a single bond, a substituted or unsubstituted methylene group, an oxygen atom or a sulfur atom to form a ring.

Specifically, examples of "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_7$ in the general formula (2), include phenyl group, biphenylyl group, terphenylyl group, naphthyl group, anthryl group, phenanthryl group, fluorenyl group, indenyl group, pyrenyl group, perylenyl group, fluoranthenyl group, triphenylenyl group, pyridyl group, pyrimidinyl group, triazinyl group, furyl group, pyrrolyl group, thienyl group, quinolyl group, isoquinolyl group, benzofuranyl group, benzothienyl group, indolyl group, carbazolyl group, benzoxazolyl, benzothiazolyl, quinoxalyl, benzimidazolyl, pyrazolyl, dibenzofuranyl, naphthyridinyl, phenanthrolinyl, acridinyl, dibenzothienyl, and carbolinyl.

These groups may have a substituent, and the substituents may have the same means as the "substituent" in the "substituted aromatic hydrocarbon group", the "substituted aromatic heterocyclic group", or the "substituted fused polycyclic aromatic group" represented by $A_1$ in the general formula (2), and the possible embodiments thereof may be used.

Examples of the "linear or branched alkyl group having 1 to 6 carbon atoms", "cycloalkyl group having 5 to 10 carbon atoms" or "linear or branched alkenyl group having 2 to 6 carbon atoms" in "linear or branched alkyl group having 1 to 6 carbon atoms which may have a substituent", "cycloalkyl group having 5 to 10 carbon atoms which may have a substituent", or "linear or branched alkyl group having 1 to 6 carbon atoms which may have a substituent" represented by $R_5$ to $R_{12}$ in the general formula (2), include a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, and a 2-butenyl group. These groups may be bonded to each other via a single bond, a substituted or unsubstituted methylene group, an oxygen atom or a sulfur atom to form a ring; or these groups ($R_5$-$R_{12}$) may be bonded to each other, with the benzene ring to which these groups ($R_5$-$R_{12}$) are directly bonded, via a single bond, a substituted or unsubstituted methylene group, an oxygen atom, a sulfur atom or a monoarylamino group to form a ring.

Examples of the "substituent" in the "linear or branched alkyl group having 1 to 6 carbon atoms having a substituent", the "cycloalkyl group having 5 to 10 carbon atoms having a substituent", or the "linear or branched alkenyl group having 2 to 6 carbon atoms having a substituent" represented by $R_5$ to $R_{12}$ in the general formula (1) include

- a deuterium atom, a cyano group, and a nitro group;
- a halogen atom such as a fluorine, chlorine, bromine, and iodine atom;
- a linear or branched alkyloxy group having 1 to 6 carbon atoms, such as a methyloxy, ethyloxy, and propyloxy group;
- an alkenyl group such as a vinyl and an allyl group;
- an aralkyl group, such as a benzyl group, a naphthylmethyl group, or a phenethyl group;
- an aryloxy group, such as a phenyloxy and a tolyloxy group;
- an arylalkyloxy group such as a benzyloxy group and a phenethyloxy group;
- an aromatic hydrocarbon group or fused polycyclic aromatic group such as a phenyl, biphenylyl, terphenylyl, naphthyl, anthracenyl, phenanthryl, fluorenyl, indenyl, pyrenyl, perylenyl, fluoranthenyl, and triphenylenyl;

an aromatic heterocyclic group such as a pyridyl, pyrimidinyl, triazinyl, furyl, thienyl, pyrrolyl, quinolyl, isoquinolyl, benzofuranyl, benzothienyl, indolyl, carbazolyl, benzoxazolyl, benzotriazolyl, benzothiazolyl, quinoxalyl, benzimidazolyl, pyrazolyl, dibenzofuranyl, dibenzothienyl, and carbolinyl;

a disubstituted amino group substituted with an aromatic hydrocarbon group or a fused polycyclic aromatic group such as a diphenylamino group and dinaphthylamino group;

a disubstituted amino group substituted with an aromatic heterocyclic group such as a dipyridylamino group and a dithienylamino group; and a disubstituted amino group substituted with a substituent selected from an alkyl group, an aromatic hydrocarbon group, a fused polycyclic aromatic group, an aralkyl group, an aromatic heterocyclic group, and an alkenyl group.

These groups may be bonded to each other via a single bond, a substituted or unsubstituted methylene group, an oxygen atom or a sulfur atom to form a ring.

Examples of "linear or branched alkyloxy group having 1 to 6 carbon atoms" or "cycloalkyloxy group having 5 to 10 carbon atoms" in the "linear or branched alkyloxy group having 1 to 6 carbon atoms which may have a substituent" or the "cycloalkyloxy group having 5 to 10 carbon atoms which may have a substituent" represented by $R_5$ to $R_{12}$ in the general formula (2), include a methyloxy group, ethyloxy group, n-propyloxy group, isopropyloxy group, n-butyloxy group, tert-butyloxy group, n-pentyloxy group, n-hexyloxy group, cyclopentyloxy group, cycloheptyloxy group, cyclohexyloxy group, heptyloxy group, cyclooctyloxy group, a 1-adamantyloxy group and a 2-adamantyloxy group. These groups may be bonded to each other via a single bond, a substituted or unsubstituted methylene group, an oxygen atom, a sulfur atom or a monoarylamino group to form a ring; or these groups ($R_5$-$R_{12}$) may be bonded to each other, with the benzene ring to which these groups ($R_5$-$R_{12}$) are directly bonded, via a single bond, a substituted or unsubstituted methylene group, an oxygen atom, a sulfur atom or a monoarylamino group to form a ring.

These groups may also have a substituent, and the substituents may have the same means as the "substituent" in the "linear or branched alkyl group having 1 to 6 carbon atoms having a substituent", the "cycloalkyl group having 5 to 10 carbon atoms having a substituent", or the "linear or branched alkenyl group having 2 to 6 carbon atoms having a substituent" represented by $R_5$ to $R_{12}$ in the general formula (2), and the possible embodiments thereof may be used.

The "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $R_5$ to $R_{12}$ in the general formula (2) have the same means as the "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_7$ in the general formula (2). These groups may be bonded to each other via a single bond, a substituted or unsubstituted methylene group, an oxygen atom or a sulfur atom to form a ring; or these groups ($R_5$-$R_{12}$) may be bonded to each other, with the benzene ring to which these groups ($R_5$-$R_{12}$) are directly bonded, via a single bond, a substituted or unsubstituted methylene group, an oxygen atom, a sulfur atom or a monoarylamino group to form a ring.

These groups may have a substituent, and the substituents may have the same means as the "substituent" in the "substituted aromatic hydrocarbon group", the "substituted aromatic heterocyclic group", or the "substituted fused polycyclic aromatic group" represented by $A_1$ in the general formula (2), and the possible embodiments thereof may be used.

Examples of the "aryloxy group" in the "substituted or unsubstituted aryloxy group" represented by $R_5$ to $R_{12}$ in the general formula (2) include a phenyloxy group, a tolyloxy group, a biphenylyloxy group, a terphenylyloxy group, a naphthyloxy group, an anthryloxy group, a phenanthryloxy group, a fluorenyloxy group, an indenyloxy group, a pyrenyloxy group, and a perylenyloxy group. These groups may be bonded to each other via a single bond, a substituted or unsubstituted methylene group, an oxygen atom or a sulfur atom to form a ring; or these groups ($R_5$-$R_{12}$) may be bonded to each other, with the benzene ring to which these groups ($R_5$-$R_{12}$) are directly bonded, via a single bond, a substituted or unsubstituted methylene group, an oxygen atom, a sulfur atom or a monoarylamino group to form a ring.

These groups may have a substituent, and the substituents may have the same means as the "substituent" in the "substituted aromatic hydrocarbon group", the "substituted aromatic heterocyclic group", or the "substituted fused polycyclic aromatic group" represented by $A_1$ in the general formula (2), and the possible embodiments thereof may be used.

The "aromatic hydrocarbon group", "aromatic heterocyclic group" or "fused polycyclic aromatic group" in "disubstituted amino group substituted with a group selected from aromatic hydrocarbon group, aromatic heterocyclic group or fused polycyclic aromatic group" represented by $R_5$ to $R_{12}$ in the general formula (2) may have the same means as "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_7$ in the general formula (2).

These groups may have a substituent, and the substituents may have the same means as the "substituent" in the "substituted aromatic hydrocarbon group", the "substituted aromatic heterocyclic group", or the "substituted fused polycyclic aromatic group" represented by $A_1$ in the general formula (2), and the possible embodiments thereof may be used.

The "disubstituted amino group substituted with a group selected from aromatic hydrocarbon group, aromatic heterocyclic group or fused polycyclic aromatic group" represented by $R_5$ to $R_{12}$ in the general formula (2) may be bonded to each other via the "aromatic hydrocarbon group", "the aromatic heterocyclic group", or the "fused polycyclic aromatic group" which is included in these groups ($R_5$ to $R_2$), as well as via a single bond, a substituted or unsubstituted methylene group, an oxygen atom or a sulfur atom to form a ring; or these groups ($R_5$-$R_{12}$) may be bonded to each other, with the benzene ring to which these groups ($R_5$-$R_{12}$) are directly bonded, via the "aromatic hydrocarbon group", "the aromatic heterocyclic group" or the "fused polycyclic aromatic group" which is included in these groups ($R_5$ to $R_{12}$), as well as via a single bond, a substituted or unsubstituted methylene group, an oxygen atom, a sulfur atom or a monoarylamino group to form a ring.

The "linear or branched alkyl group having 1 to 6 carbon atoms" in "a linear or branched alkyl group having 1 to 6 carbon atoms which may have a substituent" represented by $R_{13}$ or $R_{14}$ in the general formula (2) may have the same means as the "linear or branched alkyl group having 1 to 6 carbon atoms" in "a linear or branched alkyl group having 1 to 6 carbon atoms which may have a substituent" represented by $R_5$ to $R_{12}$ in the general formula (2). These groups may be bonded to each other via a single bond, a substituted or unsubstituted methylene group, an oxygen atom or a sulfur atom to form a ring.

These groups may have a substituent, and the substituents may have the same means as the "substituent" in the "linear or branched alkyl group having 1 to 6 carbon atoms having a substituent", the "cycloalkyl group having 5 to 10 carbon atoms having a substituent", or the "linear or branched alkenyl group having 2 to 6 carbon atoms having a substituent" represented by $R_5$ to $R_{12}$ in the general formula (2).

The "aromatic hydrocarbon group", "aromatic heterocyclic group" or "fused polycyclic aromatic group" in "disubstituted amino group substituted with a group selected from aromatic hydrocarbon group, aromatic heterocyclic group or fused polycyclic aromatic group" represented by $R_{13}$ or $R_{14}$ in the general formula (2) may have the same means as "aromatic hydrocarbon group", "aromatic heterocyclic group", or "fused polycyclic aromatic group" in "substituted or unsubstituted aromatic hydrocarbon group", "substituted or unsubstituted aromatic heterocyclic group", or "substituted or unsubstituted fused polycyclic aromatic group" represented by $Ar_7$ in the general formula (2). These groups may be bonded to each other via a single bond, a substituted or unsubstituted methylene group, an oxygen atom or a sulfur atom to form a ring.

These groups may have a substituent, and the substituents may have the same means as the "substituent" in the "substituted aromatic hydrocarbon group", the "substituted aromatic heterocyclic group", or the "substituted fused polycyclic aromatic group" represented by $A_1$ in the general formula (2) and the possible embodiments thereof may be used.

The "monoarylamino group" is used as the linking group in the general formula (2). The "aryl group" in the "monoarylamino group" may have the same means as the "aromatic hydrocarbon group", the "aromatic heterocyclic group", or the "fused polycyclic aromatic group", the "substituted or unsubstituted aromatic hydrocarbon group", the "substituted or unsubstituted aromatic heterocyclic group", or the "substituted or unsubstituted fused polycyclic aromatic group" represented by $Ar_7$ in the general formula (2).

These groups may have a substituent, and the substituents may have the same means as the "substituent" in the "substituted aromatic hydrocarbon group", the "substituted aromatic heterocyclic group", or the "substituted fused polycyclic aromatic group" represented by $A_1$ in the general formula (2) and the possible embodiments thereof may be used.

$A_1$ in the general formula (2) preferably represents a "bivalent group of substituted or unsubstituted aromatic hydrocarbons", a "bivalent group of substituted or unsubstituted fused polycyclic aromatic hydrocarbons", or a single bond. $A_1$ more preferably represents a bivalent group obtained by removing two hydrogen atoms from benzene, biphenyl, or naphthalene; or a single bond; and $A_1$ even more preferably represents a bivalent group obtained by removing two hydrogen atoms from benzene, or a single bond.

$Ar_7$ in the general formula (2) preferably represents phenyl, biphenylyl, naphthyl, or "aromatic heterocyclic group"; and in the "aromatic heterocyclic group", triazinyl, quinazolinyl, naphthopyrimidinyl, benzimidazolyl, pyridopyrimidinyl, naphthyridinyl, pyridyl, quinolyl, or isoquinolyl is particularly preferable.

In the general formula (2), it is preferable that two adjacent groups of $R_5$ to $R_8$ are "a linear or branched alkenyl group having 2 to 6 carbon atoms", "an aromatic hydrocarbon group", "an aromatic heterocyclic group" or "a fused polycyclic aromatic group"; and the two adjacent groups ($R_5$ to $R_8$) may be bonded to each other via a single bond to form a fused ring together with a benzene ring to which $R_5$ to $R_8$ may be bonded.

In this case, the "linear or branched alkenyl group having 2 to 6 carbon atoms", the "aromatic hydrocarbon group", the "aromatic heterocyclic group", or the "fused polycyclic aromatic group" is preferably a vinyl group or a phenyl group; and an embodiment in which a naphthalene ring, a phenanthrene ring, or a triphenylene ring is formed by bonding $R_5$-$R_8$ to each other and together with a benzene ring to which $R_5$-$R_8$ may be bonded is preferable.

In the general formula (2), it is preferable that any one of $R_5$-$R_8$ is an "aromatic hydrocarbon group", an "aromatic heterocyclic group", or a "fused polycyclic aromatic group", and $R_5$-$R_8$ is bonded to each other, together with a benzene ring to which $R_5$-$R_8$ is bonded, via a linking group such as a substituted or unsubstituted methylene group, an oxygen atom, a sulfur atom or a monoarylamino group to form a ring.

The "aromatic hydrocarbon group", "aromatic heterocyclic group" or "fused polycyclic aromatic group" in this case is preferably a phenyl group, indenyl group, indolyl group, benzofuranyl group and benzothienyl group; and an embodiment in which a fluorene ring, carbazole ring, dibenzofuran ring, dibenzothiophene ring, indenoindole ring, indenobenzofuran ring, indenobenzothiophene ring, benzofuroindole ring, benzothienoindole ring, indoloindole ring are formed by bonding $R_5$-$R_8$ to each other, and together with a benzene ring to which $R_5$ to $R_8$ may be bonded is preferable.

As described above, among heterocyclic compounds having a fused ring structure represented by the general formula (2), as an embodiment in which $R_5$ to $R_8$ may be bonded to each other to form a ring, or as an embodiment in which $R_5$ to $R_8$ may be bonded to each other and together with a benzene ring to which $R_5$ to $R_8$ may be bonded to form a ring, an embodiment represented by the general formulae (2a), (2b), (2c), (2d) or (2e) is preferably used.

[Chemical Formula 18]

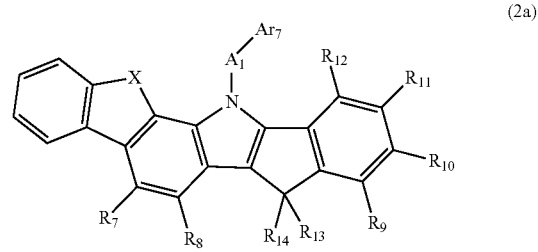

(2a)

-continued (2b)
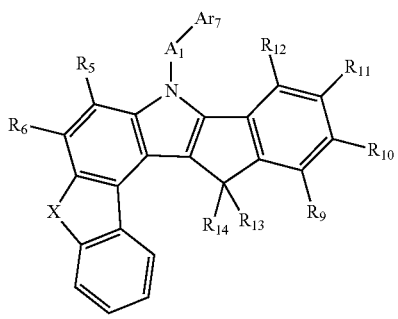

(2c)
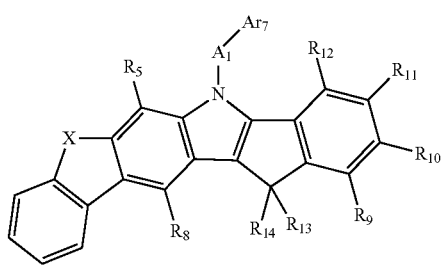

(2d)
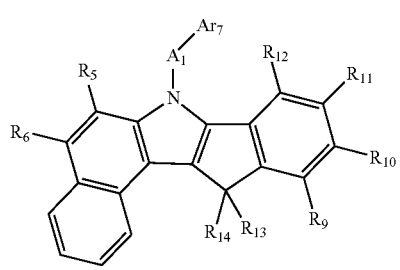

(2e)
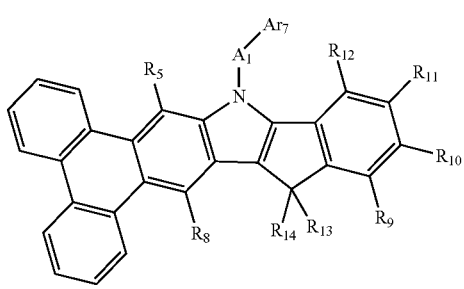

In the formulae (2a), (2b), and (2c), X represents a substituted or unsubstituted methylene group, an oxygen atom, a sulfur atom or a monoarylamino group. In the formulae (2a), (2b), (2c), (2d), or (2e); $A_1$, $Ar_7$, $R_5$-$R_{12}$, $R_{13}$ and $R_{14}$ represent the same meanings as shown in the formula (2).

Among the heterocyclic compounds represented by the general formulae (2a), (2b), (2c), (2d), or (2e), a heterocyclic compound represented by the general formula (2a) is preferable. More preferably, X in the heterocyclic compound represented by the general formula (2a) is a sulfur atom.

In the general formula (2), it is preferable that two of adjacent $R_9$ to $R_{12}$ or all of $R_9$ to $R_{12}$ are a vinyl group, and the two adjacent vinyl groups may be bonded to each other via a single bond to form a fused ring. That is, it is also preferable to form a naphthalene ring or a phenanthrene ring by bonding them and together with a benzene ring to which $R_9$ to $R_{12}$ are bonded.

$R_{13}$ and $R_{14}$ in the general formula (2) are preferably "a linear or branched alkyl group having 1 to 6 carbon atoms", and are more preferably a methyl group.

Among the heterocyclic compounds having a fused ring structure represented by the general formula (2) and suitably used for the organic EL element of the present embodiment, compounds represented by the formulae (2-1) to (2-15) are shown below as specific examples of preferable compounds. The compounds represented by the formulae (2-1) to (2-7) and (2-8) to (2-15) are each a fused polycyclic aromatic in which $A_1$ in the general formula (2) is a single bond and $Ar_7$ is a pyrimidine ring.

The compound represented by the general formula (2) is not limited to the compounds represented by the formulae (2-1) to (2-15).

[Chemical Formula 19]

(2-1)
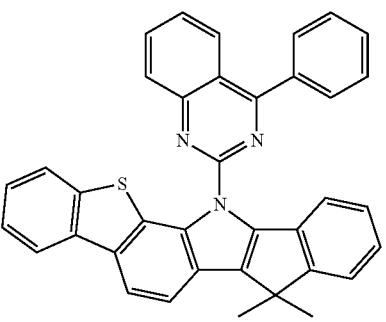

(2-2)
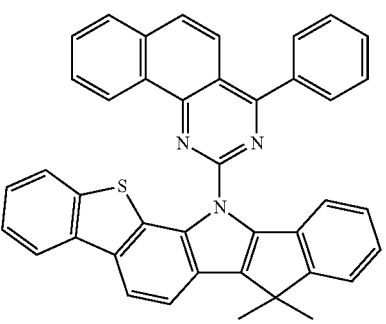

(2-3)
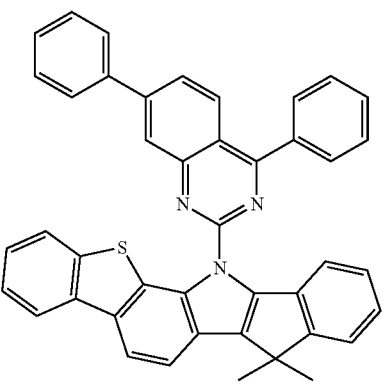

(2-4)
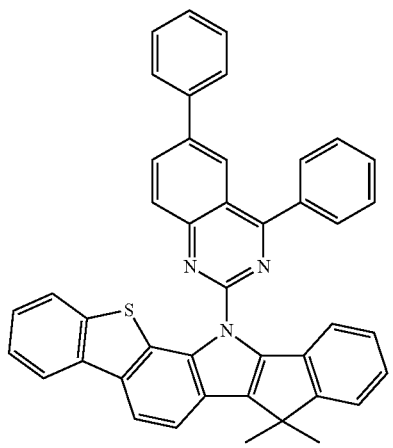
(2-5)
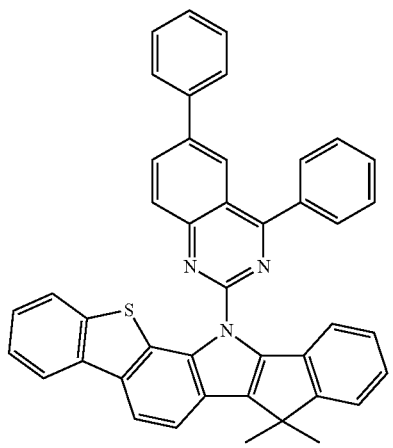
(2-6)
[Chemical Formula 20]
(2-7)
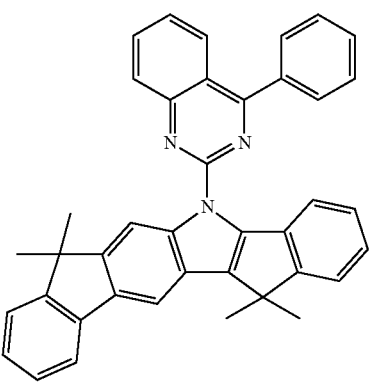
(2-8)
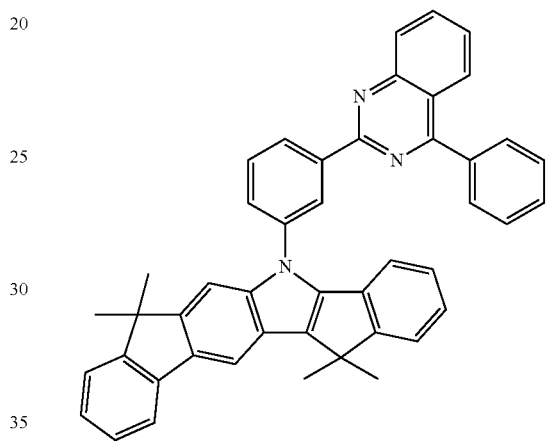
(2-9)
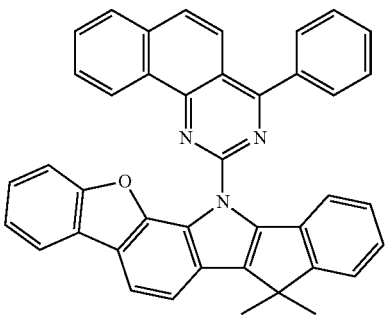
(2-10)
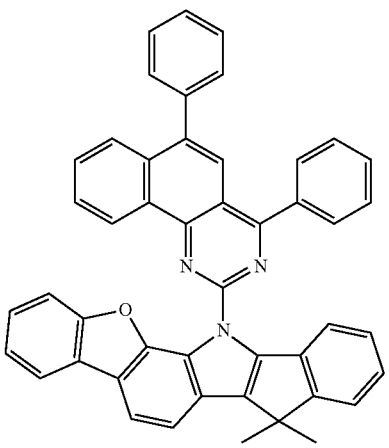

(2-11)
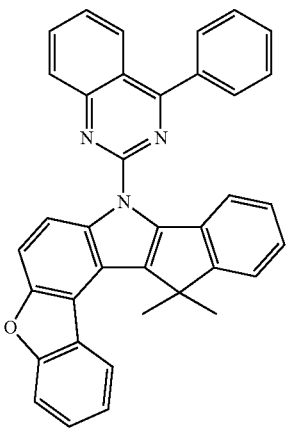

(2-12)
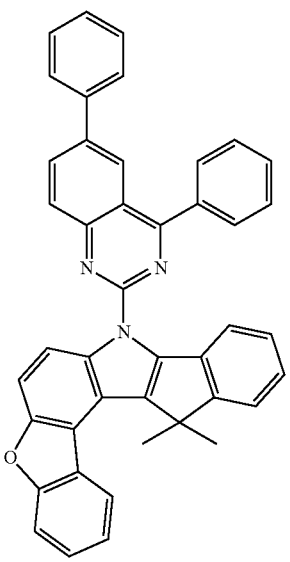

(2-13)
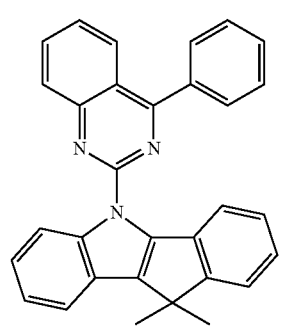

(2-14)
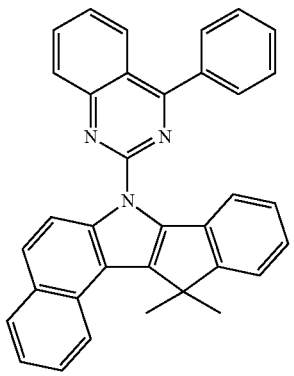

(2-15)
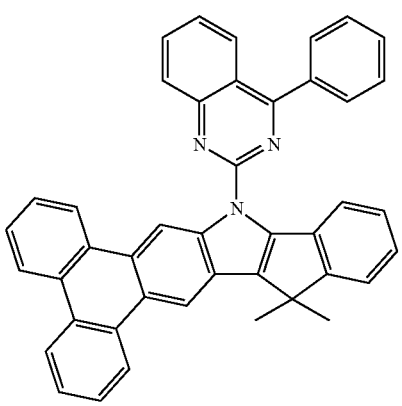

The heterocyclic compound having a fused ring structure represented by the general formula (2) can be synthesized, for example, in accordance with a known method (see, for example, Patent Document 3).

Compound Represented by General Formula (3)

The heterocyclic compound having a fused ring structure represented by the general formula (3) has a carbazole skeleton, wherein $A_2$ bonded to the nitrogen atom of the carbazole skeleton represents a bivalent group of a substituted or unsubstituted aromatic hydrocarbon, a bivalent group of a substituted or unsubstituted aromatic heterocyclic ring, a bivalent group of a substituted or unsubstituted fused polycyclic aromatic ring, or a single bond; and $Ar_8$ represents a substituted or unsubstituted aromatic hydrocarbon group, a substituted or unsubstituted aromatic heterocyclic group, or a substituted or unsubstituted fused polycyclic aromatic group. Therefore, the organic EL element of the present embodiment having a luminous layer containing a heterocyclic compound having a fused ring structure represented by the general formula (3) has excellent light-emitting efficiency.

The "bivalent group of substituted or unsubstituted aromatic hydrocarbon", "bivalent group of substituted or unsubstituted aromatic heterocyclic ring", or "bivalent group of substituted or unsubstituted fused polycyclic aromatic" represented by $A_2$ in the general formula (3) may have the same means as the "bivalent group of substituted or unsubstituted aromatic hydrocarbon", "bivalent group of substituted or unsubstituted aromatic heterocyclic ring", or "bivalent group of substituted or unsubstituted fused polycyclic aromatic" represented by $A_1$ in the general formula (2), and the possible embodiments thereof may be used.

The "substituted or unsubstituted aromatic hydrocarbon group", "substituted or unsubstituted aromatic heterocyclic group", or "substituted or unsubstituted fused polycyclic aromatic group" represented by Ar₈ in the general formula (3) may have the same means as the "substituted or unsubstituted aromatic hydrocarbon group", "substituted or unsubstituted aromatic heterocyclic group", or "substituted or unsubstituted fused polycyclic aromatic group" represented by Ar₇ in the general formula (2), and the possible embodiments thereof may be used.

The "linear or branched alkyl group having 1 to 6 carbon atoms which may have a substituent", "a cycloalkyl group having 5 to 10 carbon atoms which may have a substituent", or "a linear or branched alkenyl group having 2 to 6 carbon atoms which may have a substituent" represented by $R_{18}$ to $R_{22}$ in the general formula (3) is the same as the "linear or branched alkyl group having 1 to 6 carbon atoms which may have a substituent", "a cycloalkyl group having 5 to 10 carbon atoms which may have a substituent", or "a linear or branched alkenyl group having 2 to 6 carbon atoms which may have a substituent" represented by $R_5$ to $R_{12}$ in the general formula (2), and the possible embodiments thereof may be used.

The "linear or branched alkyloxy group having 1 to 6 carbon atoms which may have a substituent" or "cycloalkyloxy group having 5 to 10 carbon atoms which may have a substituent" represented by $R_{18}$ to $R_{22}$ in the general formula (3) may have the same means as the "linear or branched alkyloxy group having 1 to 6 carbon atoms which may have a substituent" or "cycloalkyloxy group having 5 to 10 carbon atoms which may have a substituent" represented by $R_5$ to $R_{12}$ in the general formula (2), and the possible embodiments thereof may be used.

The "substituted or unsubstituted aromatic hydrocarbon group", "substituted or unsubstituted aromatic heterocyclic group", or "substituted or unsubstituted fused polycyclic aromatic group" represented by $R_{15}$ to $R_{22}$ in the general formula (3) may have the same means as the "substituted or unsubstituted aromatic hydrocarbon group", "substituted or unsubstituted aromatic heterocyclic group", or "substituted or unsubstituted fused polycyclic aromatic group" represented by $R_5$ to $R_{12}$ in the general formula (2), and the possible embodiments thereof may be used.

The "substituted or unsubstituted aryloxy group" represented by $R_{15}$ to $R_{22}$ in the general formula (3) may have the same means as the "substituted or unsubstituted aryloxy group" represented by $R_5$ to $R_{12}$ in the general formula (2), and the same can be cited as possible embodiments, and the possible embodiments thereof may be used.

The "disubstituted amino group substituted with a group selected from aromatic hydrocarbon group, aromatic heterocyclic group, or fused polycyclic aromatic group" represented by $R_{15}$ to $R_{22}$ in the general formula (3) may have the same means as the "disubstituted amino group substituted with a group selected from aromatic hydrocarbon group, aromatic heterocyclic group, or fused polycyclic aromatic group" represented by $R_5$ to $R_{12}$ in the general formula (2), and the possible embodiments thereof may be used.

The "monoarylamino group" or the like is used as the linking group in the general formula (3). The "aryl group" in the "monoarylamino group" may have the same means as the "aryl group" in the "monoarylamino group" in the general formula (2), and the possible embodiments thereof may be used.

$A_2$ in the general formula (3) preferably represents a "bivalent group of substituted or unsubstituted aromatic hydrocarbons", a "bivalent group of substituted or unsubstituted fused polycyclic aromatic hydrocarbons", or a single bond; and $A_1$ more preferably represents a bivalent group obtained by removing two hydrogen atoms from benzene, biphenyl, or naphthalene; or a single bond; and $A_1$ even more preferably represents a bivalent group obtained by removing two hydrogen atoms from benzene, or a single bond.

Ar₈ in the general formula (3) preferably represents phenyl, biphenylyl, naphthyl, or "aromatic heterocyclic group"; and in the "aromatic heterocyclic group", triazinyl, quinazolinyl, naphthopyrimidinyl, benzimidazolyl, pyridopyrimidinyl, naphthyridinyl, pyridyl, quinolyl, or isoquinolyl is particularly preferable.

In the general formula (3), it is preferable that two adjacent groups of $R_{15}$ to $R_{18}$ are "a linear or branched alkenyl group having 2 to 6 carbon atoms", "an aromatic hydrocarbon group", "an aromatic heterocyclic group", or "a fused polycyclic aromatic group"; and the two adjacent groups ($R_{15}$ to $R_{18}$) are bonded to each other via a single bond to form a fused ring together with a benzene ring to which $R_{15}$ to $R_{18}$ are bonded.

In this case, the "linear or branched alkenyl group having 2 to 6 carbon atoms", the "aromatic hydrocarbon group", the "aromatic heterocyclic group", or the "fused polycyclic aromatic group" is preferably a vinyl group or a phenyl group; and an embodiment in which a naphthalene ring, a phenanthrene ring, or a triphenylene ring is formed by bonding $R_{15}$ to $R_{18}$ to each other and together with a benzene ring to which $R_{15}$ to $R_{18}$ are bonded is preferable.

In the general formula (3), it is preferable that any one of $R_{15}$ to $R_{18}$ is an "aromatic hydrocarbon group", an "aromatic heterocyclic group", or a "fused polycyclic aromatic group", and $R_{15}$ to $R_{18}$ is bonded to each other, together with a benzene ring to which $R_{15}$ to $R_{18}$ is bonded, via a linking group such as a substituted or unsubstituted methylene group, an oxygen atom, a sulfur atom, or a monoarylamino group, to form a ring.

The "aromatic hydrocarbon group", "aromatic heterocyclic group", or "fused polycyclic aromatic group" in this case is preferably a phenyl group, indenyl group, indolyl group, benzofuranyl group, and benzothienyl group; and an embodiment in which a fluorene ring, carbazole ring, dibenzofuran ring, dibenzothiophene ring, indenoindole ring, indenobenzofuran ring, indenobenzothiophene ring, benzofuroindole ring, benzothienoindole ring, indoloindole ring are formed by bonding $R_{15}$ to $R_{18}$ to each other, and together with a benzene ring to which $R_{15}$ to $R_{18}$ are bonded is preferable.

As described above, $R_{15}$ to $R_{18}$ and the benzene ring to which $R_{15}$ to $R_{18}$ are bonded are preferably bonded to each other to form a ring represented by the following general formulae (3a-1), (3a-2), (3a-3), (3a-4), or (3b-1).

[Chemical Formula 21]

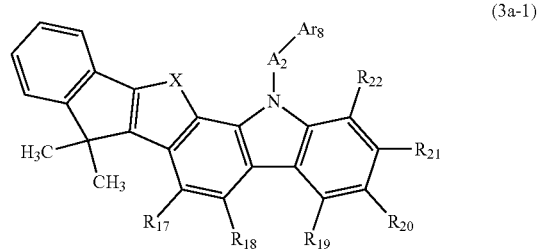

(3a-1)

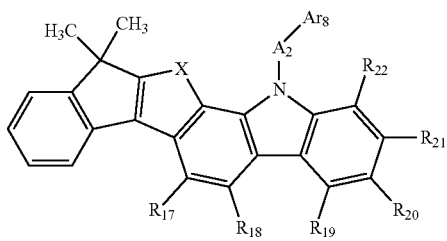
(3a-2)

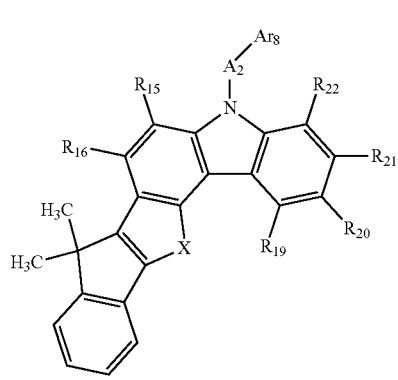
(3a-3)

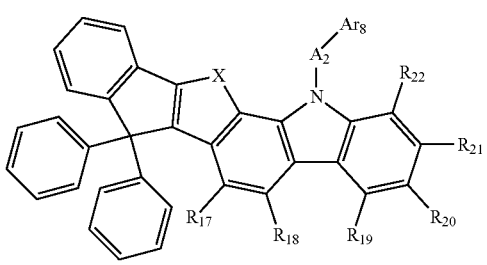
(3a-4)

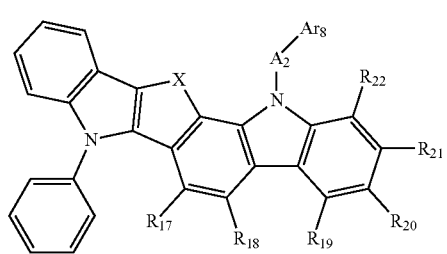
(3b-1)

In formulae (3a-1), (3a-2), (3a-3), (3a-4), or (3b-1), X represents a substituted or unsubstituted methylene group, an oxygen atom, a sulfur atom, or a monoarylamino group, and $A_2$, $Ar_8$, and $R_{15}$ to $R_{22}$ each represents the same meaning shown in the above general formula (3).

Among heterocyclic compounds represented by the general formulae (3a-1), (3a-2), (3a-3), (3a-4), or (3b-1), a heterocyclic compound represented by the general formula (3a-2) is preferable. More preferably, X in the heterocyclic compound represented by the general formula (3a-2) is a sulfur atom.

In the general formula (3), it is preferable that two of adjacent $R_{19}$ to $R_{22}$ or all of $R_{19}$ to $R_{22}$ are a vinyl group, and the two adjacent vinyl groups are bonded to each other via a single bond to form a fused ring. That is, it is also preferable to form a naphthalene ring or a phenanthrene ring by bonding these groups together with a benzene ring to which $R_{19}$ to $R_{22}$ are bonded.

In the general formula (3), any one of $R_{19}$ to $R_{22}$ is preferably an "aromatic hydrocarbon group," "aromatic heterocyclic group," or "fused polycyclic aromatic group". In this case, any one of $R_{19}$ to $R_{22}$ is preferably a group selected from a fluorenyl group, a carbazolyl group, a dibenzofuranyl group, or a dibenzothienyl group. More preferably, $R_{20}$ is a fluorenyl group, a carbazolyl group, a dibenzofuranyl group or a dibenzothienyl group; and $R_{19}$, $R_{21}$ and $R_{22}$ are hydrogen atoms.

Among the heterocyclic compounds having a fused ring structure represented by the general formula (3) and suitably used for the organic EL element of the present embodiment, compounds represented by the formulae (3-1) to (3-23) are shown below as specific examples of preferable compounds. Compounds represented by the formulae (3-1) to (3-3) (3-6) to (3-14), and (3-16) to (3-20) are each a fused polycyclic aromatic wherein $A_2$ in the general formula (3) is a single bond and $Ar_8$ is a pyrimidine ring.

The compound represented by the general formula (3) is not limited to the compounds represented by the formulae (3-1) to (3-23).

[Chemical Formula 22]

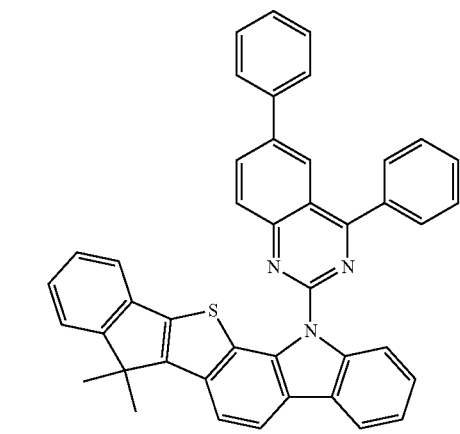
(3-1)

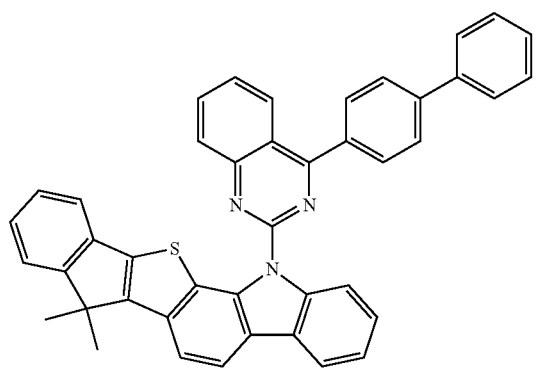
(3-2)

(3-3)
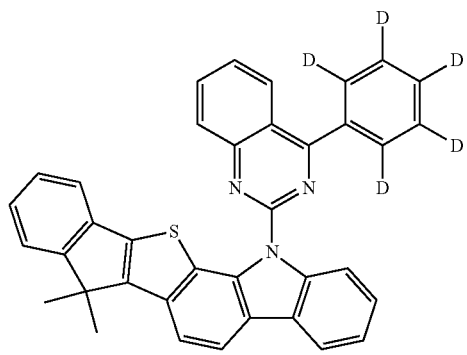
(3-4)
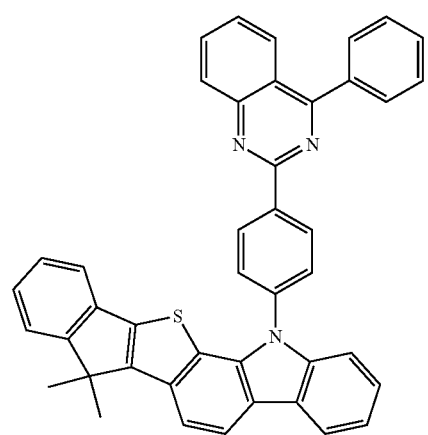
(3-5)
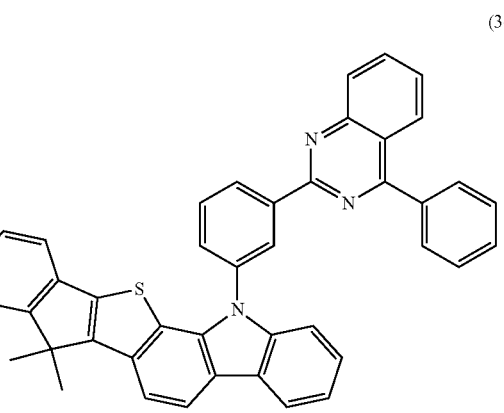
(3-6)
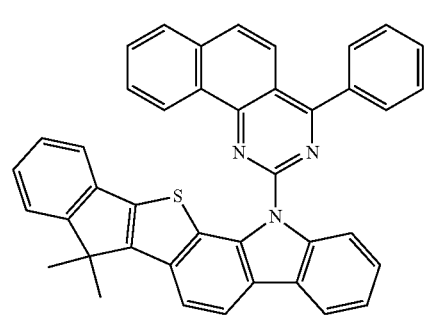
(3-7)
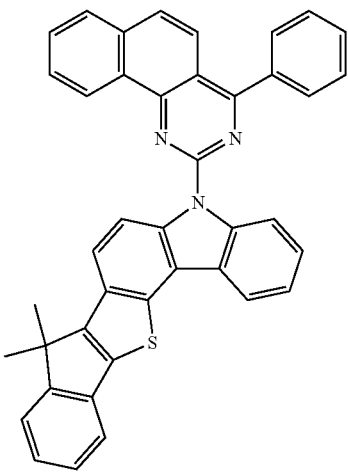
(3-8)
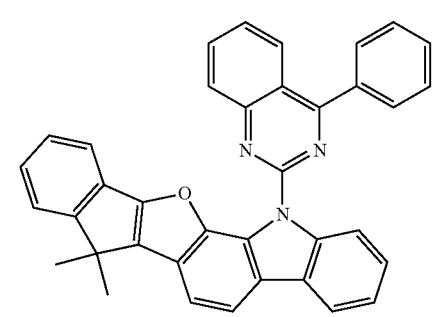
(3-9)
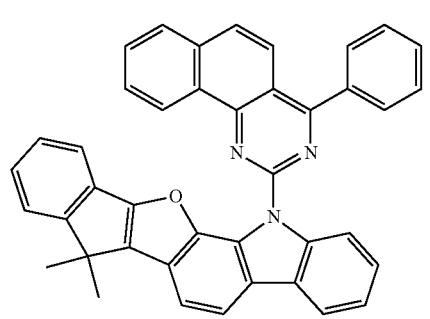
(3-10)
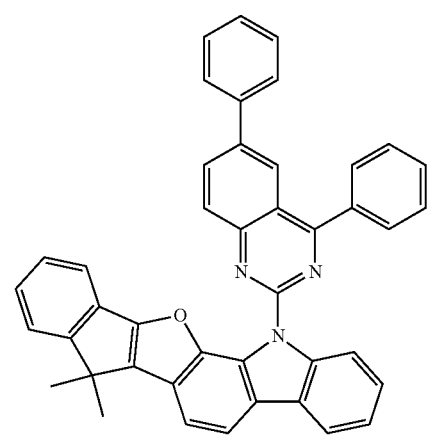

(3-11)
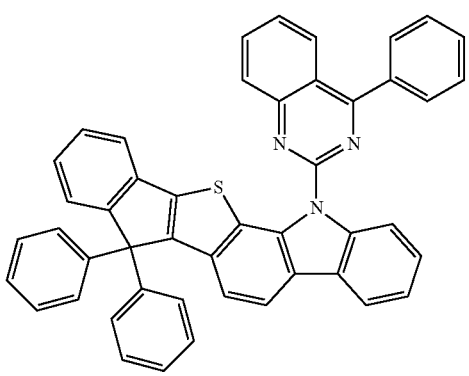
(3-12)
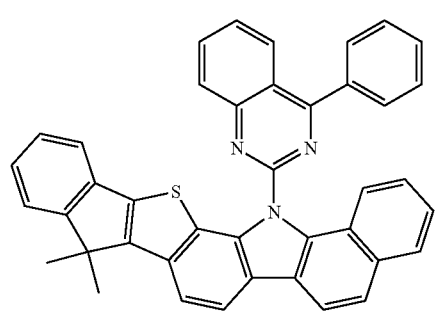
(In formula (3-3), D is deuterium.)
[Chemical Formula 23]
(3-13)
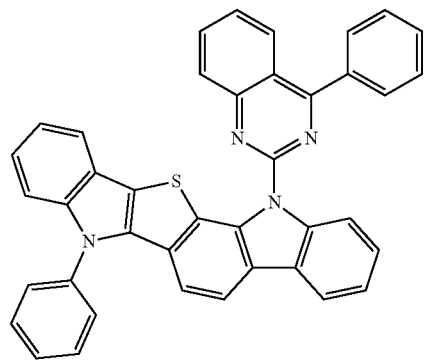
(3-14)
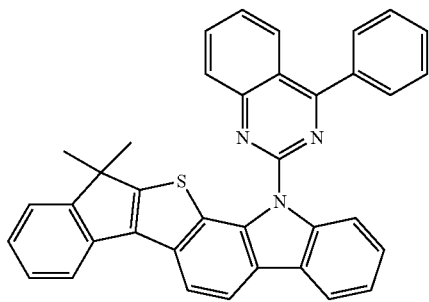
(3-15)
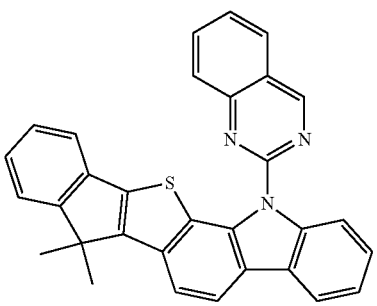
(3-16)
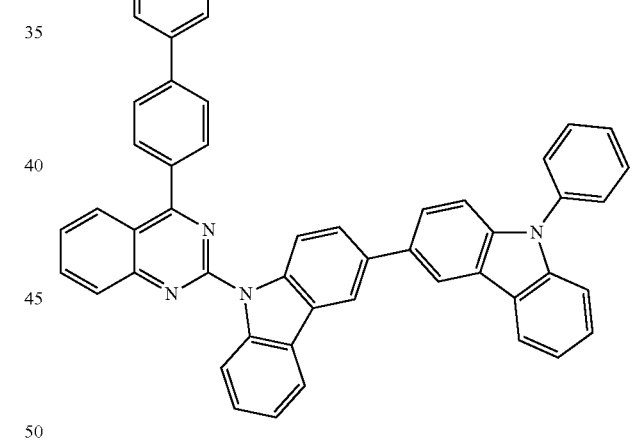
(3-17)
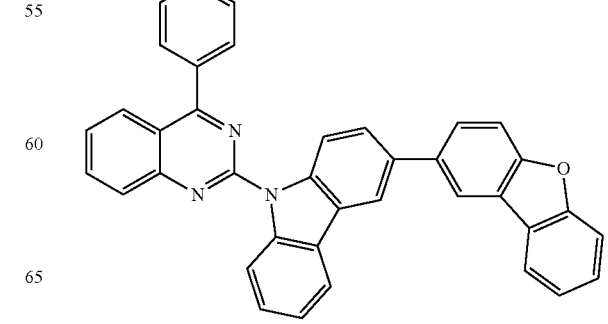

-continued (3-18)

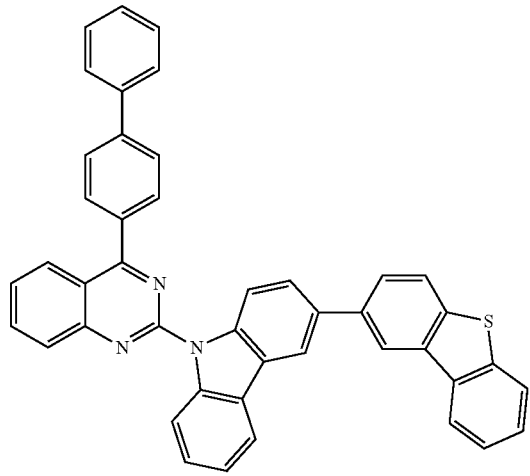

(3-19)

(3-20)

(3-21)

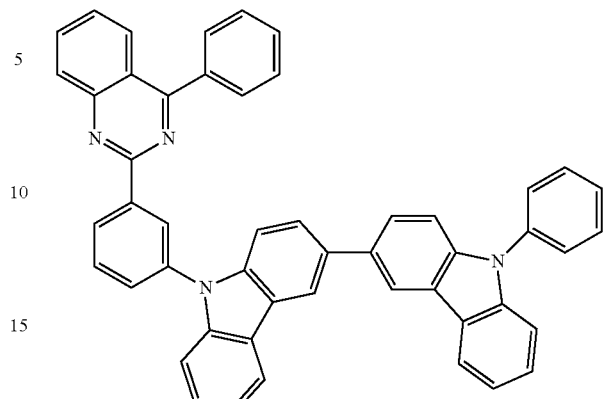

[Chemical Formula 24]

(3-22)

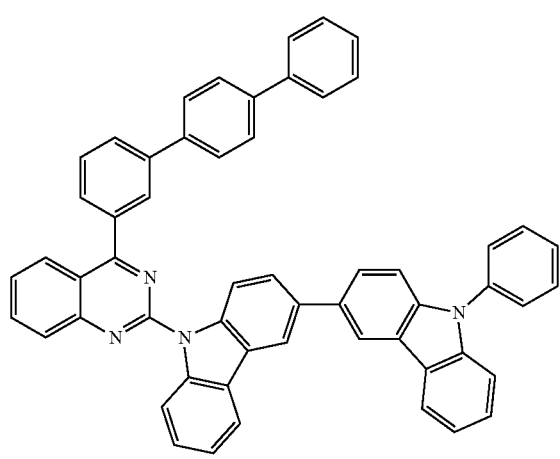

(3-23)

The heterocyclic compound having a fused ring structure represented by the general formula (3) can be synthesized by, for example, a known method (see, for example, Patent Document 3).

(Hole Blocking Layer)

As the material of the hole blocking layer of the organic EL element, a compound having a hole blocking function, such as a phenanthroline derivative such as bathocuproine (hereinafter abbreviated as BCP), a metal complex of a quinolinol derivative such as aluminum (III) bis(2-methyl-8-quinolinato)-4-phenylphenolate (hereinafter, referred to as BAlq), various rare earth complexes, triazole derivatives, triazine derivatives, pyrimidine derivatives, oxadiazole derivatives, and benzazole derivatives can be used. These materials may also serve as materials for the electron transport layer.

As the hole blocking layer, a single layer formed of these materials alone or a single layer formed by mixing two or more materials may be used. The hole blocking layer may be formed by laminating layers formed of the above materials alone, by laminating layers formed by mixing the materials, or by laminating the layers formed by mixing the materials with the layers formed of these materials alone.

These materials may be formed into a thin film by a vapor deposition method, or may be formed into a thin film by a known method such as a spin coating method or an ink jet method in addition to a vapor deposition method.

(Electron Transport Layer)

As the material of the electron transport layer of the organic EL element, in addition to metal complexes of quinolinol derivatives such as $Alp_3$ and BAlp, various metal complexes, triazole derivatives, triazine derivatives, pyrimidine derivatives, oxadiazole derivatives, pyridine derivatives, benzimidazole derivatives, benzazole derivatives, thiadiazole derivatives, anthracene derivatives, carbodiimide derivatives, quinoxaline derivatives, pyridoindole derivatives, phenanthroline derivatives, silole derivatives, or the like can be used.

The electron transport layer may be a single layer formed of these materials or a single layer formed by mixing two or more materials. The electron transport layer may be formed by laminating layers formed of the materials alone, by laminating layers formed by mixing the materials, or by laminating the layers formed by mixing the materials with the layers formed of these materials alone.

These materials may be formed into a thin film by a vapor deposition method, or may be formed into a thin film by a known method such as a spin coating method or an ink jet method in addition to a vapor deposition method.

(Electron Injection Layer)

As the material of the electron injection layer of the organic EL element of the present disclosure, an alkali metal salt such as lithium fluoride and cesium fluoride; an alkaline earth metal salt such as magnesium fluoride; a metal complex of a quinolinol derivative such as lithium quinolinol; a metal oxide such as aluminum oxide; a metal such as ytterbium (Yb), samarium (Sm), calcium (Ca), strontium (Sr), cesium (Cs); or the like can be used.

The electron injection layer may be omitted in the preferred choice of electron transport layer and cathode.

Further, in the electron injection layer or the electron transport layer, a material in which a metal such as cesium is further N-doped to a material usually used for the layer can be used.

As a method of producing the electron injection layer, a known method such as a vapor deposition method can be used.

"Cathode"

As the material of the cathode of the organic EL element of the present disclosure, an electrode material having a low work function such as aluminum; an alloy having a lower work function such as a magnesium-silver alloy, a magnesium-calcium alloy, a magnesium-indium alloy, and an aluminum-magnesium alloy; a transparent electrode material such as ITO and a material (IZO) composed of indium oxide and zinc oxide; or the like can be used.

In the organic EL element of the present embodiment, the cathode arranged in contact with the capping layer is a cathode. Therefore, the cathode is preferably transparent or semitransparent in order to form an organic EL element having high light extraction efficiency.

As a method of producing the cathode, a known method such as a vapor deposition method can be used.

The organic EL element having a top emission structure of the present embodiment has a capping layer which has a refractive index higher than that of the semitransparent electrode and is provided outside the transparent or semitransparent electrode. Thus, in the organic EL element of this embodiment, the light extraction efficiency can be greatly improved. The film can be formed at 400° C. or lower by using the arylanine compound represented by the general formula (1) in the capping layer. Therefore, the capping layer in which the light extraction efficiency of each color is optimized can be formed using the high-definition mask without damaging the light emitting element. Therefore, the organic EL element of this embodiment can be suitably applied to a full-color display, and can display a clear and bright image with good color purity.

The organic EL element of the present embodiment uses, as the material of the capping layer, a material for the organic EL element having a high absorption coefficient, a high refractive index, and excellent thin-film stability, durability, and light resistance. For this reason, the organic EL element of the present embodiment is not affected by sunlight and maintains color purity compared with the conventional organic EL element, enabling a significant improvement in light extraction efficiency.

Further, in the organic EL element of the present embodiment, since the capping layer contains an arylamine compound represented by the formula (1) and the luminous layer contains one or both of a compound represented by the formula (2) and a compound represented by the formula (3), it is possible to realize an organic EL element having high efficiency and a long lifetime.

Although an organic EL element having a top emission structure has been described above, the present disclosure is not limited thereto. The present disclosure can be similarly applied to an organic EL element having a bottom emission structure and an organic EL element having a dual emission structure emitting light from both the top and bottom. In the case of the organic EL elements of these structures, the electrode in the direction in which the light is extracted from the light emitting element is preferably transparent or semi-transparent.

(Manufacturing Method of Organic EL Element)

The method of manufacturing an organic EL element of the present embodiment shown in FIG. 1 includes a step of forming an organic layer including a luminous layer 5 between a cathode 8 and an anode 2, and a step of laminating a capping layer 9 on the opposite surface of the cathode 8 with respect to the organic layer.

In this embodiment, in the step of forming the organic layer, the luminous layer 5 is formed by using a material containing one or both of compounds represented by the formula (2) and formula (3). As the method for laminating the luminous layers 5, a vapor deposition method is preferably used.

In the present embodiment, the capping layer 9 is formed by using the arylamine compound represented by the general formula (1). As a method for laminating the capping layer 9, a vapor deposition method is preferably used because the vapor deposition method is a suitable method for mass-producing thin films of nano units.

Hereinafter, embodiments of the present invention will be described in detail with reference to examples. The present invention is not limited to the following examples without departing from the scope thereof.

Example 1

Synthesis of N, N'-bis{4-(2H-benzo [1, 2, 3] triazole-2-yl) phenyl}-N, N'-diphenyl-4, 4'-diamino-1, 1'-biphenyl (Compound (1-1))

To a reaction vessel substituted with nitrogen, 4.2 g of 2-(4-bromophenyl)-2H-benzo [1, 2, 3] triazole, 2.3 g of N, N'-diphenylbenzidine, 2.0 g of tert-butoxy sodium, and 50 ml of toluene were added, and nitrogen gas was vented under ultrasonic irradiation for 30 minutes. To the reaction vessel, 62.0 mg of palladium acetate and 0.2 ml of tri-tert-butylphosphine were further added and the mixture was heated, and stirred at 91° C. for 5 hours. After the reaction vessel was allowed to cool to room temperature, 50 ml of toluene was added and the organic layer was collected by performing an extraction operation. The organic layer was concentrated and purified by column chromatography (carrier: NH silica gel), eluent: toluene/n-hexane. After purification, followed by dispersion washing with 100 ml of n-hexane, 3.3 g (66% yield) of a yellow powder of N, N'-bis{4-(2H-benzo [1, 2, 3] triazole-2-yl) phenyl}-N, N'-diphenyl-4, 4'-diamino-1, 1'-biphenyl (compound (1-1)) was obtained.

The structure of the resulting yellow powder was identified using NMR.

The following 34 hydrogen signals were detected by $^1$H-NMR (THF-$d_8$).

δ (ppm)=8.26 (4H), 7.89 (4H), 7.60 (4H), 7.39 (4H), 7.33 (4H), 7.24 (4H), 7.21 (8H), 7.10 (2H).

[Chemical Formula 25]

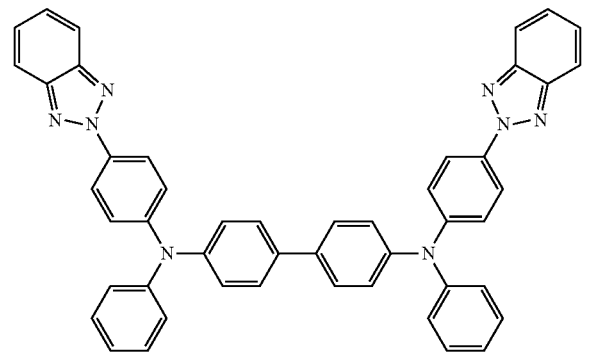

(1-1)

Example 2

Synthesis of N, N'-Bis{4-(2H-benzo [1, 2, 3] triazole-2-yl) phenyl}-N, N'-diphenyl-4, 4"-diamino-1, 1': 4', 1"-terphenyl (compound (1-2))

To a nitrogen-substituted reaction vessel, 14.0 g of 4, 4"-diiodo-1, 1': 4', 1"-terphenyl, 18.3 g of {4-(2H-benzo [1, 2, 3] triazole-2-yl) phenyl} phenylamine, 13.2 g of potassium carbonate, 0.3 g of copper powder, 0.9 g of sodium bisulfite, 0.7 g of 3,5-di-tert-butylsalicylic acid, and 30 ml of dodecylbenzene were added, and heated and stirred at 210° C. for 44 hours. After the reaction vessel was allowed to cool to room temperature, 50 ml of toluene was added and the precipitate was collected by filtration. To the precipitate, 230 ml of 1, 2-dichlorobenzene was added and dissolved by heating it, and the insoluble matter was removed by hot filtration. The filtrate was concentrated and crystallized with 1, 2-dichlorobenzene, followed by dispersion washing with methanol to obtain 22.2 g (96% yield) of a yellow powder of N, N'-Bis{4-(2H-benzo [1, 2, 3] triazole-2-yl) phenyl}-N, N'-diphenyl-4, 4"-diamino-1, 1': 4', 1"-terphenyl (compound (1-2)).

The structure of the resulting yellow powder was identified using NMR.

The following 38 hydrogen signals were detected by $^1$H-NMR (CDCl$_3$).

δ(ppm)=8.24 (4H), 7.99-7.92 (4H), 7.72-7.58 (7H), 7.50-7.12 (23H).

[Chemical Formula 26]

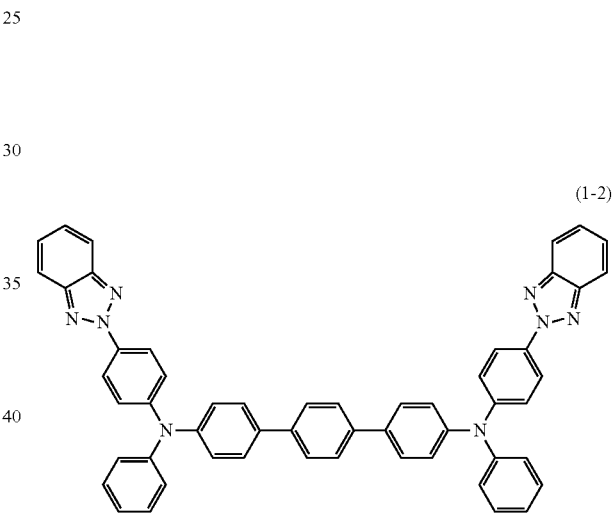

(1-2)

Example 3

Synthesis of N, N'-bis{4-(benzoxazole-2-yl) phenyl}-N, N'-diphenyl-4, 4"-diamino-1, 1': 4', 1"-terphenyl (compound (1-22))

The reaction was carried out under the same conditions as in Example 2, except that {4-(benzoxazole-2-yl)phenyl} phenylamine was used instead of {4-(2H-benzo [1, 2, 3] triazole-2-yl) phenyl} phenylamine to obtain 12.4 g (47% yield) of a yellow powder of N, N'-bis{4-(benzoxazole-2-yl) phenyl}-N, N'-diphenyl-4, 4"-diamino-1, 1': 4', 1"-terphenyl (compound (1-22)).

The structure of the resulting yellow powder was identified using NMR.

The following 38 hydrogen signals were detected by $^1$H-NMR (CDCl$_3$).

δ(ppm)=8.13 (4H), 7.80-7.55 (11H), 7.50-7.16 (23H).

[Chemical Formula 27]

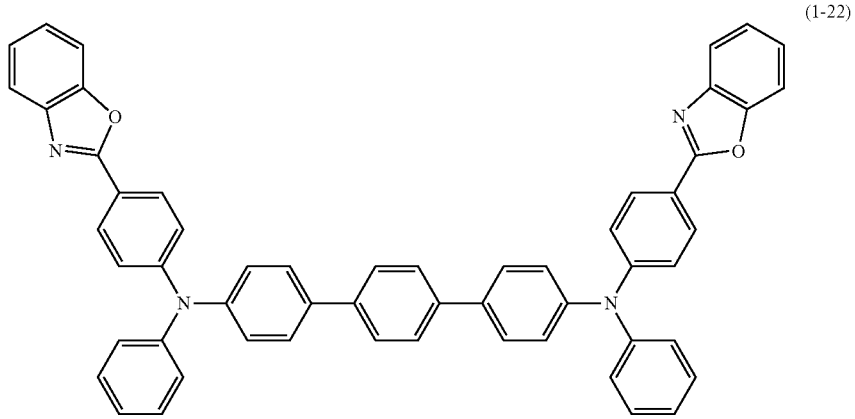

(1-22)

Example 4

Synthesis of N, N'-bis{4-(benzoxazole-2-yl) phenyl}-N, N'-diphenyl-4, 4'-diamino-1, 1'-biphenyl (compound (1-23))

The reaction was carried out under the same conditions as in Example 1, except that 2-(4-bromophenyl)-benzoxazole was used in place of 2-(4-bromophenyl)-2H-benzo [1, 2, 3] triazole to obtain 8.8 g (54% yield) of pale yellow powder of N, N'-bis{4-(benzoxazole-2-yl) phenyl}-N, N'-diphenyl-4, 4'-diamino-1, 1'-biphenyl (Compound (1-23)).

The structure of the resulting pale yellow powder was identified using NMR.

The following 34 hydrogen signals were detected by $^1$H-NMR (CDCl$_3$).

δ(ppm)=8.12 (4H), 7.80-7.72 (2H), 7.60-7.53 (5H), 7.41-7.14 (23H).

[Chemical Formula 28]

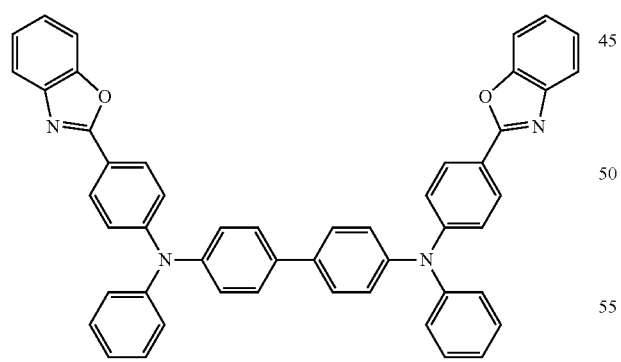

(1-23)

Example 5

Synthesis of N, N'-bis{4-(benzothiazole-2-yl)phenyl}-N, N'-diphenyl-4, 4'-diamino-1, 1'-biphenyl (Compound (1-25))

The reaction was carried out under the same conditions as in Example 1, except that 2-(4-bromophenyl)-benzothiazole was used in place of 2-(4-bromophenyl)-2H-benzo [1, 2, 3] triazole to obtain 9.3 g (62% yield) of pale yellow powder of N, N'-bis{4-(benzothiazole-2-yl)phenyl}-N, N'-diphenyl-4, 4'-diamino-1, 1'-biphenyl (Compound (1-25)).

The structure of the resulting pale yellow powder was identified using NMR.

The following 34 hydrogen signals were detected by $^1$H-NMR (CDCl$_3$).

δ(ppm)=8.10-7.88 (8H), 7.60-7.13 (26H).

[Chemical Formula 29]

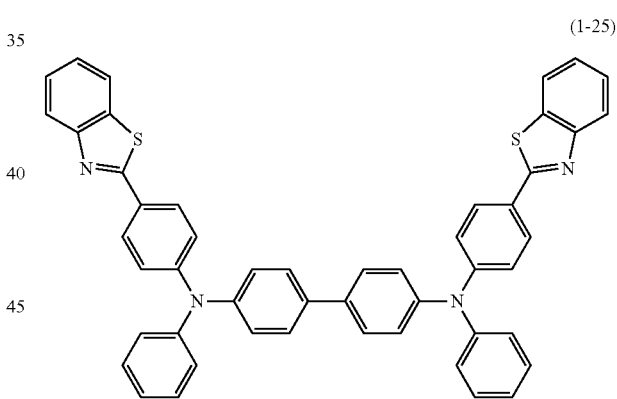

(1-25)

Example 6

Synthesis of N, N'-bis{4-(benzothiazole-2-yl)phenyl}-N, N'-diphenyl-4, 4"-diamino-1, 1': 4', 1"-terphenyl (Compound (1-27))

To a reaction vessel substituted with nitrogen, 9.3 g of N-{4-(benzothiazole-2-yl) phenyl}phenylamine,-1, 1"-diiodo, 7.1 g of 4,4"-diiodine-1, 1': 4', 1"-terphenyl, 4.6 g of sodium tert-butoxy, and 140 ml of toluene were added, and nitrogen gas was vented under ultrasonic irradiation for 30 minutes. To the reaction vessel, 0.20 g of palladium acetate and 0.5 g of a 50% (v/v) solution of tert-butylphosphine in toluene were added, the mixture was heated, and heated to reflux with stirring for 3 hours. After the reaction vessel was allowed to cool to room temperature, and the precipitate was collected by filtration. Then, crystallization purification with a mixed solvent of 1, 2-dichlorobenzene/methanol was repeated to obtain 7.0 g (58% yield) of green powder of N, N'-bis{4-(benzothiazole-2-yl)phenyl}-N, N'-diphenyl-4, 4"-diamino-1, 1': 4', 1"-terphenyl (compound (1-27)).

The structure of the resulting green powder was identified using NMR.

The following 38 hydrogen signals were detected by $^1$H-NMR (CDCl$_3$).

δ(ppm)=8.05 (2H), 7.98 (4H), 7.90 (2H), 7.70 (4H), 7.61 (4H), 7.50 (2H), 7.42-7.31 (6H), 7.30-7.11 (14H).

[Chemical Formula 30]

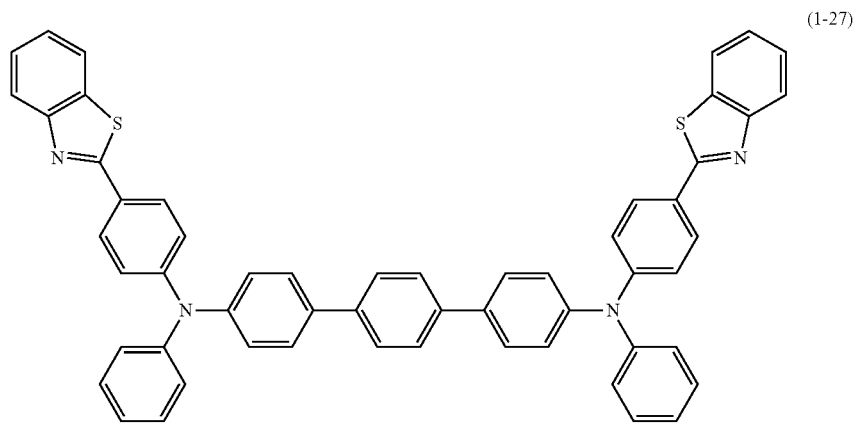

(1-27)

(Measurement of Melting Point and Glass Transition Point (Tg) of Compounds)

The glass transition temperatures (Tg) of the compounds represented by the formulae (1-1), (1-2), (1-22), (1-23), (1-25), and (1-27), which were synthesized in Examples 1 to 6, were measured using a highly sensitive differential scanning calorimeter (DSC 3100 SA, manufactured by Bulker AXS). The results are shown below.

Example 1 (compound of formula (1-1)) Tg: 125° C.
Example 2 (compound of formula (1-2)) Tg: 135° C.
Example 3 (compound of formula (1-22)) Tg: 137° C.
Example 4 (compound of formula (1-23)) Tg: 128° C.
Example 5 (compound of formula (1-25)) Tg: 127° C.
Example 6 (compound of formula (1-27)) Tg: 137° C.

The compounds represented by the formulae (1-1), (1-2), (1-22), (1-23), (1-25) and (1-27), which were synthesized in Examples 1 to 6, were found to have the glass transition temperatures (Tg) of 120° C. or higher and to be materials capable of forming thin films with good stability.

(Measurement of Refractive Index and Extinction Coefficient of Thin Film)

The compounds represented by the formulae (1-1), (1-2), (1-22), (1-23), (1-25) and (1-27), which were synthesized in Examples 1 to 6, were used to prepare a deposited film having a thickness of 80 nm on a silicon substrate.

For each of the deposited films, light having wavelengths of 400 nm, 410 nm, 450 nm, and 750 nm was transmitted through the capping layer by using a spectrophotometer (Filmetrix F10-RT-UV), and was reflected by the silicon substrate to measure the reflected light. The refractive index n of the capping layer at wavelengths of 400 nm, 410 nm, 450 nm, and 750 nm and the extinction coefficient k at wavelengths of 400 nm and 410 nm were obtained using the results. The results are shown in Table 1.

For comparison, a compound represented by the formula (4-1) and a compound represented by the formula (4-2) were used to prepare an evaporated film having a film thickness of 80 nm on a silicon substrate, and the refractive index n of the capping layer at wavelengths of 400 nm, 410 nm, 450 nm and 750 nm and the extinction coefficient k at wavelengths of 400 nm and 410 nm were obtained in the same manner as the evaporated film of the compound represented by the formula (1-1) (see, for example, Patent Document 4.). The results are summarized in Table 1.

[Chemical Formula 31]

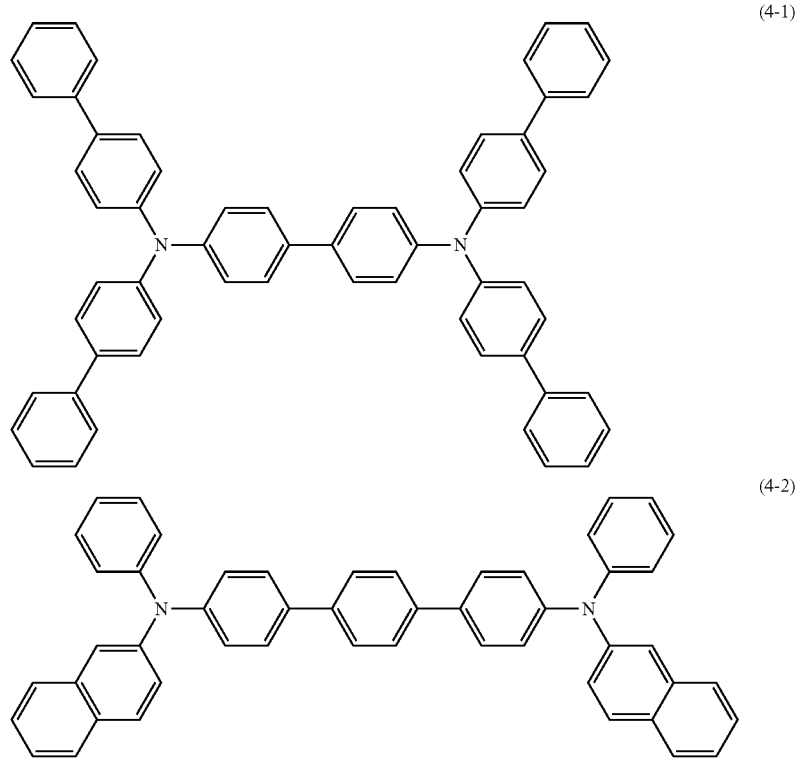

(4-1)

(4-2)

TABLE 1

|  | Refractive index n (λ: 400 nm) | Refractive index n (λ: 410 nm) | Refractive index n (λ: 450 nm) | Refractive index n (λ: 750 nm) | Extinction coefficient k (λ: 400 nm) | Extinction coefficient k (λ: 410 nm) |
| --- | --- | --- | --- | --- | --- | --- |
| Compound (1-1) | 2.18 | 2.34 | 2.28 | 1.87 | 0.75 | 0.62 |
| Compound (1-2) | 2.23 | 2.38 | 2.25 | 1.86 | 0.75 | 0.59 |
| Compound (1-22) | 2.48 | 2.54 | 2.26 | 1.87 | 0.70 | 0.43 |
| Compound (1-23) | 2.50 | 2.54 | 2.25 | 1.88 | 0.69 | 0.43 |
| Compound (1-25) | 2.23 | 2.43 | 2.31 | 1.89 | 0.84 | 0.67 |
| Compound (1-27) | 2.26 | 2.45 | 2.28 | 1.87 | 0.83 | 0.63 |
| Compound (4-1) | 2.26 | 2.20 | 2.02 | 1.80 | 0.21 | 0.13 |
| Compound (4-2) | 2.17 | 2.11 | 1.96 | 1.78 | 0.15 | 0.09 |

As shown in Table 1, each thin film made of a compound represented by the formulae (1-1), (1-2), (1-22), (1-23), (1-25) or (1-27) had a refractive index n equal to or higher than that of the thin film made of the compound represented by the formula (4-1) or (4-2).

Therefore, by using the thin film made of the compound represented by the formulae (1-1), (1-2), (1-22), (1-23), (1-25) or (1-27) as a capping layer, it is expected to improve the light extraction efficiency of the organic EL element.

Each the films made of the compound represented by the formulae (1-1), (1-2), (1-22), (1-23), (1-25) or (1-27) had an extinction coefficient k of 0.3 or more, which was higher than the film made of the compound represented by the formulae (4-1) or (4-2).

This indicates that the capping layer using the thin film of the compound represented by the formulae (1-1), (1-2), (1-22), (1-23), (1-25) or (1-27) absorbs light having a wavelength of 400 nm to 410 nm of sunlight well and does not affect the material inside the element.

(Determination of Peak Wavelength, Absorbance and Extinction Coefficient of Compounds)

The compounds represented by the formulae (1-1), (1-2), (1-22), (1-23), (1-25) and (1-27), which were synthesized in Examples 1 to 6 were each adjusted to a concentration of $10^{-5}$ mol/L in a toluene solvent, and the absorbance in the wavelength range of 200 to 600 nm was measured using an ultraviolet visible near-infrared spectrophotometer (V-650 manufactured by JASCO Co., Ltd.) to determine the peak wavelength. The results are shown in Table 2.

The compounds represented by the formulae (1-1), (1-2), (1-22), (1-23), (1-25) and (1-27), which were synthesized in Examples 1 to 6 were adjusted to a concentration of $10^{-5}$ mol/L in a toluene solvent, and the absorbance at 400 nm and 410 nm was measured using an ultraviolet-visible near-infrared spectrophotometer (V-650 manufactured by JASCO Co., Ltd.). The results are shown in Table 2.

Further, using the compounds represented by the formulae (1-1), (1-2), (1-22), (1-23), (1-25), and (1-27), which were synthesized in Examples 1 to 6, samples were prepared by adjusting the concentrations of the compounds to 4 different concentrations of $5.0 \times 10^{-6}$ mol/L, $1.0 \times 10^{-5}$ mol/L, $1.5 \times 10^{-5}$ mol/L, and $2.0 \times 10^{-5}$ mol/L in toluene solution, respectively. The absorbance of each sample at the peak wavelength was measured using an ultraviolet-visible near-infrared spectrophotometer (V-650 manufactured by JASCO Co., Ltd.), and a calibration curve was prepared for each compound to calculate the extinction coefficient. The results are shown in Table 2.

For comparison, a peak wavelength, absorbance, and extinction coefficient were determined by using the compound represented by the formula (4-2) above, in the same manner as using the compound represented by the formula (1-1).

The results are summarized in Table 2.

TABLE 2

|  | Absorbance at peak wavelength ($\lambda$max) | Absorbance ($\lambda$: 400 nm) | Absorbance ($\lambda$: 410 nm) | Absorbance coefficient |
| --- | --- | --- | --- | --- |
| Compound (1-1) | 390 nm | 0.617 | 0.48 | 64905 |
| Compound (1-2) | 388 nm | 0.739 | 0.533 | 78155 |
| Compound (1-22) | 380 nm | 0.548 | 0.201 | 89074 |
| Compound (1-23) | 380 nm | 0.526 | 0.224 | 77112 |
| Compound (1-25) | 390 nm | 0.724 | 0.515 | 76682 |
| Compound (1-27) | 388 nm | 0.841 | 0.535 | 89422 |
| Compound (4-2) | 357 nm | 0.017 | 0.000 | 53682 |

As shown in Table 2, the peak wavelengths of the compounds represented by the formulae (1-1), (1-2), (1-22), (1-23), (1-25) and (1-27) were 400 nm or less, similar to the compound represented by the formula (4-2). The compounds represented by the formulae (1-1), (1-2), (1-22), (1-23), (1-25) and (1-27) were found to have difficulty absorbing light in the blue, green, and red wavelength regions, respectively, and to be usable as a thin film material absorbing light at wavelengths of 400 nm and 410 nm.

As shown in Table 2, the compounds represented by the formulae (1-1), (1-2), (1-22), (1-23), (1-25), and (1-27) had higher absorbance than the compound represented by the formula (4-2). Specifically, the compounds represented by the formulae (1-1), (1-2), (1-22), (1-23), (1-25), and (1-27) in terms of absorbance at wavelengths of 400 nm and 410 nm had a large value of 0.2 or more, whereas the comparative compound (4-2) had a value of 0.1 or less. From this, it was found that the compounds represented by the formulae (1-1), (1-2), (1-22), (1-23), (1-25), and (1-27) can form a thin film having a better function of absorbing light at wavelengths of 400 nm and 410 nm than the compound represented by the formula (4-2) at the same concentration.

The compounds represented by the formulae (1-1), (1-2), (1-22), (1-23), (1-25) and (1-27) had a larger extinction coefficient than the compound represented by the formula (4-2). Therefore, by using a compound represented by the formulae (1-1), (1-2), (1-22), (1-23), (1-25) or (1-27), a film excellent in light resistance can be formed in which the function of absorbing light is remarkably enhanced as the film thickness is made thicker.

Example 7

Synthesis of 7, 7-dimethyl-12-(4-phenylbenzo [h] quinazoline-2-yl)-7, 12-dihydrobenzo [4, 5] thieno [3,2-g] indeno [1, 2-b] indole (Compound 2-2)

To the nitrogen-substituted reaction vessel, 4.9 g of 7,7-dimethyl-7, 12 dihydrobenzo [4, 5] thieno [3, 2-g] indeno [1, 2-b] indole, 5.7 g of 2-chloro-4 phenylbenzo [h] quinazoline, 0.3 g of tris (dibenzylideneacetone) dipalladium, 0.4 g of tri-tert-butylphosphonium tetrafluoroborate, 4.0 g of tert-butoxy sodium, and 74 ml of xylene were added, and the mixture was heated to reflux for 12 hours. After the reaction vessel was allowed to cool to room temperature, ethyl acetate and water were added, and the organic layer was collected by a separation operation. The organic layer was concentrated and purified by column chromatography to give 3.2 g (38% yield) of powder of 7, 7-dimethyl-12-(4-phenylbenzo [h] quinazoline-2-yl)-7, 12-dihydrobenzo [4, 5] thieno [3,2-g] indeno [1, 2-b] indole (Compound 2-2).

[Chemical Formula 32]

(2-2)

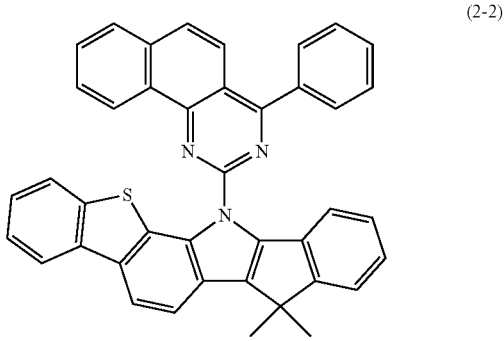

Example 8

Synthesis of 12, 12-dimethyl-1-(4-phenylquinazoline-2-yl)-1, 12-dihydroindeno [1', 2': 4, 5] thieno [2,3-a] carbazole (Compound 3-14)

To a nitrogen-substituted reaction vessel, 4.9 g of 12, 12 dimethyl-1, 12 dihydroindeno [1', 2': 4, 5] thieno [2,3-a] carbazole, 5.7 g of 2-chloro-4 phenylquinazoline, 0.3 g of tris (dibenzylideneacetone) dipalladium, 0.4 g of tri-tert-butylphosphonium tetrafluoroborate, 4.0 g of tert-butoxy sodium, and 74 ml of xylene were added, and the mixture was heated and stirred at reflux for 12 hours. After the reaction vessel was allowed to cool to room temperature, ethyl acetate and water were added, and the organic layer was collected by a separation operation. The organic layer was concentrated and purified by column chromatography to give 6.3 g (44% yield) of 12, 12-dimethyl-1-(4-phenylquinazoline-2-yl)-1, 12-dihydroindeno [1', 2': 4, 5] thieno [2,3-a] carbazole (Compound 3-14) powder.

[Chemical Formula 33]

(3-14)

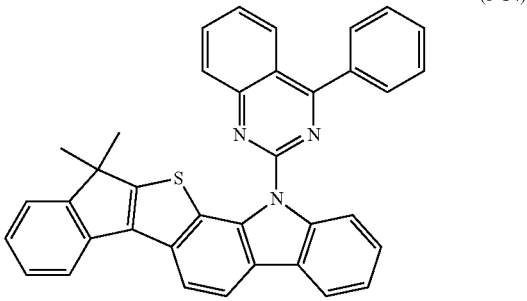

Example 9

The organic EL element shown in FIG. 1 was manufactured by means of the following method.

A hole injection layer 3, a hole transport layer 4, a luminous layer 5, an electron transport layer 6, an electron injection layer 7, a cathode 8, and a capping layer 9 were formed in this order by a vapor deposition method on a glass substrate 1 on which a reflective electrode was previously formed as an anode 2 made of metal, thereby obtaining an organic EL element shown in FIG. 1.

Specifically, the glass substrate 1 was prepared by forming the anode 2 thereon, which was obtained by sequentially forming ITO with a film thickness of 50 nm, a reflection film of a silver alloy with a film thickness of 100 nm, and ITO with a film thickness of 5 nm. The glass substrate 1 was ultrasonically cleaned in isopropyl alcohol for 20 minutes and then dried on a hot plate heated to 250° C. for 10 minutes. After UV ozone treatment was performed for 2 minutes, the glass substrate 1 with ITO was mounted in a vacuum vapor deposition apparatus, and the pressure in the vacuum vapor deposition apparatus was reduced to 0.001 Pa or less.

Subsequently, as the hole injection layer 3 covering the anode 2, an electron acceptor (Acceptor-1) and a compound represented by the following formula (4-3) were subjected to binary vapor deposition at a vapor deposition rate at which the vapor deposition rate ratio was Acceptor-1:Compound (4-3)=3:97, so as to form a film thickness of 10 nm.

On the hole injection layer 3, as a hole transport layer 4, a compound (4-3) was formed to have a film thickness of 140 nm.

On the hole transport layer 4, as the luminous layer 5, a compound represented by the formula (EMD-1) and a compound represented by the formula (2-2), which was synthesized in Example 7, were subjected to binary vapor deposition at a vapor deposition rate (A/sec) at which the ratio of vapor deposition rate was Compound (EMD-1): Compound (2-2)=5:95, so as to form a film thickness of 20 nm.

On the luminous layer 5, as the electron transport layer 6, a compound represented by the formula (4-4) and a compound represented by the formula (ETM-1) were subjected to binary vapor deposition at a vapor deposition rate (A/sec) at which the ratio of the vapor deposition rate was Compound (ETM-1):Compound (4-4)=50:50, so as to form a film thickness of 30 nm.

[Chemical Formula 34]

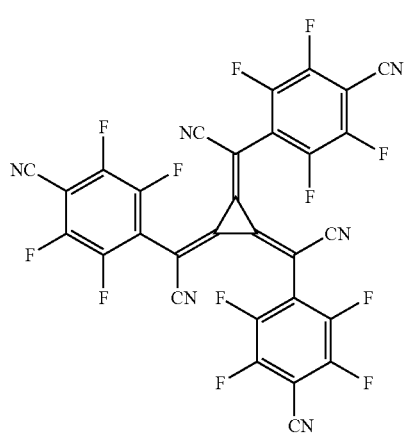

(Acceptor-1)

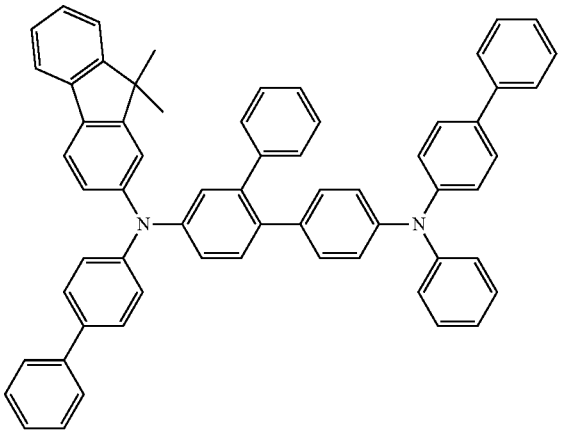

(4-3)

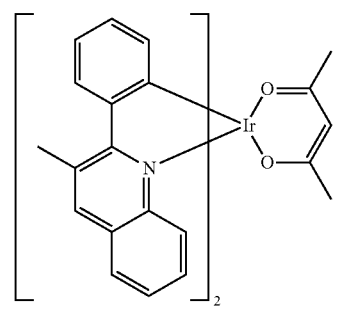

(EMD-1)

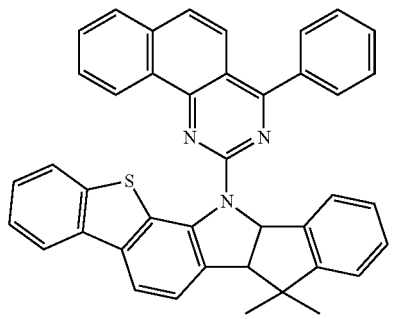

(2-2)

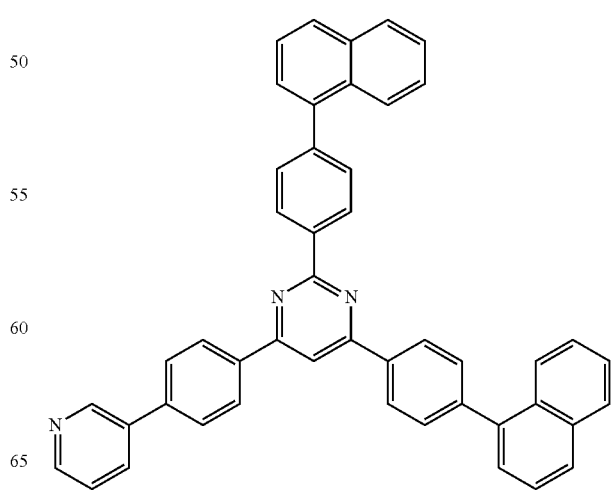

(4-4)

(ETM-1)

On the electron transport layer 6, as an electron injection layer 7, lithium fluoride was formed so as to have a film thickness of 1 nm.

On the electron injection layer 7, as a cathode 8, a magnesium silver alloy was formed so as to have a film thickness of 12 nm.

Finally, the compound represented by formula (1-1) synthesized in Example 1 was evaporated on the cathode 8 to form the capping layer 9 having a film thickness of 60 nm, thereby obtaining the organic EL element of Example 9.

Example 10

An organic EL element of Example 10 was obtained in the same manner as in Example 9, except that a compound of formula (1-2) synthesized in Example 2 was used as a material for the capping layer 9 to have a film thickness of 60 nm instead of the compound of Formula (1-1), which was synthesized in Example 1.

Example 11

An organic EL element of Example 11 was obtained in the same manner as in Example 9, except that a compound of formula (1-22) synthesized in Example 3 was used as a material for the capping layer 9 to have a film thickness of 60 nm instead of the compound of Formula (1-1), which was synthesized in Example 1.

Example 12

An organic EL element of Example 12 was obtained in the same manner as in Example 9, except that a compound of formula (1-23) synthesized in Example 4 was used as a material for the capping layer 9 to have a film thickness of 60 nm instead of the compound of Formula (1-1), which was synthesized in Example 1.

Example 13

An organic EL element of Example 13 was obtained in the same manner as in Example 9, except that a compound of formula (1-25) synthesized in Example 5 was used as a material for the capping layer 9 to have a film thickness of 60 nm instead of the compound of Formula (1-1), which was synthesized in Example 1.

Example 14

An organic EL element of Example 14 was obtained in the same manner as in Example 9, except that a compound of formula (1-27) synthesized in Example 6 was used as a material for the capping layer 9 to have a film thickness of 60 nm instead of the compound of the formula (1-1), which was synthesized in Example 1.

Example 15

An organic EL element of Example 15 was obtained in the same manner as in Example 9, except that a compound of formula (3-14) synthesized in Example 8 was used as a material for the luminous layer 5 and was subjected to binary deposition at a deposition rate at which the ratio of the deposition rate was (EMD-1):(3-14)=5:95 to form a film thickness of 20 nm, instead of the compound of formula (2-2), which was synthesized in Example 7.

Example 16

An organic EL element of Example 16 was obtained in the same manner as in Example 10, except that a compound of formula (3-14) synthesized in Example 8 was used as a material for the luminous layer 5 and was subjected to binary deposition at a deposition rate at which the ratio of the deposition rate was (EMD-1):(3-14)=5:95 to form a film thickness of 20 nm, instead of the compound of formula (2-2), which was synthesized in Example 7.

Example 17

An organic EL element of Example 17 was obtained in the same manner as in Example 11, except that a compound of formula (3-14) synthesized in Example 8 was used as a material for the luminous layer 5 and was subjected to binary deposition at a deposition rate at which the ratio of the deposition rate was (EMD-1):(3-14)=5:95 to form a film thickness of 20 nm, instead of the compound of formula (2-2), which was synthesized in Example 7.

Example 18

An organic EL element of Example 18 was obtained in the same manner as in Example 12, except that a compound of formula (3-14) synthesized in Example 8 was used as a material for the luminous layer 5 and was subjected to binary deposition at a deposition rate at which the ratio of the deposition rate was (EMD-1):(3-14)=5:95 to form a film thickness of 20 nm, instead of the compound of formula (2-2), which was synthesized in Example 7.

Example 19

An organic EL element of Example 19 was obtained in the same manner as in Example 13, except that a compound of formula (3-14) synthesized in Example 8 was used as a material for the luminous layer 5 and was subjected to binary deposition at a deposition rate at which the ratio of the deposition rate was (EMD-1):(3-14)=5:95 to form a film thickness of 20 nm, instead of the compound of formula (2-2), which was synthesized in Example 7.

Example 20

An organic EL element of Example 20 was obtained in the same manner as in Example 14, except that a compound of formula (3-14) synthesized in Example 8 was used as a material for the luminous layer 5 and was subjected to binary deposition at a deposition rate at which the ratio of the deposition rate was (EMD-1):(3-14)=5:95 to form a film thickness of 20 nm, instead of the compound of formula (2-2), which was synthesized in Example 7.

Comparative Example 1

For comparison, an organic EL element of Comparative Example 1 was obtained in the same manner as in Example 9, except that a compound represented by the above-mentioned formula (4-2) was used as a material for the capping layer 9 to have a film thickness of 60 nm instead of the compound of the formula (1-1), which was synthesized in Example 1.

Comparative Example 2

For comparison, an organic EL element of Comparative Example 2 was obtained in the same manner as in Example 15, except that a compound represented by the above-mentioned formula (4-2) was used as a material for the capping layer 9 to have a film thickness of 60 nm instead of the compound of the formula (1-1), which was synthesized in Example 1.

The organic EL elements of Examples 9 to 20, Comparative Example 1, and Comparative Example 2 were characterized in air and at room temperature, respectively. Specifically, the driving voltage, luminance, luminous efficiency, and power efficiency were measured at a current density of 10 mA/cm$^2$ when a DC voltage was applied to each organic EL element. The results are shown in Table 3.

The organic EL elements of Examples 9 to 20, Comparative Example 1, and Comparative Example 2 were each driven at a constant current of 10 mA/cm$^2$ at room temperature in the atmosphere, and the time until the luminance decayed to 95% when the initial luminance was set to 100% was measured and evaluated as the lifetime (element lifetime). The results are shown in Table 3.

Further, in terms of the element lifetime (95% decay), the organic EL element of Comparative Example 1 has a lifetime of 269 hours, while the organic EL elements of Examples 9 to 14 have a lifetime of 320 to 362 hours, which shows that the element lifetime is greatly extended.

Next, Examples 15 to 20 shown in Table 3 are compared with Comparative Example 2 in which the material of the luminous layer is the same.

As shown in Table 3, the drive voltage at 10 mA/cm$^2$ was equivalent to Example 15 to Example 20 and Comparative Example 2.

The brightness at 10 mA/cm$^2$ was higher in Examples 15 to 20 than in Comparative Example 2.

When a current having a current density of 10 mA/cm$^2$ was applied, the emission efficiency of the organic EL element of Comparative Example 2 was 40.81 cd/A, while that of the organic EL elements of Examples 15 to 20 was 42.41 to 44.37 cd/A, and both of them were highly efficient.

The power efficiency of the organic EL element of Comparative Example 2 was 30.64 km/W, while that of the organic EL elements of Examples 15 to 20 was 31.35 to 32.87 km/W, both of which were high.

Further, in terms of the element lifetime (95% decay), the organic EL element of Examples 15 to 20 had a lifetime of 359 to 384 hours, compared to 283 hours of the organic EL element of Comparative Example 2, indicating that the element lifetime was greatly extended.

TABLE 3

|  | Luminous layer | Capping Layer | Voltage [V] (10 mA/cm$^2$) | Luminance [cd/m$^2$] (10 mA/cm$^2$) | Luminance efficiency [cd/A] (10 mA/cm$^2$) | Power efficiency [km/W] (10 mA/cm$^2$) | Element lifetime 95% decay |
|---|---|---|---|---|---|---|---|
| Example 9 | Compound (2-2) | Compound (1-1) | 4.34 | 4191 | 41.95 | 30.37 | 320 hr |
| Example 10 | Compound (2-2) | Compound (1-2) | 4.32 | 4224 | 42.28 | 30.78 | 337 hr |
| Example 11 | Compound (2-2) | Compound (1-22) | 4.34 | 4624 | 46.28 | 33.52 | 362 hr |
| Example 12 | Compound (2-2) | Compound (1-23) | 4.33 | 4587 | 45.91 | 33.33 | 356 hr |
| Example 13 | Compound (2-2) | Compound (1-25) | 4.31 | 4227 | 42.32 | 30.84 | 343 hr |
| Example 14 | Compound (2-2) | Compound (1-27) | 4.35 | 4220 | 42.23 | 30.55 | 349 hr |
| Example 15 | Compound (3-14) | Compound (1-1) | 4.23 | 4265 | 42.68 | 31.72 | 359 hr |
| Example 16 | Compound (3-14) | Compound (1-2) | 4.21 | 4306 | 43.08 | 32.12 | 363 hr |
| Example 17 | Compound (3-14) | Compound (1-22) | 4.24 | 4434 | 44.37 | 32.87 | 384 hr |
| Example 18 | Compound (3-14) | Compound (1-23) | 4.23 | 4380 | 43.82 | 32.53 | 373 hr |
| Example 19 | Compound (3-14) | Compound (1-25) | 4.18 | 4240 | 42.41 | 31.92 | 369 hr |
| Example 20 | Compound (3-14) | Compound (1-27) | 4.25 | 4235 | 42.38 | 31.35 | 371 hr |
| Comparative Example 1 | Compound (2-2) | Compound (4-2) | 4.33 | 3977 | 39.8 | 28.86 | 269 hr |
| Comparative Example 2 | Compound (3-14) | Compound (4-2) | 4.19 | 4079 | 40.81 | 30.64 | 283 hr |

Examples 9 to 14 shown in Table 3 are compared with Comparative Example 1 in which the same material of the luminous layer was used.

As shown in Table 3, the driving voltages at 10 mA/cm$^2$ were almost the same in those of Examples 9 to 14 and Comparative Example 1.

The brightness at 10 mA/cm$^2$ was higher in Examples 9 to 14 than that in Comparative Example 1.

When a current having a current density of 10 mA/cm$^2$ was applied, the emission efficiency of the organic EL element of Comparative Example 1 was 39.80 cd/A, while that of the organic EL elements of Examples 9 to 14 was 41.95 to 46.28 cd/A, and both of them were highly efficient.

The power efficiency of the organic EL element of Comparative Example 1 was 28.86 km/W, while that of the organic EL elements of Examples 9 to 14 was 30.37 to 33.52 km/W, and both of them were highly efficient.

The results indicates that the extraction efficiency of light can be greatly improved by providing an organic EL element having a luminous layer containing the compound represented by the formulae (2-2) or (3-14) and a capping layer containing the compound represented by the formulae (1-1), (1-2), (1-22), (1-23), (1-25) or (1-27) having a high refractive index.

INDUSTRIAL APPLICABILITY

As described above, the arylamine compound represented by the general formula (1), which is suitably used for the organic EL element of the present disclosure, has a high absorption coefficient and a high refractive index, can greatly improve the light extraction efficiency, and has a stable thin film state. Therefore, it is excellent as a compound for an organic EL element.

In addition, high efficiency can be obtained by manufacturing an organic EL element in which a capping layer containing the arylamine compound represented by the general formula (1) is combined with a luminous layer containing either or both of the heterocyclic compound having a fused ring structure represented by the general formula (2) and the heterocyclic compound having a fused ring structure represented by the general formula (3). The organic EL element absorbs sunlight and can improve durability and light resistance so as not to affect the material inside the element. The arylamine compound represented by the general formula (1) has no absorption in the blue, green, and red wavelength regions, respectively. Therefore, the organic EL element having the capping layer containing the compound is particularly suitable for displaying a bright image with good color purity. For example, it has become possible to develop applications for home appliances and lighting.

DESCRIPTION OF SIGNS

1 Glass Substrate
2 Anode
3 Hole Injection Layer
4 Hole Transport Layer
5. Luminous Layer
6 Electron Transport Layer
7 Electron Injection Layer
8 Cathode
9 Capping Layer

The invention claimed is:
1. An organic electroluminescent element comprising at least an anode, a hole transport layer, a luminous layer, an electron transport layer, a cathode and a capping layer in this order,
wherein the capping layer comprises an arylamine compound represented by a following general formula (1);
the luminous layer comprises either or both of a heterocyclic compound having a fused ring structure represented by a following general formula (2a) and a heterocyclic compound having a fused ring structure represented by a following general formula (3a-2); and
the hole transport layer comprises an arylamine compound having two triphenylamine structures in a molecule and having a structure in which the two triphenylamine structures are linked by a single bond or a divalent group not containing a hetero atom,

[Chemical Formula 1]

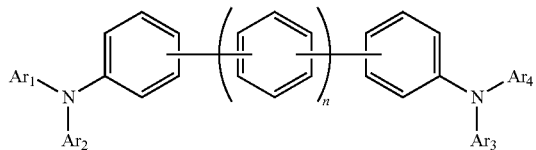

(1)

wherein, in the formula (1),
$Ar_1$, $Ar_2$, $Ar_3$, and $Ar_4$ may be the same or different from each other and represent any one selected from a substituted or unsubstituted aromatic hydrocarbon group, a substituted or unsubstituted aromatic heterocyclic group, or a substituted or unsubstituted fused polycyclic aromatic group; and n represents an integer of 0 to 4,
wherein at least one of $Ar_1$, $Ar_2$, $Ar_3$, and $Ar_4$ is a monovalent group represented by a structural formula (B) or a structural formula (B'), or has the monovalent group as a substituent,

[Chemical Formula 2]

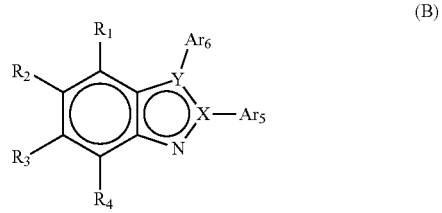

(B)

wherein, in the formula (B),
$R_1$ to $R_4$ may be the same or different from each other and represent a linking group as a binding site, a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms that may have a substituent group, a cycloalkyl group having 5 to 10 carbon atoms that may have a substituent group, a linear or branched alkenyl group having 2 to 6 carbon atoms that may have a substituent group, a linear or branched alkoxy group having 1 to 6 carbon atoms that may have a substituent group, a cycloalkyloxy group having 5 to 10 carbon atoms that may have a substituent group, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group;

$Ar_5$ and $Ar_6$ may be the same or different from each other and represent a linking group as a binding site, a substituted or unsubstituted aromatic hydrocarbon group, a substituted or unsubstituted aromatic heterocyclic group, or a substituted or unsubstituted fused polycyclic aromatic group;

X represents a carbon atom or a nitrogen atom; and Y represents any one selected from a carbon atom, a nitrogen atom, an oxygen atom, and a sulfur atom, however, when Y is an oxygen atom or a sulfur atom, Y has no $Ar_6$; when X and Y are nitrogen atoms, X or Y has no $Ar_5$ or $Ar_6$; the case when X and Y are both carbon atoms; and the case when X is nitrogen atoms and Y is oxygen atoms, and the case when X is nitrogen atoms and Y is sulfur atoms are excluded; and with the same substituted benzene ring, $R_1$ to $R_4$ may be bonded to each other, via a single bond, substituted or unsubstituted methylene group, substituted or unsubstituted amino group, oxygen atom or sulfur atom to form a ring,

[Chemical Formula 3]

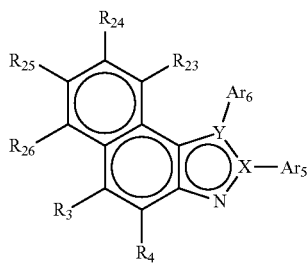

(B')

wherein, in the formula (B'), $R_3$, $R_4$ and $R_{23}$ to $R_{26}$ may be the same or different from each other and represent a linking group, a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms that may have a substituent group, a cycloalkyl group having 5 to 10 carbon atoms that may have a substituent group, a linear or branched alkenyl group having 2 to 6 carbon atoms that may have a substituent group, a linear or branched alkyloxy group having 1 to 6 carbon atoms that may have a substituent group, a cycloalkyloxy group having 5 to 10 carbon atoms that may have a substituent group, and a substituted or unsubstituted aromatic hydrocarbon group, a substituted or unsubstituted aromatic heterocyclic group, a substituted or unsubstituted fused polycyclic aromatic group, or a substituted or unsubstituted aryloxy group;

$Ar_5$ and $Ar_6$ may be the same or different from each other and represent a linking group as a binding site, a substituted or unsubstituted aromatic hydrocarbon group, a substituted or unsubstituted aromatic heterocyclic group, or a substituted or unsubstituted fused polycyclic aromatic group;

X represents a carbon atom or a nitrogen atom; and Y represents any one selected from a carbon atom, a nitrogen atom, an oxygen atom, and a sulfur atom, and however, when Y is an oxygen atom or a sulfur atom, Y has no $Ar_6$; and when X and Y are nitrogen atoms, X or Y has no $Ar_5$ or $Ar_6$; the case when X and Y are carbon atoms; the case when X is nitrogen atoms and Y is oxygen atoms, and the case when X is nitrogen atoms and Y is sulfur atoms are excluded; and with the same substituted benzene ring, $R_3$, $R_4$ and $R_{23}$ to $R_{26}$ may be bonded to each other, via a single bond, substituted or unsubstituted methylene group, substituted or unsubstituted amino group, oxygen atom or sulfur atom to form a ring, wherein, in the formula (2a), X represents a sulfur atom;

$A_1$ represents a divalent group of a substituted or unsubstituted aromatic hydrocarbon, a divalent group of a substituted or unsubstituted aromatic heterocyclic ring, a divalent group of a substituted or unsubstituted fused polycyclic aromatic ring, or a single bond;

$Ar_7$ represents a substituted or unsubstituted aromatic hydrocarbon group, a substituted or unsubstituted aromatic heterocyclic group, or a substituted or unsubstituted fused polycyclic aromatic group;

$R_7$ and $R_8$ may be the same or different from each other, and represents a hydrogen atom, a deuterium atom, a fluorine atom, a chlorine atom, a cyano group, a nitro group, a linear or branched alkyl group having 1 to 6 carbon atoms which may have a substituent, or a cycloalkyl group having 5 to 10 carbon atoms, which may have a substituent group, a linear or branched alkenyl group having 2 to 6 carbon atoms which may have a substituent, a linear or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted by a group selected from an aromatic hydrocarbon group, an aromatic heterocyclic group, and a fused polycyclic aromatic group, wherein $R_7$ and $R_8$ may be bonded to each other via a single bond, a substituted or unsubstituted methylene group, an oxygen atom, or a sulfur atom to form a ring; and $R_7$ and $R_8$ may be bonded to the substituted benzene ring to form a ring;

$R_9$ to $R_{12}$ may be the same or different from each other, represent a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent, a linear or branched alkenyl group having 2 to 6 carbon atoms which may have a substituent, a linear or branched alkoxy group having 1 to 6 carbon atoms which may have a substituent;

$R_{13}$ and $R_{14}$ may be the same or different from each other, and are a linear or branched alkyl group having 1 to 6 carbon atoms which may have a substituent,

[Chemical Formula 4]

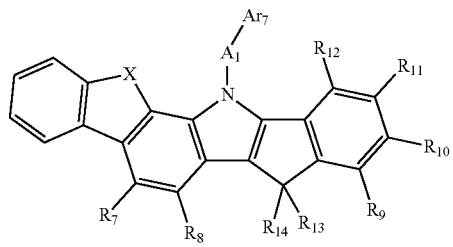

(2a)

[Chemical Formula 5]

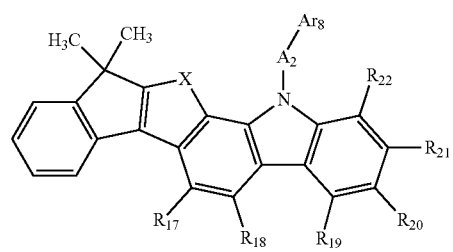

(3a-2)

wherein, in the formula (3a-2),

X represents a sulfur atom;

$A_2$ represents a bivalent group of a substituted or unsubstituted aromatic hydrocarbon, a bivalent group of a substituted or unsubstituted aromatic heterocyclic ring, a bivalent group of a substituted or unsubstituted fused polycyclic aromatic ring, or a single bond;

$Ar_8$ represents a substituted or unsubstituted aromatic hydrocarbon group, a substituted or unsubstituted aromatic heterocyclic group, or a substituted or unsubstituted fused polycyclic aromatic group;

$R_{17}$ and $R_{18}$ may be the same or different from each other, and represents a hydrogen atom, a deuterium atom, a fluorine atom, a chlorine atom, a cyano group, a nitro group, a linear or branched alkyl group having 1 to 6 carbon atoms, or a cycloalkyl group having 5 to 10 carbon atoms, which may have a substituent group, a linear or branched alkenyl group having 2 to 6 carbon atoms which may have a substituent, a linear or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted by a group selected from an aromatic hydrocarbon group, an aromatic heterocyclic group, and a fused polycyclic aromatic group, wherein $R_{17}$ and $R_{18}$ may be bonded to each other via a single bond, a substituted or unsubstituted methylene group, an oxygen atom, or a sulfur atom to form a ring; and $R_{15}$ to $R_{18}$ may be bonded to the substituted benzene ring to form a ring, via a substituted or unsubstituted methylene group, an oxygen atom, a sulfur atom or a linking group; and $R_{19}$ to $R_{22}$ may be the same or different from each other, represent a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent.

2. The organic electroluminescent element according to claim 1, wherein the structural formula (B) is a monovalent group represented by the structural formula (B-1) as following,

[Chemical Formula 6]

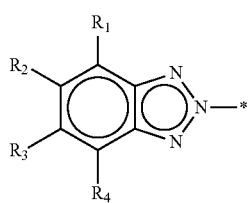

(B-1)

wherein, in the formula (B-1),

* represents a nitrogen atom or a binding site with any one selected from $Ar_1$, $Ar_2$, $Ar_3$, and $Ar_4$ in the formula (1);

$R_1$, $R_2$, $R_3$, and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted heterocyclic aromatic group, a substituted or unsubstituted fused polycyclic aromatic group, or a substituted or unsubstituted aryloxy group, wherein, with the same substituted benzene ring, $R_1$, $R_2$, $R_3$, and $R_4$ may be bonded to each other, via a single bond, a substituted or unsubstituted methylene group, a substituted or unsubstituted amino group, an oxygen atom, or a sulfur atom to form a ring.

3. The organic electroluminescent element according to claim 1, wherein the structural formula (B) is a monovalent group represented by the structural formula (B-2) as following,

[Chemical Formula 7]

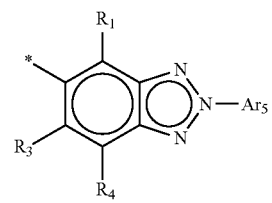

(B-2)

wherein, in the formula (B-2),

* represents a nitrogen atom or a binding site with any one selected from $Ar_1$, $Ar_2$, $Ar_3$ and $Ar_4$ in the formula (1);

$R_1$, $R_3$, and $R_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group;

$Ar_5$ represents a substituted or unsubstituted aromatic hydrocarbon group, a substituted or unsubstituted aromatic heterocyclic group, or a substituted or unsubstituted fused polycyclic aromatic group; and with the same substituted benzene ring, $R_3$ and $R_4$ may be bonded to each other, via a single bond, a substituted or unsubstituted methylene group, a substituted or unsubstituted amino group, an oxygen atom, or a sulfur atom to form a ring.

4. The organic electroluminescent element according to claim 1, wherein the structural formula (B) is a monovalent group represented by the structural formula (B-3) as following,

[Chemical Formula 8]

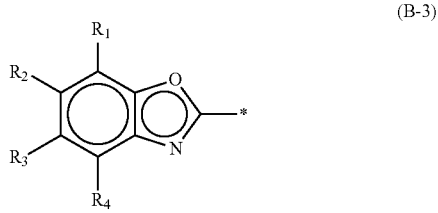

(B-3)

wherein, in the formula (B-3),
* represents a nitrogen atom or a binding site with any one selected from Ar$_1$, Ar$_2$, Ar$_3$ and Ar$_4$ in the formula (1);
R$_1$, R$_2$, R$_3$, and R$_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted heterocyclic aromatic group, a substituted or unsubstituted fused polycyclic aromatic group, or a substituted or unsubstituted aryloxy group, wherein, with the same substituted benzene ring, R$_1$, R$_2$, R$_3$, and R$_4$ may be bonded to each other, via a single bond, a substituted or unsubstituted methylene group, a substituted or unsubstituted amino group, an oxygen atom, or a sulfur atom to form a ring.

5. The organic electroluminescent element according to claim 1, wherein the structural formula (B) is a monovalent group represented by the structural formula (B-4) as following,

[Chemical Formula 9]

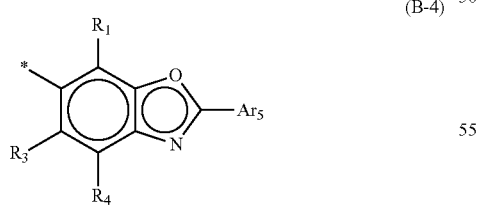

(B-4)

wherein, in the formula (B-4),
* represents a nitrogen atom or a binding site with any one selected from Ar$_1$, Ar$_2$, Ar$_3$ and Ar$_4$ in the formula (1);
R$_1$, R$_3$, and R$_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted aromatic heterocyclic group, or a substituted or unsubstituted aryloxy group;
Ar$_5$ represents a substituted or unsubstituted aromatic hydrocarbon group, a substituted or unsubstituted aromatic heterocyclic group, or a substituted or unsubstituted fused polycyclic aromatic group,
wherein, with the same substituted benzene ring, R$_3$ and R$_4$ may be bonded to each other, via a single bond, a substituted or unsubstituted methylene group, a substituted or unsubstituted amino group, an oxygen atom, or a sulfur atom to form a ring.

6. The organic electroluminescent element according to claim 1, wherein the structural formula (B) is a monovalent group represented by the structural formula (B-5) as following,

[Chemical Formula 10]

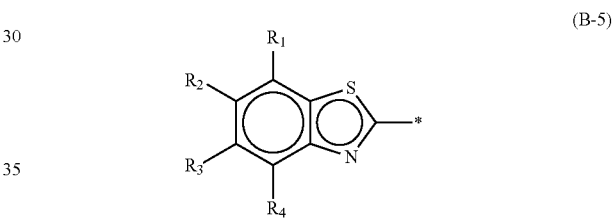

(B-5)

wherein, in the formula (B-5),
* represents a nitrogen atom or a binding site with any one selected from Ar$_1$, Ar$_2$, Ar$_3$, and Ar$_4$ in the formula (1);
R$_1$, R$_2$, R$_3$, and R$_4$ may be the same or different from each other and represent a hydrogen atom, a deuterium atom, a fluorine atom, a chlorine atom, a cyano group, a nitro group, a trimethylsilyl group, a triphenylsilyl group, a linear or branched alkyl group having 1 to 6 carbon atoms which may have a substituent group, a cycloalkyl group having 5 to 10 carbon atoms which may have a substituent group, a linear or branched alkenyl group having 2 to 6 carbon atoms which may have a substituent group, a linear or branched alkyloxy group having 1 to 6 carbon atoms which may have a substituent group, a cycloalkyloxy group having 5 to 10 carbon atoms which may have a substituent group, a substituted or unsubstituted aromatic hydrocarbon group, a substituted or unsubstituted heterocyclic aromatic group, a substituted or unsubstituted fused polycyclic aromatic group, or a substituted or unsubstituted aryloxy group,
wherein, with the same substituted benzene ring, R$_1$, R$_2$, R$_3$, and R$_4$ may be bonded to each other, via a single bond, a substituted or unsubstituted methylene group, a substituted or unsubstituted amino group, an oxygen atom, or a sulfur atom to form a ring.

7. The organic electroluminescent element according to claim 1, wherein in the general formula (1), at least one of Ar$_1$, Ar$_2$, Ar$_3$ and Ar$_4$ is a monovalent group represented by the structural formula (B) or has the monovalent group represented by the structural formula (B) as a substituent.

8. The organic electroluminescent element according to claim 7, wherein n is 0 in the general formula (1).

9. The organic electroluminescent element according to claim 7, wherein n is 1 in the general formula (1).

10. The organic electroluminescent element according to claim 7, wherein n is 2 in the general formula (1).

11. The organic electroluminescent element according to claim 1, wherein in the general formula (1), any two of $Ar_1$, $Ar_2$, $Ar_3$ and $Ar_4$ is a monovalent group represented by the structural formula (B) or has the monovalent group as a substituent.

12. An organic electroluminescent element according to claim 1, wherein in the general formula (1), $Ar_1$ and $Ar_4$ are monovalent group represented by the structural formula (B) or have the monovalent group as a substituent.

13. The organic electroluminescent element according to claim 1, wherein the capping layer has a thickness in the range of 30 nm to 120 nm.

14. The organic electroluminescent element according to claim 1, wherein a refractive index of the capping layer is 1.85 or greater within a wavelength range of 450 nm to 750 nm of light transmitted through the capping layer.

15. The organic electroluminescent element according to claim 1, wherein the luminous layer further comprises a red luminescent material.

16. The organic electroluminescent element according to claim 14, wherein the luminous layer further comprises a phosphorescent luminescent material.

17. The organic electroluminescent element according to claim 16, wherein the phosphorescent luminescent material is a metal complex comprising iridium or platinum.

18. The organic electroluminescent element according to claim 1, wherein the luminous layer comprises at least one compound selected from the group consisted of compounds represented by the following structural formulae (2-1), (2-2), (2-3), (2-4) and (3-14):

(2-1)

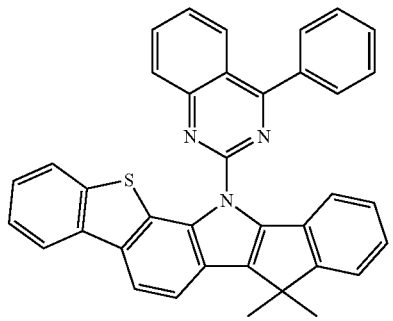

(2-2)

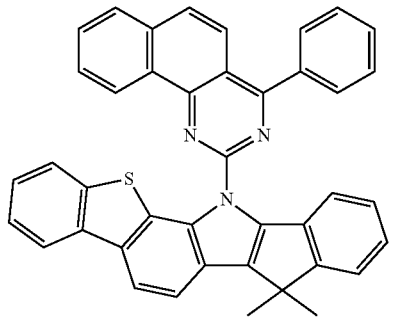

-continued (2-3)

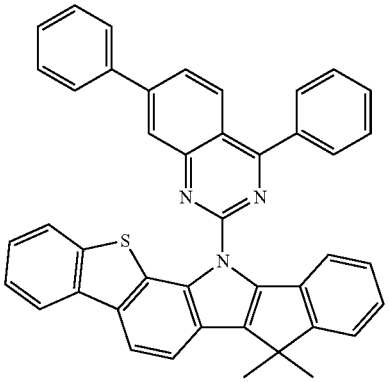

(2-4)

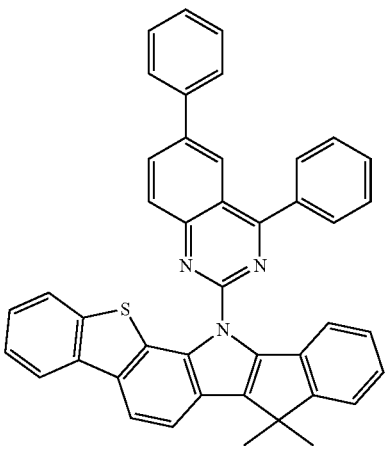

(3-14)

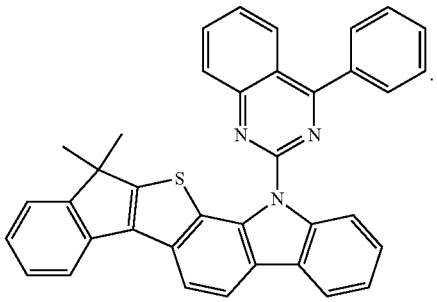

19. The organic electroluminescent element according to claim 1, wherein the luminous layer comprises at least one compound selected from the group consisted of compounds represented by the following structural formulae (2-2) and (3-14):

(2-2)
(3-14)
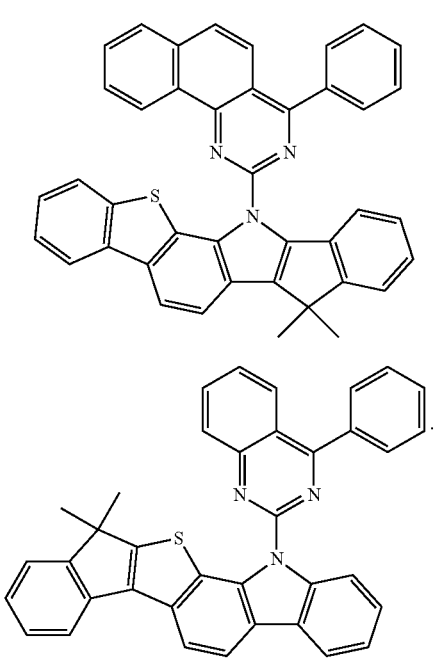
* * * * *